United States Patent
Fujiyoshi et al.

[11] Patent Number: 6,026,891
[45] Date of Patent: Feb. 22, 2000

[54] COOLING DEVICE BOILING AND CONDENSING REFRIGERANT

[75] Inventors: Koji Fujiyoshi, Gamagori; Shigeru Kadota, Hekinan; Kiyoshi Kawaguchi, Toyota; Yukinori Suzuki, Takahama; Shigeru Maehara, Toyota; Koji Kishita, Motosu-gun, all of Japan

[73] Assignee: Denso Corporation, Kariya, Japan

[21] Appl. No.: 08/872,223

[22] Filed: Jun. 10, 1997

[30] Foreign Application Priority Data

| Jun. 12, 1996 | [JP] | Japan | 8-150871 |
| Jun. 12, 1996 | [JP] | Japan | 8-150872 |
| Jun. 12, 1996 | [JP] | Japan | 8-151300 |
| Sep. 10, 1996 | [JP] | Japan | 8-238960 |
| Dec. 24, 1996 | [JP] | Japan | 8-343157 |

[51] Int. Cl.⁷ .................................................. F28D 15/00
[52] U.S. Cl. .............................. 165/104.33; 165/104.34; 165/299; 361/724
[58] Field of Search ............................. 165/104.34, 299, 165/104.33, 300; 361/124

[56] References Cited

U.S. PATENT DOCUMENTS

| 4,706,739 | 11/1987 | Noren ............................ 165/104.33 X |
| 5,035,281 | 7/1991 | Neuenfeldt et al. ........... 165/104.33 X |
| 5,570,740 | 11/1996 | Flores et al. ...................... 165/104.34 |
| 5,738,166 | 4/1998 | Chou ............................... 165/184.33 X |
| 5,806,583 | 9/1998 | Suzuki et al. ...................... 165/104.33 |

OTHER PUBLICATIONS

U.S. application No. 08/501,718, Osakabe et al., filed Jul. 12, 1995.
U.S. application No. 08/504,025, Osakabe et al., filed Jul. 19, 1995.
U.S. application No. 08/524,437, Osakabe et al., filed Sep. 6, 1995.
U.S. application No. 08/503,862, Osakabe et al., filed Jul. 18, 1996.
U.S. application No. 08/579,301, Osakabe et al., filed Dec. 27, 1995.
U.S. application No. 08/674,821, Osakabe et al., filed Jul. 3, 1996.
U.S. application No. 08/790,015, Kadota et al., filed Jan. 28, 1997.
U.S. application No. 08/811,879, Osakabe et al., filed Mar. 5, 1997.
U.S. application No. 08/818,731, Osakabe et al., filed Mar. 14, 1997.
U.S. application No. 08/631,217, Suzuki et al., filed Apr. 12, 1996.
U.S. application No. 08/724,594, Kadota et al., filed Sep. 30, 1996.
U.S. application No. 08/497,950, Osakabe et al., filed Jul. 3, 1995.

*Primary Examiner*—Christopher Atkinson
*Attorney, Agent, or Firm*—Harness, Dickey & Pierce, PLC

[57] ABSTRACT

The cooling device of the present invention includes a casing divided into a first fluid passage and a second fluid passage by a fluid separation plate; a heat exchanger disposed to pass through the fluid separation plate, for receiving heat from high-temperature air flowing in the first fluid passage and for radiating the heat to the outside air flowing in the second fluid passage; an inside fan for blowing the high temperature air in the first fluid passage; an outside fan for blowing the outside air to the second fluid passage; and a thermistor for sensing a temperature of the high temperature air flowing in the first fluid passage. A rotational speed of each of the fans of the inside fan and the outside fan is variably controlled in response to a temperature detected by the thermistor with the controller. In this way, it is possible to cooling an interior of a closed box and to reduce the consumed electric power.

15 Claims, 54 Drawing Sheets

FIG. 3
FIG. 4
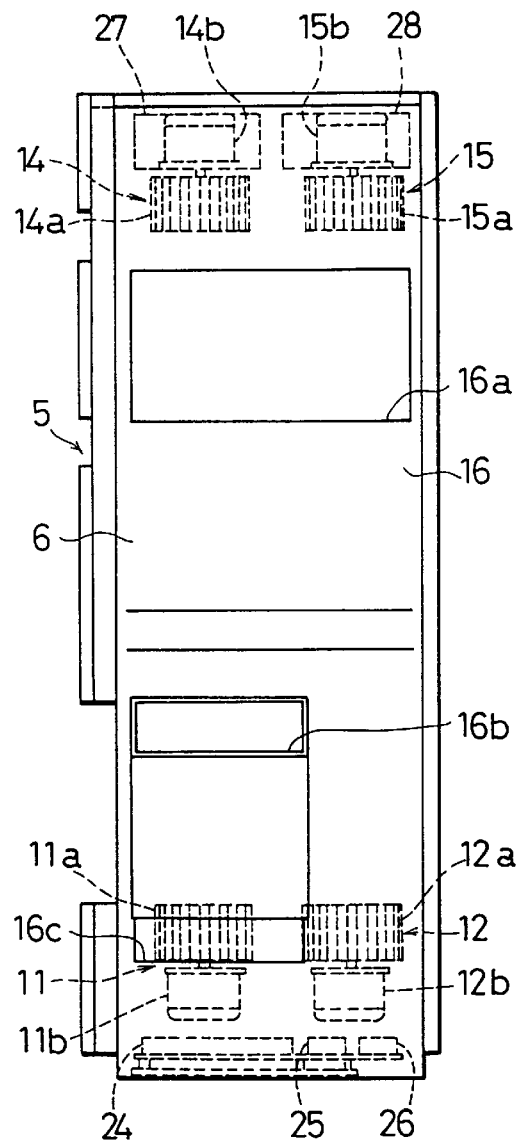
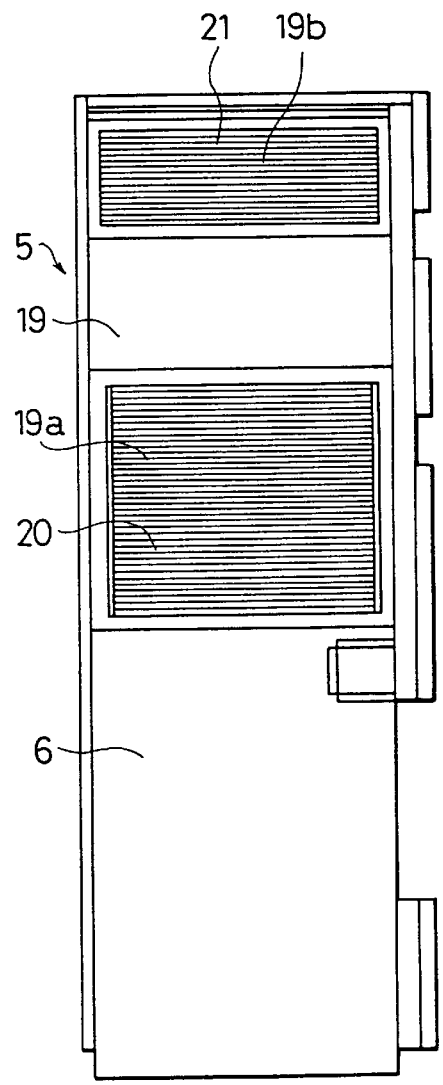

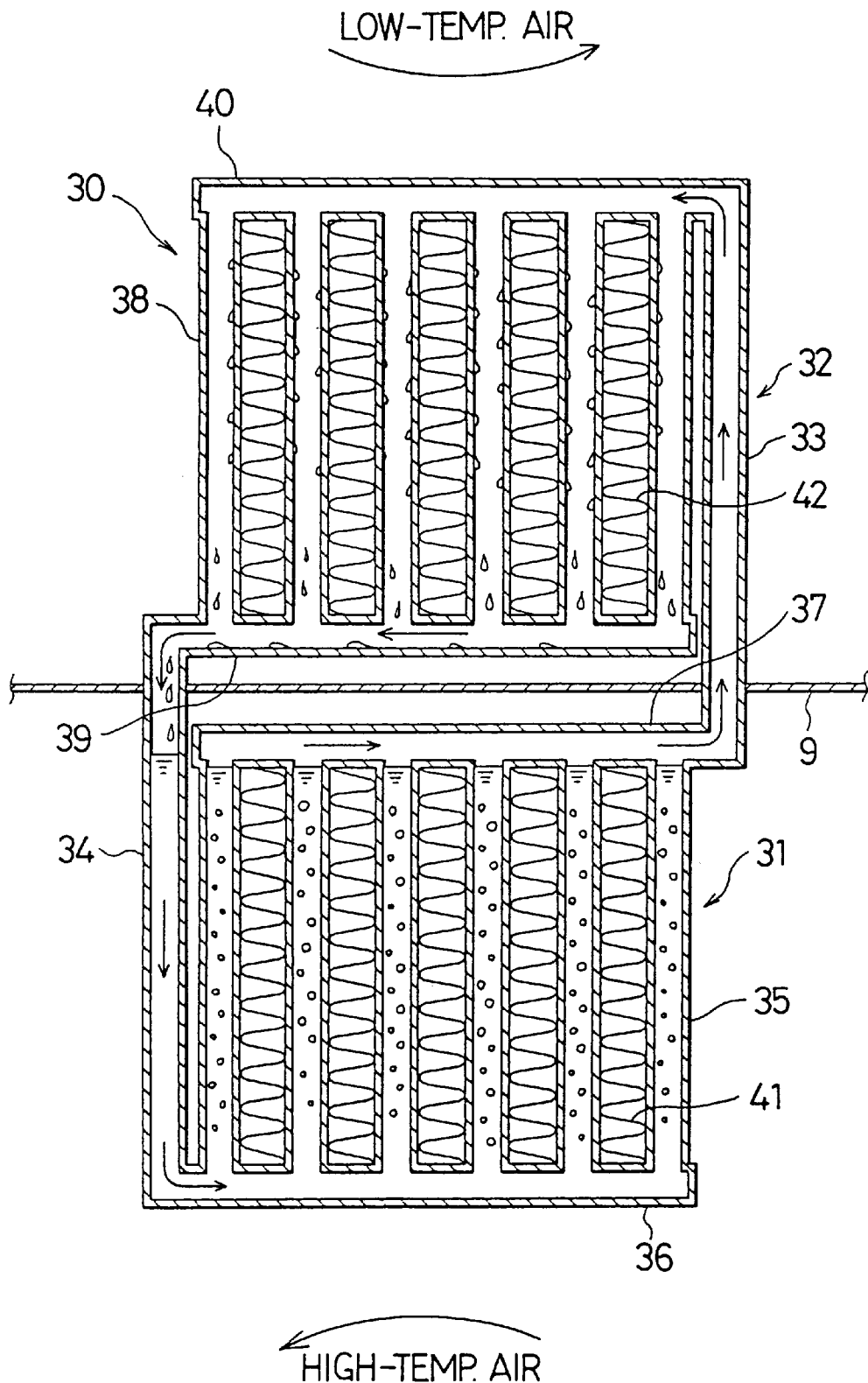

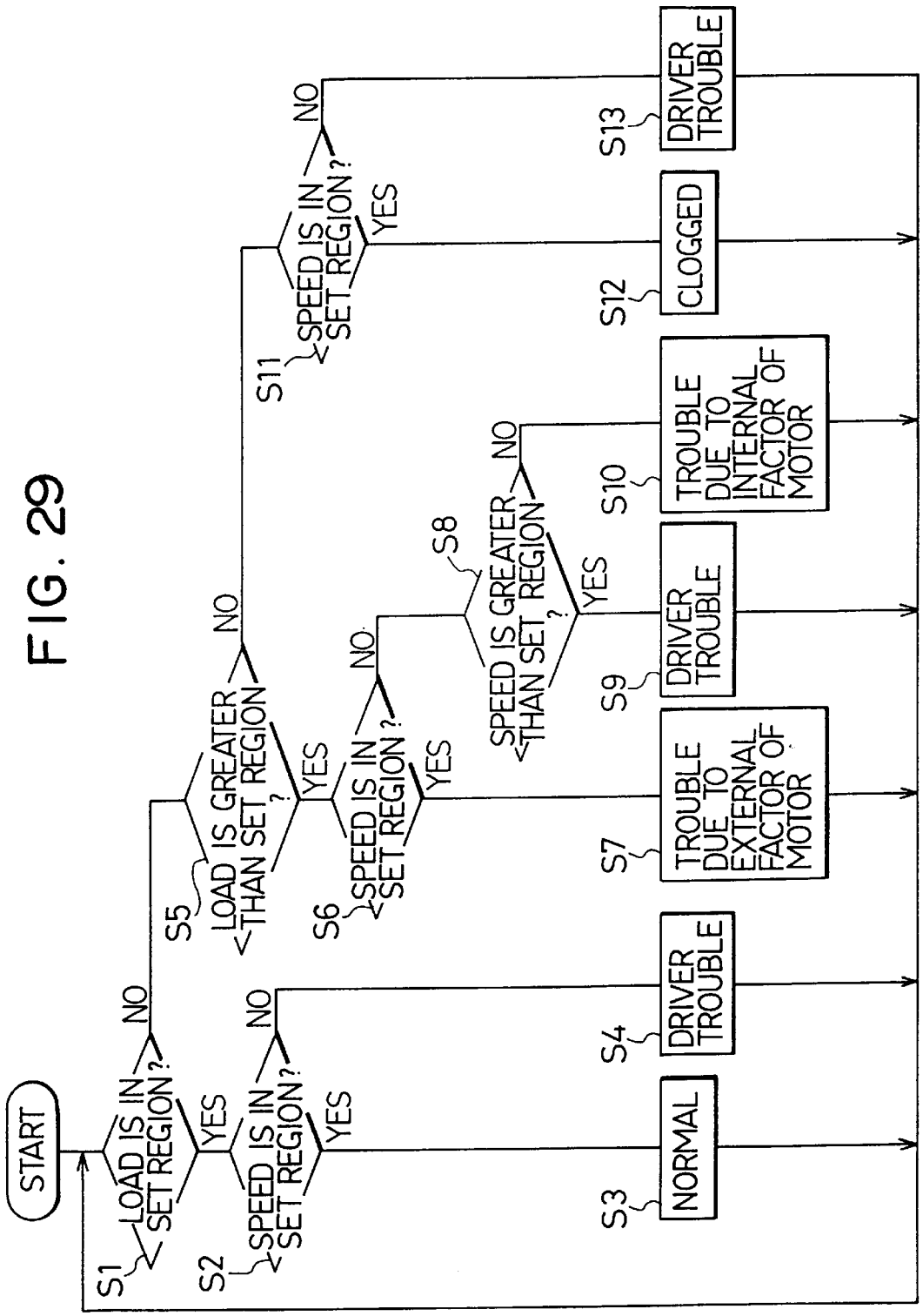

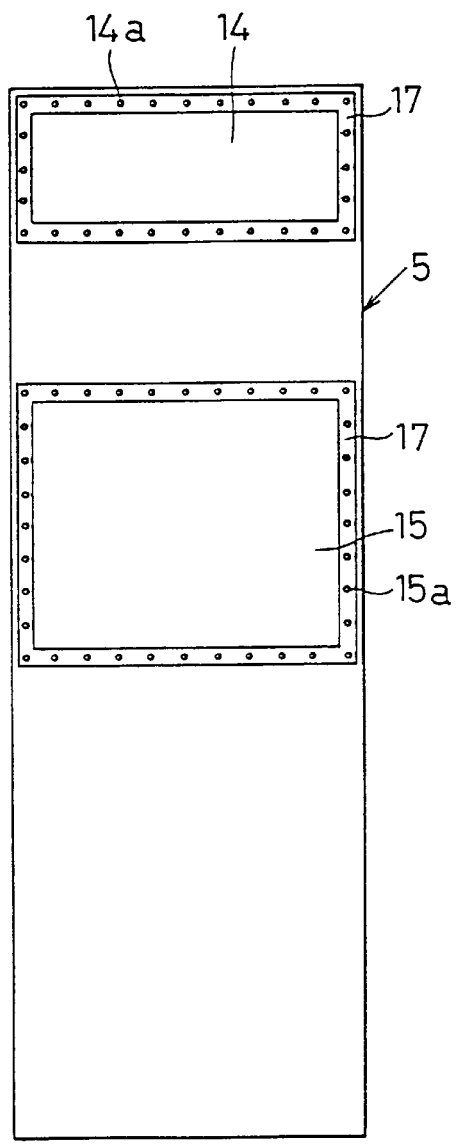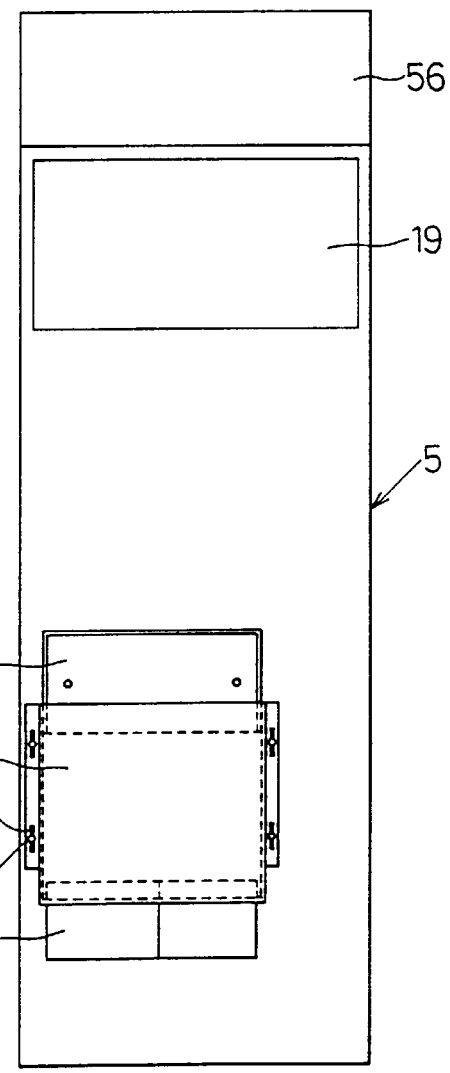

FIG. 59
FIG. 60
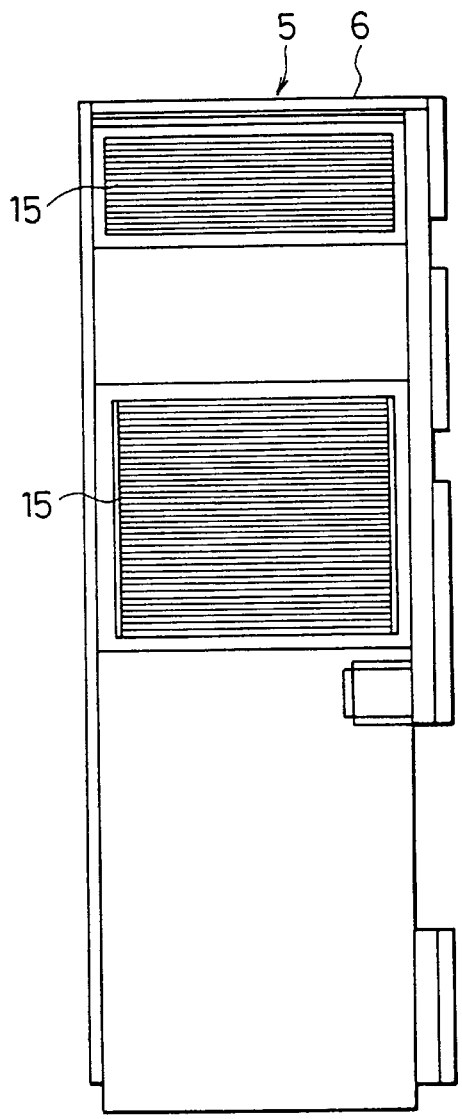
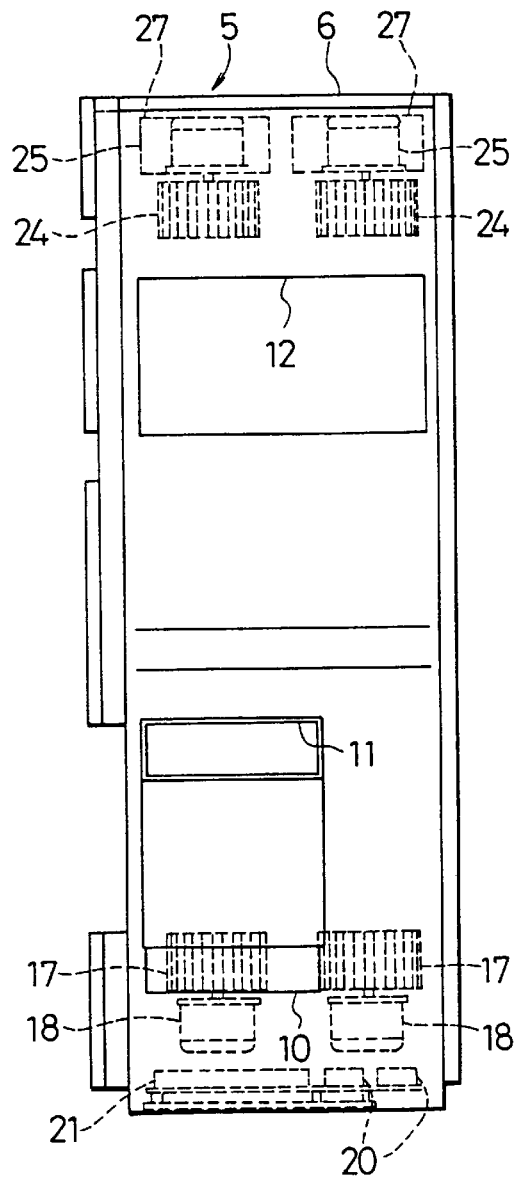

COOLING DEVICE BOILING AND CONDENSING REFRIGERANT

CROSS REFERENCE TO THE RELATED APPLICATIONS

This application is based on and claims priority of Japanese Patent Application Nos. Hei. 8-150872 filed on Jun. 12, 1996, Hei. 8-150871 filed on Jun. 12, 1996, Hei. 8-151300 filed on Jun. 12, 1996, Hei. 8-238960 filed on Sep. 10, 1996, and Hei. 8-343157 filed on Dec. 24, 1996, the content of which are incorporated herein by reference.

BACKGROUND OF THE INVENTION

1. Field of the Invention

The present invention relates to a cooling device for cooling an interior of a closed box member for accommodating a heat generating member such as an electronic component part.

2. Description of Related Art

An electronic component parts having a semiconductor therein or the like may be accommodated in a closed box, e.g., a closed housing, in order to prevent a malfunction caused by deposition of dusts, trash and moisture or the like. In this case, since the electronic component parts is a heat generating member, it is necessary to cool an interior of the housing; however, it is not possible to blow directly outside air into the housing to cool the heat generating member. Therefore, it has been proposed to provide a cooling device employing a heat exchanger composed of a heat pipe or the like, which performs a heat exchange between air of high-temperature within the housing and air (outside air) of low temperature to cool an interior of the housing.

The above-described cooling device is provided with an inside blower for blowing air of high temperature within the housing against a heat-receiving portion of the heat exchanger. The cooling device is also provided with an outside air blower for blowing outside air against a radiating portion of the heat exchanger as well as with a temperature sensor for sensing a temperature of air of high temperature. Each of the inside air blower and outside air blower is composed of a fan and a motor.

In the above-described cooling device, normally, each motor of the inside blower and the outside blower is continuously electrified and operated to cool an interior of the housing. Further, when a temperature of the outside air is decreased and the temperature detected by the temperature sensor is equal to or less than 0° C., the motor of the outside air blower is turned off and stopped. In this way, the interior of the housing is cooled so that the temperature in the housing is maintained at approximately 0 to 65° C., for example.

However, according to the above-described cooling device, since each motor of the inside air blower and the outside air blower is continuously electrified and operated, there occurs a problem in that the consumed electric power and noise increases greatly; and therefore, it is necessary to improve the cooling device in view of the energy saving.

SUMMARY OF THE INVENTION

In view of the foregoing, it is an object of the present invention to provide a cooling device capable of sufficiently cooling the interior of the closed box and further capable of reducing the consumed electric power.

It is another object of the present invention to reduce the size of the cooling device as well as the noise of the air, while preventing the deterioration of radiating characteristics.

It is further another object of the present invention to determine a cause of the trouble in the cooling device certainly.

According to a first aspect of the present invention, high-temperature fluid in a box (e.g., high-temperature air) flows in a first fluid passage in such a manner that the first fluid passage is communicated with a closed space and further low-temperature fluid (e.g., the outside air) flows in the second fluid passage. Under such a construction, both the fluid flow generating output of the first fluid generating means and the fluid generating output of the second fluid generating means are variably controlled on the basis of temperature detected by the high-temperature fluid. In this way, when the detected temperature of high-temperature air in the closed space is low, for example, it is possible to maintain a temperature of the high-temperature fluid in a range of a set temperature even if both the fluid generating output of the first fluid generating means and the fluid generated output of the second fluid generating means are decreased to be lower than the normal values. Thus, it is possible to cool the closed space efficiently and further reduce the consumed electric power by reducing the fluid flow generating output of each of the fluid generating means.

According to another aspect of the present invention, a high-temperature-side blower for blowing the high-temperature fluid with a predetermined air amount is disposed in a high-temperature portion, a low-temperature-side blower for blowing the low-temperature fluid with a predetermined air amount is disposed in the low temperature portion, and an air amount blown by the high-temperature-side blower is higher than that by the low-temperature-side blower.

By increasing an amount of air blown by the high-temperature-side blower, an amount of heat transfer from the high-temperature fluid to the high-temperature-side heat exchanger is increased, and a temperature of the high-temperature-side heat exchanger itself is increased. Since a heat resistance from the low-temperature-side heat exchanger from the high-temperature-side heat exchanger through refrigerant depends on a heat transfer surface area, a heat resistance from the high-temperature-side heat exchanger to the low temperature side heat exchanger does not depend on the temperature of the high-temperature-side heat exchanger, but is maintained substantially constant. Accordingly, to increase a temperature of the high-temperature-side heat exchanger itself becomes to increase a temperature of the low-temperature-side heat exchanger as it is. In the case that the temperature of the low temperature fluid is the same, as the temperature difference between the low-temperature fluid and the low-temperature-side heat exchanger is large, a heat transfer amount from the low-temperature-side heat exchanger to the low-temperature fluid is increased. In this way, even if the amount of air blown by the low-temperature-side blower is made small as compared with that by the low-temperature side, heat can be efficiently radiated from the low-temperature-side heat exchanger to the low-temperature fluid. Accordingly, it is also possible to prevent noise generated by air blown by the low-temperature-side blower while preventing the deterioration of radiating characteristics.

According to further another aspect of the present invention, a cooling device includes a fan for blowing a low-temperature fluid to a low-temperature space, a fan motor for rotating said fan, speed trouble detecting means for detecting that a rotational speed of said fan has deviated from a set range, load trouble detecting mean for detecting that a load on said fan motor has deviated from a set range, and trouble determining means for determining a content of trouble on the basis of detection results performed by said speed trouble detecting means and the load trouble detecting means. When a heat exchanger absorbs heat from the high-temperature space and radiates the heat to the low-temperature space, a fan is rotated by a fan motor such that a low-temperature fluid passes through the low-temperature space. In this way, it is possible to enhance the cooling efficiency of the heat exchanger.

If the cooling device is used over a long period of time, there may occur a clogging of the heat exchanger or some trouble of the fan motor. In such a case, the rotational speed of the fan may deviate from a set range or the load on the fan may deviate from a set range, depending on contents of the trouble. Therefore, the trouble determining means can determine the contents of the trouble on the basis of results detected by the speed trouble detecting means or by the load trouble detecting means.

BRIEF DESCRIPTION OF THE DRAWINGS

Additional objects and advantages of the present invention will be more readily apparent from the following detailed description of first embodiments thereof when taken together with the accompanying drawings in which:

FIG. 3 is a rear view for showing the cooling device in the first embodiment;

FIG. 4 is a front view for showing the cooling device in the first embodiment;

FIG. 6 is a front elevational view in longitudinal cross section for showing a schematic configuration of the boiling type heat exchanger in the first embodiment;

FIG. 29 is a flow chart showing operations of a control unit;

FIG. 32 is a front view of a casing in the sixth embodiment;

FIG. 33 is a rear view of the casing in the sixth embodiment;

FIG. 59 is a front view of the cooling device in the eighth embodiment;

FIG. 60 is a rear view of the cooling device in the eighth embodiment;

DETAILED DESCRIPTION OF PREFERRED EMBODIMENTS

Figure 1:
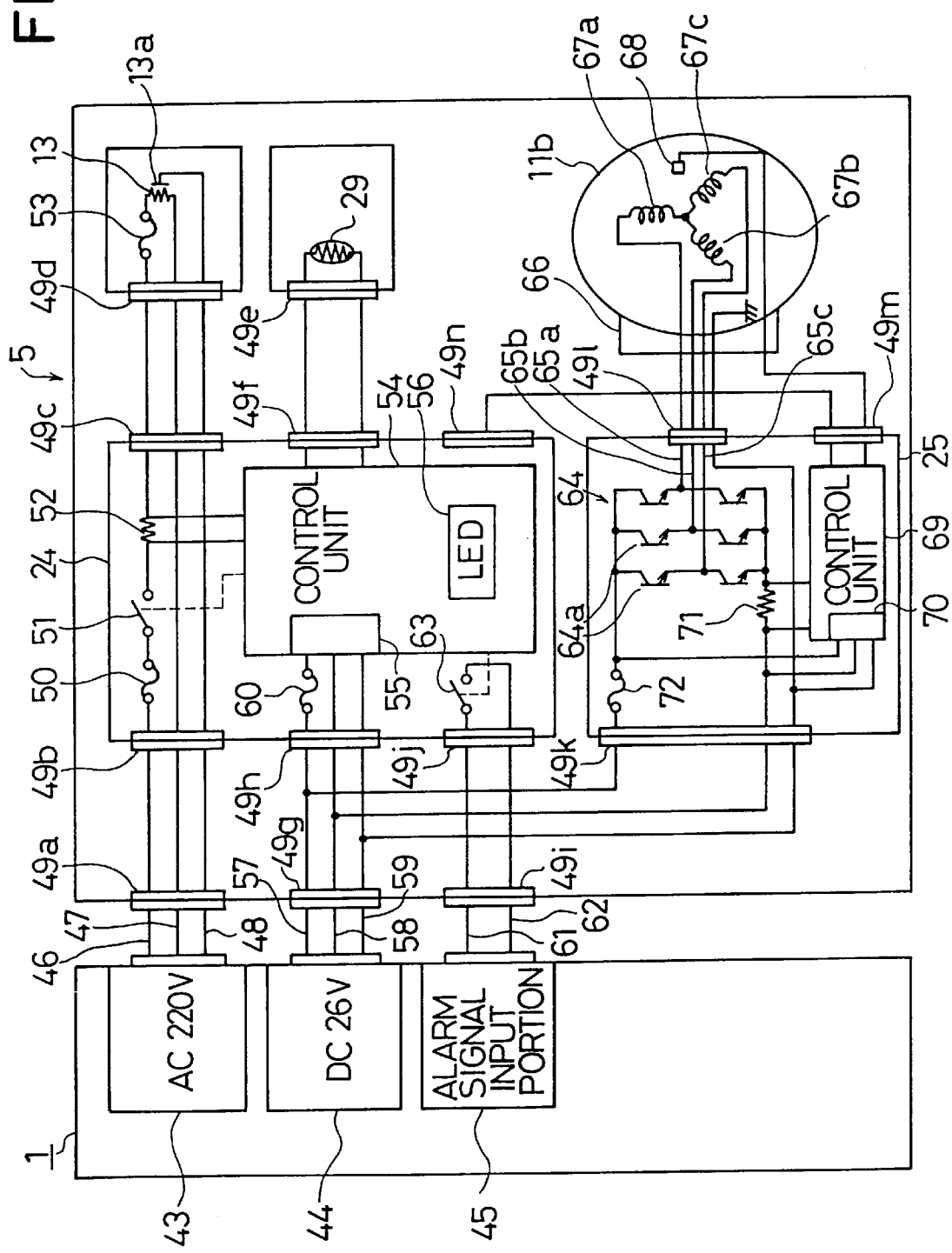
FIG. 1 is an electrical configuration for showing one first embodiment of the present invention.

Referring now to the drawings, a first embodiment in which the present invention is applied to a cooling device boiling and condensing refrigerant will be described.

Figure 2:
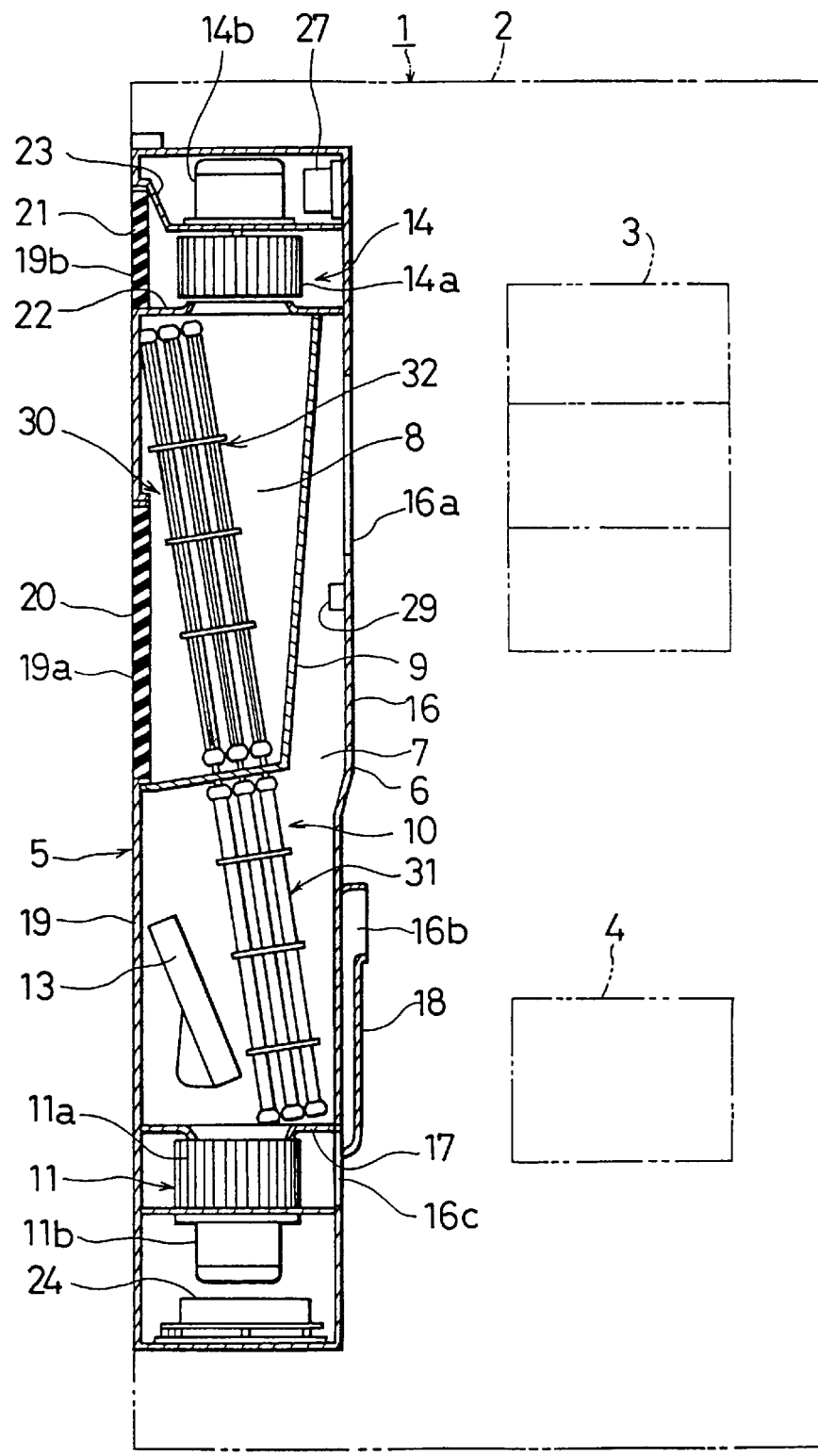
FIG. 2 is a side elevational view in longitudinal section for showing a configuration in which a cooling device is assembled in the electronic equipment in the first embodiment.

FIG. 2 shows a schematic entire construction of an electronic equipment into which the cooling device of the first embodiment is assembled. In FIG. 2, an electronic equipment 1 is a radio base station device for a mobile radio telephone such as a portable telephone set or an automobile telephone or the like, for example. The electronic equipment 1 includes a closed box, e.g., a housing 2, electronic component parts 3 and 4 accommodated in the housing 2, and a cooling device 5 assembled at a left end in the housing 2 as viewed in FIG. 2.

The housing 2 is a casing for maintaining an interior thereof airtightly. The electronic parts 3 and 4 are circuit boards or the like constructed to include semiconductor devices (such as transistors, thyristors, IGBT), and these parts are heat generating parts to generate heat when these parts are electrified and operated.

The cooling device 5 includes a metallic box-like casing 6, for example, constructing a main body of the device; a fluid separation plate 9 for dividing an interior of the casing 6 into a first fluid passage 7 and a second fluid passage 8; a heat exchanger 10 disposed to pass through the fluid separation plate 9; two inside fan devices 11 and 12 disposed below the heat exchanger 10 (see also FIG. 3); a heater 13 disposed above these inside fan devices 11 and 12; two outside fan devices 14 and 15 disposed above the heat exchanger 10, and the like.

Also as shown in FIG. 3, a suction port 16a for sucking air in the housing 2 is formed at an upper side of a rear wall 16 of a casing 6, and the suction port 16a is a rectangular opening. Further, two air outlet ports 16b and 16c for returning (blowing out) air in the first fluid passage 7 are formed at a lower portion of the rear wall 16 of the casing 6, and each of these air outlet ports 16b and 16c is a rectangular opening. The inside fan devices 11 and 12 each include inside fans 11a and 12a of sirocco fan (a centrifugal multi-vane type fan); and motors 11b, 12b composed of DC-brushless motors, for example, for rotating these inside fans 11a and 12a.

In this construction, when the motors 11b and 12b are electrified and operated, the inside fans 11a and 12a are rotated, and air in the housing 2 (i.e., high-temperature air) is sucked through the suction port 16a and passes through the first fluid passage 7 by air blowing operation thereof. After the air in the first fluid passage 7 is guided by the fan casing 17 and the duct 18, the air is blown out of the air outlet ports 16b and 16c into the housing 2. With such an arrangement, air in the housing 2 circulates in the first fluid passage 7.

The interior and the exterior of the air circulating passage (the housing 2 and the first fluid passage 7) are air-tightly partitioned. In this construction, the inside fan devices 11 and 12 constitute the first fluid generating means for generating a flow of the high-temperature fluid to the first fluid passage 7. When the high-temperature air in the housing 2 passes in the first fluid passage 7, the air is cooled by a heat exchanger 10 as described later in detail.

On the other hand, also shown in FIG. 4, the intermediate portion of the front wall 19 of the casing 6 is formed with a suction port 19a for sucking the outside air, and the suction port 19a is constructed to have a louver 20 installed at the rectangular opening. Further, the upper end of the front wall 19 of the casing 6 is formed with an air outlet port 19b for blowing out the air in the second fluid passage 8, and the air outlet port 19b has a louver 21 installed at the rectangular opening. The louvers 20 and 21 are for preventing rain droplets from entering the device. The outside fan devices 14 and 15 each include outside fans 14a and 15a composed of a sirocco fan (a centrifugal type multi-vane fan), for example, and motors 14b and 15b composed of a DC brushless motor, for example, for rotating these outside fans 14a and 15a.

In this construction, when the motors 14b and 15b are electrified, the outside fans 14a and 15a are rotated, the outside air (i.e. the low-temperature air) is sucked through the suction port 19a by air blowing operation thereof to pass through the second fluid passage 8. After the air in the second fluid passage 8 is guided by a fan casing 22 and a duct 23, the air is blown out of the device through the air outlet port 19b. With such an arrangement, the outside air passes through the second fluid passage 8.

With such an arrangement, the outside fan devices 14 and 15 constitute the second fluid generating means for generating a flow of the low-temperature fluid in the second fluid passage 8. When the outside air passes in the second fluid passage 8, the outside air may receive heat from the heat exchanger 10 (i.e., heat is radiated from the heat exchanger 10) (which will be described in detail later). Further, in the case that the casing 6 of the cooling device 5 is fixed to a door constituting a part of the housing 2 of the electronic equipment 1, a gasket of neoprene rubber (not shown), for example, is interposed between each of peripheral edges of the openings formed in correspondence with the suction port 19a and the air outlet port 19b in the door and peripheral edges of the suction port 19a and the air outlet port 19b to prevent air from leaking outside.

As shown in FIGS. 2 and 3, a controller 24 for controlling an entire operation of the cooling device 5 as well as drivers 25 and 26 for electrically electrifying and controlling the motors 11b and 12b are disposed at a lower portion (lower portion of the motor 11b). Further, drivers 27 and 28 for electrically electrifying and controlling the motors 14b and 15b are disposed at the upper portion in the casing 6 (side portions of the motors 14b and 15b). These controllers 24 and drivers 25–28 will be described in detail later.

In addition, as temperature sensing means, a thermistor 29, for example, is disposed at a lower portion of an opening edge of the suction port 16a at the rear wall 16 of the casing 6. The thermistor 29 is for detecting a temperature of air (high-temperature air) flowing in the first fluid passage 7, i.e., a temperature in the housing 2, to transmit a signal of the detected temperature to the controller 24.

On the other hand, the heat exchanger 10 is structured of a boiling-type heat exchanger 30 of multi-stage type (for example, three-stage) fixed to the fluid separation plate 9 so as to pass through the fluid separation plate 9. The fluid separation plate 9 is formed by a metallic plate having a superior thermal conductivity such as aluminum or the like, and has a plurality of through-holes passing through and supporting the boiling-type heat exchanger 30. Then, the fluid separation plate 9 is connected to and fixed to the casing 6 by brazing, for example.

Further, the boiling type heat exchanger 30 is of a thermal siphon type and includes a heat-receiving portion 31 disposed to project toward the first fluid passage 7; a radiating portion 32 disposed to project toward the second fluid passage 8; and the first connecting pipe 33 and the second connecting pipe 34 for connecting these heat-receiving portion 31 and the radiating portion 32 to form a closed loop in which refrigerant circulates. The refrigerant sealed in the boiling type heat exchanger 30 is HFC-134a (alternative fluorocarbon not containing chlorine group), for example.

Figure 5:
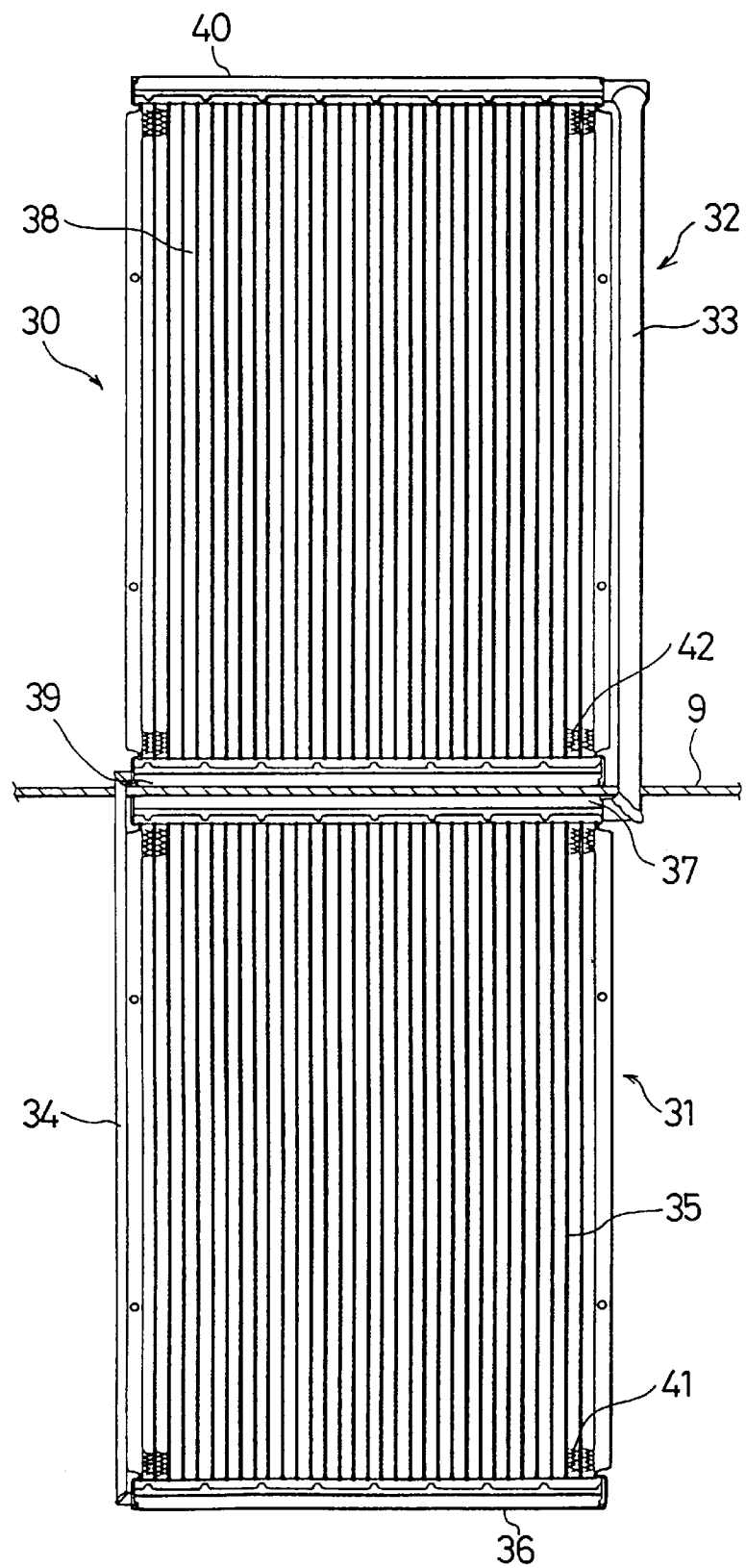
FIG. 5 is is a front view of a heat exchanger in the first embodiment.

As shown in FIGS. 5 and 6, the heat-receiving portion 31 includes a plurality of heat-absorbing pipes 35 disposed substantially in parallel with each other; a lower communicating portion 36 for communicating with and connecting the lower ends of these heat-absorbing pipes 35; and an upper communicating portion 37 for communicating with and connecting the upper ends of the heat-absorbing pipes 35. The heat-absorbing pipes 35 are structured of flat pipes in which metallic material having superior thermal conductivity (aluminum or copper, for example) is formed to have a cross section of elongated rectangular shape or an oval shape. In this case, refrigerant is sealed in the heat-receiving portion 31 to an extent that a liquid surface of the refrigerant is positioned at the upper end of each of the heat-absorbing pipes 35. In the heat-receiving portion 31, the heat-absorbing pipes 35 may receive heat from the high-temperature air so that the liquid refrigerant therein is boiled and gasified. Here, the heat-receiving portion 31 constitutes a refrigerant boiling portion.

On the other hand, the radiating portion 32 includes a plurality of radiating pipes 38 disposed substantially in parallel with each other; a lower communicating portion 39 for communicating with and connecting to the lower ends of these radiating pipes 38; and an upper communicating portion 40 for communicating with and connecting to the upper end of the radiating pipe 38. The radiating pipes 38 are structured of flat pipes in which metallic material having superior thermal conductivity (aluminum or copper, for example) is formed to have a cross section of elongated rectangular shape or an oval shape. In radiating portion 32, the radiating pipes 38 may radiate heat to the low temperature air so that the gaseous refrigerant contained therein is condensed and liquefied. Herein, and the radiating pipes 38 constitute a refrigerant condensing portion.

Heat-receiving portion fins 41 are disposed between the heat-absorbing pipes 35 of the heat-receiving portion 31, and radiating fins 42 are disposed between the radiating pipes 38 at the radiating portion 32. The heat-receiving portion fins 41 and the radiating fins 42 are corrugated fins in which a thin plate of metallic material having a superior thermal conductivity (aluminum or copper, for example) is alternatively folded to make a corrugated shape. Each of the fins 41 and 42 is connected to flat outer surfaces of the heat-absorbing pipes 35 and the radiating pipes 38, by brazing, for example.

The first connecting pipe 33 has a substantially circular cross section and connects the upper communicating portion 37 of the heat-receiving portion 31 to the upper communicating portion 40 of the radiating portion 32 so that both are communicated with each other. The first connecting pipe 33 is for guiding the refrigerant vapor boiled and gasified at the heat-receiving portion 31 to the radiating portion 32. The second connecting pipe 34 has a substantially circular cross section and connects the lower communicating portion 39 of the radiating portion 32 to the lower communicating portion 36 of the heat-receiving portion 31 so that both are communicated with each other. The second connecting pipe 34 is for guiding the liquid refrigerant condensed and liquefied at the radiating portion 32 into the heat-receiving portion 31.

Accordingly, at the heat exchanger 10, the liquid refrigerant in the heat-absorbing pipe 35 at the heat-receiving portion 31 receives heat from the high-temperature air flowing in the first fluid passage 7 through heat-receiving portion fins 41, boils up and evaporates. The evaporated refrigerant reaches the radiating pipes 38 at the radiating portion 32, where the refrigerant is condensed and liquefied, condensing latent heat thereof is transmitted (radiated) to the low-temperature air flowing in the second fluid passage 8 through the radiating fins 42. Then, the liquefied refrigerant drops into the lower communicating portion 36 at the heat-receiving portion 31. Heat is efficiently transferred from the high-temperature air to the low-temperature air (low-temperature fluid) by repetitive operations of boiling and liquefying of refrigerant without mixing the high-temperature air (high-temperature fluid) in the housing 2 of the electronic equipment 1 with the low-temperature air (low-temperature fluid) of the outside air.

Next, referring to FIG. 1, an electrical construction related to the cooling device 5, which is selected from an electrical construction of the cooling device 5 and an electrical construction of the electronic equipment 1, will be described. In FIG. 1, the electronic equipment 1 has an AC power supply circuit 43 for outputting an AC 220V, a DC power supply circuit 44 for outputting a DC 26V, and an alarm signal input portion 45. AC power supply lines 46 and 47 and an earth line 48 led out from the AC power supply circuit 43 are connected to the controller 24 for the cooling device 5 through terminals 49a and 49b, respectively.

Then, the AC power supply lines 46 and 47 and the earth line 48 provided in the controller 24 are connected to a heater 13 through terminals 49c and 49d, respectively. In this case, the AC power supply line 46 in the controller 24 is provided with a current sensor 52 composed of a fuse of 20A, a relay contact point 51 for the heater, a CT and the like. The heater 13 and the temperature fuse 53 are connected in series between the AC power supply lines 46 and 47, and the earth line 48 is connected to an earth terminal 13a of the heater 13. In this case, the heater 13 is operated with an AC power supply of 186V to 264V and 47 Hz to 63Hz, and an output thereof is 1.5 kW, for example.

A ON-OFF state of the relay contact point 51 for the heater is controlled by a control unit 54 installed in the controller 24. In this case, the control unit 54 turns on or off the relay contact point 51 for the heater by turning on or off the relay coil of the relay for the heater. With such an arrangement, the control unit 54 turns on or off the heater 13. The control unit 54 is constituted by a logic circuit composed of logical elements, comparator and the like, a constant voltage circuit 55 and an LED circuit 56 for displaying an abnormal state of operation, or the like. The control unit 54 is also for controlling an entire operation of the cooling device 5. The control unit 54 receives a current detection signal detected by the current sensor 52. With such an arrangement, it is possible for the control unit 54 to determine whether or not a current flows in the heater 13, that is, whether or not the heater 13 is out of order. Further, the control unit 54 receives a temperature detection signal detected by the thermistor 29 through terminals 49e and 49f. With such an arrangement, the control unit 54 can detect a temperature of air flowing in the first fluid passage 7, i.e., a temperature in the housing 2 of the electronic equipment 1.

Further, a positive power supply line 57, a negative power supply line 58 and an earth line 59 led out from a DC power supply circuit 44 of the electronic equipment 1 are connected to a constant voltage circuit 55 of the control unit 54 of the controller 24 through the terminals 49g and 49h. The constant voltage circuit 55 is for receiving a DC voltage 26V, converting the DC voltage 26V into a DC constant voltage (e.g., 12V) for the control unit 54 and transmitting this voltage to the control unit 54. A fuse 60 of 2A, for example, is disposed at a portion between the terminal 49h in the positive power supply line 57 and the constant voltage circuit 55.

Two communication lines 61 and 62 led out from the alarm signal input portion 45 of the electronic equipment 1 are connected to a relay contact point 63 for alarm, disposed in the controller 24, through the terminals 49i and 49j, respectively. The relay contact point 63 is turned on or turned off with the control unit 54 of the controller 24. In this case, the control unit 54 turns on or off the relay contact point 63 by turning on or off the relay coil for the alarm relay. The alarm signal input portion 45 of the electronic equipment 1 can recognize a ON- or OFF-state of the relay contact point 63 through the communication lines 61, 62, wherein the ON-state of the relay contact point 63 for the alarm, for example, indicates that the device is in an abnormal operation and the OFF-state of the relay contact point 63 indicates that the device is in a normal operation.

Further, the relay contact point 63 is of a normally-closed relay which is turned on when electrified and turned off when deelectrified. Accordingly, the control unit 54 electrifies the relay coil for the alarm relay during normal operation to turn off the relay contact point 63, the relay coil is turned off when it is determined that the abnormal operation is performed to be described later in detail and the relay contact point 63 for the alarm is turned on. With such an arrangement, as the power supply for the alarm relay is turned off due to a certain cause, the relay coil is turned off and the relay contact point 63 is turned on to display an abnormal operation (i.e., a so-called fail-safe construction).

The positive power supply line 57, the negative power supply line 58 and the earth line 59 led out from the DC power supply circuit 44 of the electronic equipment 1 are branched at a portion between the terminal portion 49g and the terminal portion 49h and further connected to the driver 25 (and the remaining three drivers 26, 27 and 28) through the terminal 49k. In this case, only the driver 25 and the motor 11b for the inside fan device 11 electrified and driven by the driver 25 are shown; however, the remaining drivers 26, 27 and 28 and the motors 12b, 14b and 15b are not shown. Each of the constructions of the drivers 26, 27 and 28 and the motors 12b, 14b and 15b is substantially the same as those of the driver 25 and the motor 11b. The construction of each of the driver 25 and the motor 11b will be described more specifically.

An inverter 64 is connected between the positive power supply line 57 and the negative power supply line 58 disposed in the driver 25 through the terminal 49k. As being known well, the inverter 64 includes six switching elements 64a connected in a bridge shape and three output lines 65a, 65b and 65c of three-phases (U-phase, V-phase and W-phase) are connected to three-phase windings 67a, 67b and 67c of the motor 11b through the terminal 49l and the motor terminal 66. In this case, the motor 11b is a three-phase DC brushless motor with a rated DC 26V. The motor 11b is provided with a rotation sensor 68 for sensing a rotational angle (rotating position) of the rotor. The rotation sensor 68 includes three hole elements (hole IC), for example, and outputs a rotation angle signal. To the switching elements 64a of the inverter 64 are connected free-wheel diodes (not shown), respectively.

Further, a ON- or OFF-state of each of the switching elements 64a of the inverter 64 is controlled by the control unit 69 disposed in the driver 25. The control unit 69 includes a logical circuit composed of logical elements or comparator and a constant voltage circuit 70. The control unit 69 is connected to the control unit 54 of the controller 24 through the terminals 49m and 49n so as to receive a rotation speed signal from the control unit 54. The control unit 69 is connected to the rotation sensor 68 through the terminal 49m and the motor terminal 66 so as to receive a rotation detection signal from the rotation sensor 68.

The control unit 69 generates a control signal for controlling a ON- or OFF-state of each of the switching elements 64a at the inverter portion 64 in response to the rotational speed instruction signal and a rotation detection signal, each of the switching elements 64a is turned on or off in response to the control signal, thereby the windings 67a to 67c of the motor 11b are electrified and controlled. With such an arrangement, the control unit 69 can rotate the motor 11b at a rotational speed instructed from the controller 24. Further, the control unit 69 detects a rotational speed of the motor 11b in response to the rotation detection signal. When the control unit 69 detects that the detection speed is slower, by 20% or more, than the instructed rotational speed, for example, it is determined that the motor is in an abnormal state (the fan is troubled) and a motor abnormal signal indicating this state is transmitted to the control unit 54 of the controller 24 through a connecting line for connecting between the terminals 49m and 49n.

Further, the negative power supply line 58 disposed in the driver 25 is provided with a current sensor 71 composed of a resistor, for example, and both terminals of the current sensor 71 are connected to the control unit 69. With such an arrangement, the control unit 69 detects a voltage between both terminals of the current sensor 71 so that a load current flowing in the motor 11b can be detected.

Further, the constant voltage circuit 70 at the control unit 69 is connected to a positive power supply line 57, the negative power supply line 58 and the earth line 59 disposed in the driver 25, receives DC voltage of 26V, converts the DC voltage into a DC constant voltage (12V, for example) for the control unit 69, and transmits this voltage to the control unit 69. In addition, the positive power supply line 57 disposed in the driver 25 is provided with a fuse 72 of 7A, for example.

Figure 7A:
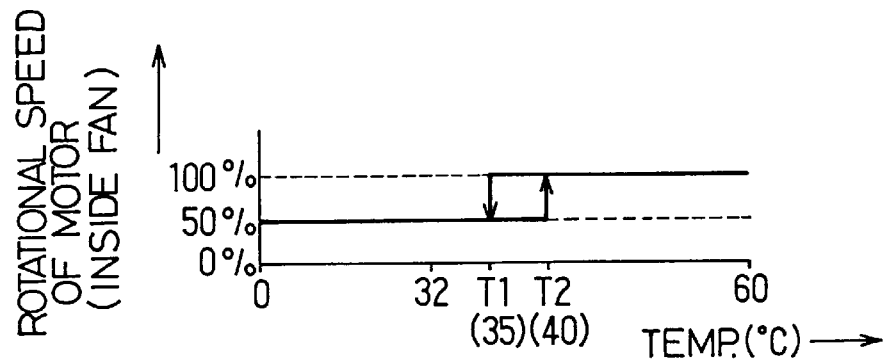
FIG. 7A indicates a relationship between a rotational speed of the inside fan device and a temperature in the housing, FIG. 7B indicates a relationship between a rotational speed of the motor of the outside fan device and a temperature in the housing, and FIG. 7C indicates a relationship between a on- or off-state of the heater and a temperature in the housing.

Then, referring to FIGS. 7A–7C, an operation of the above-described construction, in particular, operations of the inside fan devices 11 and 12, the outside fan devices 14 and 15 and the heater 13 of the cooling device 5 will be described.

Further, the cooling device 5 in the first embodiment is operated under the following environmental condition. That is, the environmental temperature is in a range of approximately −40° C. to +46° C. The environmental humidity has an absolute humidity in a range of approximately 5% to 95%, provided that the absolute humidity at a temperature of 27° C. or more is limited to one corresponding to a saturated humidity of of 0.024 pounds of water per a pound of dry air. An atmospheric pressure corresponds to one measured at an altitude in a range of −200 feet to 10000 feet. The DC power supply is in a range of 19VDC to 30VDC (a rated 26VDC). An AC power supply is in a range of 186 VAC to 264VAC, 47 Hz to 63 Hz (a rated 220VAC). The cooling device 5 can maintain a temperature in the housing 2 within a range of approximately 0° C. to 65° C. under a heat generating amount of MAX 2700W of the electronic component parts 3 and 4 in the electronic equipment 1.

Next, referring to FIG. 7A, an operation of each of the inside fan devices 11 and 12 will be described. The control unit 54 of the controller 24 receives a temperature detection signal from the thermistor 29, detects a temperature of air flowing in the first fluid passage 7, i.e., a temperature within the housing 2 and transmits a rotational speed instruction signal for rotating the motors 11b and 12b of the inside fan devices 11 and 12 at a rated rotational speed (i.e., 100%) if the detection temperature is not less than T2 (for example, 40° C.) to each of the control segments 69 of the drivers 25 and 26. With such an arrangement, the drivers 25 and 26 are electrified and controlled (feed-back control) in such a manner that the motors 11b and 12b are rotated at a rated rotational speed, thereby the motors 11b and 12b of the inside fan devices 11 and 12 are rotated at the rated rotational speed.

After this operation, when the temperature in the housing 2 is decreased down to T1 (for example, 35° C.) under a state in which these motors 11b and 12b are rotated at a rated rotational speed, the control unit 54 of the controller 24 transmits a rotational speed instruction signal for rotating the motors 11b and 12b of the inside fan devices 11 and 12 at 50% of the rated rotational speed to each of the control segments 69 of the drivers 25 and 26. With such an arrangement, the drivers 25 and 26 electrify and control the motors 11b and 12b in such a manner that these motors 11b and 12b may be rotated at 50% of the rated rotational speed. In this way, the motors 11b and 12b of the inside fan devices 11 and 12 are rotated at 50% of the rated rotational speed.

Subsequently, when the temperature in the housing 2 is increased to reach T2 (40° C.) under a state in which the motors 11b and 12b of the inside fan devices 11 and 12 are rotated at 50% of the rated rotational speed, the rotational speed is switched in such a manner that the motors 11b and 12b are rotated at the rated rotational speed. When the temperature in the housing 2 is decreased to reach T1 (35° C.) at that time under a state in which the motors 11b and 12b of the inside fan devices 11 and 12 are rotated at the rated rotational speed, the rotational speed is switched in such a manner that the motors 11b and 12b are rotated at 50% of the rated rotational speed at that time. Subsequently, the switching control for the rotational speeds of the motors 11b and 12b of the inside fan devices 11 and 12 corresponding to the temperature in the housing 2 is performed repeatedly in the same manner as that described above.

Figure 7B:
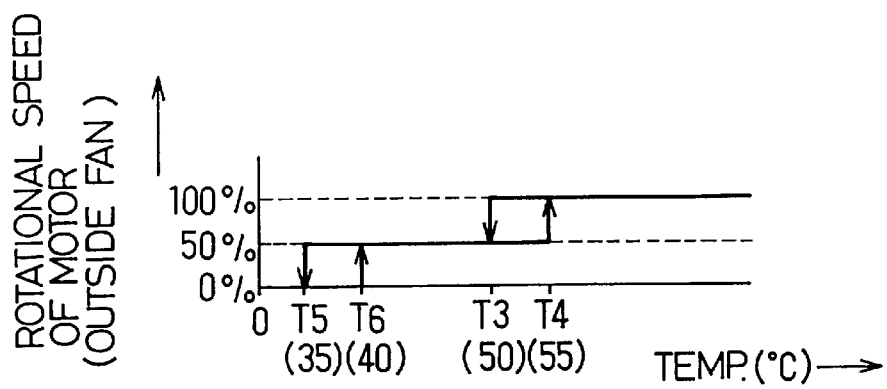

On the other hand, the operation of the outside fan devices 14 and 15 is performed in a manner as shown in FIG. 7B. More specifically, the control unit 54 of the controller 24 receives the temperature detection signal from the thermistor 29, detects a temperature of air flowing in the first fluid passage 7, i.e., a temperature in the housing 2 and further transmits a rotational speed instruction signal rotating the motors 14b and 15b of the outside fan devices 14 and 15 at the rated rotational speed (100%) to each of the control units 69 of the drivers 27 and 28 if the detection temperature is not less than T4 (for example, 55° C.). With such an arrangement, the drivers 27 and 28 are electrified and controlled so that the motors 14b and 15b are rotated at a rated rotational speed. In this way, the motors 14b and 15b of the outside fan devices 14 and 15 are rotated at a rated rotational speed.

After this operation, when the temperature in the housing 2 is decreased down to T3 (50° C., for example), the control unit 54 of the controller 24 transmits a rotational speed instruction signal for rotating the motors 14b and 15b of the outside fan devices 14 and 15 at 50% of a rated rotational speed to each of the control segments 69 of the drivers 27 and 28. With such an arrangement, the drivers 27 and 28 electrify and control the motors 14b and 15b in such a manner that these motors 14b and 15b are rotated at 50% of the rated rotational speed, resulting in that the motors 14b and 15b of the outside fan devices 14 and 15 are rotated at 50% of the rated rotational speed.

Further, when the temperature in the housing 2 is decreased down to T5 (35° C., for example) under a state in which the motors 14b and 15b of the outside fan devices 14 and 15 are being rotated at 50% of the rated rotational speed, the control unit 54 of the controller 24 transmits a rotational speed instruction signal for stopping the motors 14b and 15b of the outside fan devices 14 and 15 (i.e., 0% of the rated rotational speed) to each of the control segments 69 of the drivers 27 and 28. With such an arrangement, the drivers 27 and 28 stop electrifying the motors 14b and 15b. In this way, the operations of the outside fan devices 14 and 15 are stopped.

On the other hand, when the temperature in the housing 2 is increased to reach T6 (40° C., for example) under a state in which the motors 14b and 15b of the outside fan devices 14 and 15 are stopped, the control unit 54 of the controller 24 transmits at that time a rotational speed instruction signal for rotating the motors 14b and 15b of the outside fan devices 14 and 15 at 50% of the rated rotational speed to each of the control segments 69 of the drivers 27 and 28. With such an arrangement, the drivers 27 and 28 performs a rotation switching operation in such a manner that the motors 14b and 15b are rotated at 50% of the rated rotational speed. Then, when the temperature in the housing 2 is increased to reach T4 (55° C., for example) under a state in which the motors 14b and 15b of the outside fan device 14 and 15 are rotated at 50% of the rated rotational speed, the control unit 54 of the controller 24 transmits, at that time, a rotational speed instruction signal for rotating the motors 14b and 15b of the outside fan devices 14 and 15 to each of the control segments 69 of the drivers 27 and 28. With such an arrangement, the drivers 27 and 28 switches rotational speed in such a manner that the motors 14b and 15b are rotated at a rated rotational speed (100%). The rotational speed of the motors 14b and 15b of the outside fan devices 14 and 15 corresponding to the temperature in the housing 2 is switched repeatedly, as described above.

Figure 7C:
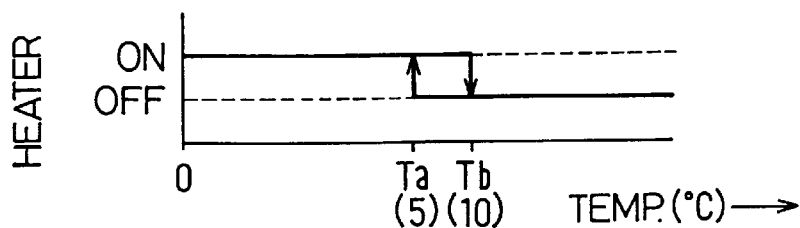

Referring to FIG. 7C, an operation of the heater 13 will be described. In the case that an outside environmental temperature is low, the temperature within the housing 2 is also decreased. Then, the heater 13 is electrified and driven in order to maintain the inside temperature of the housing 2 not to be less than 0° C., the air passing in the first fluid passage 7 is heated by the heater 13 to prevent the temperature in the housing 2 from decreasing to be lower than 0° C.

More specifically, as shown in FIG. 7C, when the temperature in the housing 2 is decreased to reach Ta (5° C., for example), the control unit 54 of the controller 24 turns on a relay contact point 51 for the heater to electrify and drive the heater 13. As far as the temperature in the housing 2 is not more than Ta (5° C.), the heater 13 is turned on. When the temperature in the housing 2 is increased to reach Tb (10° C., for example), the control unit 54 of the controller 24 turns off the relay contact point 51 for the heater to turn off the heater 13. The control for turning on or off the heater 13 corresponding to the temperature in the housing 2 is performed repeatedly, as described above.

Next, there will be described a content of control of the controller 24 in the case that an abnormal operation occurs in the cooling device 5. At first, when the rotational speeds of the motors 11b, 12b, 14b and 15b of the fan devices 11, 12, 14 and 15 are decreased to be lower than an instructed rotational speed due to a certain cause by 20% or more, for example, each of the control segments 69 of the drivers 25–28 detects the abnormal condition to determine that the motor is in an abnormal state (a fan is troubled) and then transmits a motor abnormal signal indicative of this state to the control unit 54 of the controller 24. The control unit 54 of the controller 24 turns off the relay contact point 63 for the alarm and lights an LED for displaying the fan trouble disposed in an LED circuit 56. As the LED for displaying the fan trouble, four LEDs are disposed in correspondence with each of the motors 11b, 12b, 14b and 15b to show which one of the motors 11b, 12b, 14b and 15b of the fan devices 11, 12, 14 and 15 is troubled.

The relay contact point 63 for the alarm is turned off, and an alarm signal input portion 45 of the electronic equipment 1 recognizes that the abnormal operation is generated at the cooling device 5. In this case, the control unit 54 of the controller 24 turns off the relay contact point 63 for the alarm to transmit an abnormal operation signal indicative of the abnormal operation to the electronic equipment 1. When the abnormal operation occurs, the electronic equipment 1 informs a maintaining and repairing person at a remote location that the abnormal state in operation occurs. In this way, the maintaining and repairing person can repair the cooling device 5 which has the abnormal operation.

At this time, the maintaining and repairing person can confirm visually, through an inspection window (not shown) disposed at a front lower surface of the casing 6 of the cooling device 5, which one of the LEDs in the LED circuit 56 of the controller 24 lights. Therefore, which one of the motors 11b and 12b, 14b and 15b of the fan devices 11, 12, 14 and 15 is troubled can be recognized.

A case in which the heater 13 is troubled will be described. The control unit 54 of the controller 24 can determine whether or not the heater current flows on the basis of the current detection signal obtained from the current sensor 52, resulting in that if the heater current does not flow, it determines that the device has a trouble in the heater (the heater line breakage). When it determines that the heater trouble occurs, the control unit 54 turns off the relay contact point 63 for alarm and at the same time the LED for displaying the heater trouble disposed inside the LED circuit 56 lights.

There will be described an operation control for the case in which the temperature in the housing 2 of the electronic equipment 1 is out of the range of the set temperature, i.e., the case in which the inside temperature is in an abnormal state. In this case, when the control unit 54 of the controller 24 detects that the temperature in the housing 2 is not less than 70° C. on the basis of the temperature detection signal obtained from the thermistor 29, the control unit 54 turns off the relay contact point 63 for alarm and lights the LED for displaying the high-temperature abnormal state disposed inside the LED circuit 56. Further, when it is detected that the temperature in the housing 2 is not more than 0° C., for example, the control unit 54 turns of the relay contact point 63 for the alarm and lights the LED for displaying the low temperature abnormal state disposed inside the LED circuit 56.

In the above-described construction, the LED circuit 56 is provided with the LED for displaying the various kinds of abnormal states of operation individually, so that the maintaining and repairing person visually confirms, through the inspection window in the casing 6 of the cooling device 5, which one of the LED in the LED circuit 56 of the controller 24 is illuminated to confirm the type of abnormal operation easily.

Further, in the first embodiment of the present invention, in the case that the temperature in the housing 2 is not less than 70° C. and in the case that the controller 24 is troubled, the motors 11b, 12b, 14b and 15b of the inside fan devices 11 and 12 and the outside fan devices 14 and 15 are rotated at the rated rotational speed. This control is performed by the control unit 54 of the controller 24 and each of the control segments 69 of the drivers 25 to 28, respectively. With such an arrangement, it becomes possible to decrease the temperature within the housing 2 as much as possible, resulting in that reliability and safety in operation in the system can be enhanced. Further, as the case in which the controller 24 is troubled, there may be a case in which the control unit 54 does not output a speed instruction for instructing a rotational speed of each of the motors 11b and 12b, 14b and 15b, a case in which a connecting line connecting the control unit 54 of the controller 24 with the control unit 69 of each of the drivers 25 to 28 or the like is broken, or a case in which a connecting line connecting the thermistor 29 to the control unit 54 of the controller 24 is broken.

According to the first embodiment of the present invention constructed as described above, since the device is constructed so that the rotational speed of each of the motors 11b, 12b, 14b and 15b of the inside fan devices 11 and 12 and the outside fan devices 14 and 15 is variably controlled in a stepwise manner on the basis of the temperature in the housing 2 detected by the thermistor 29, it is possible to keep the rotational speed (i.e., output) of each of the motors 11b, 12b, 14b and 15b as less as possible while the temperature in the housing 2 is maintained in a range of set temperature. Accordingly, as compared with the prior art, it is possible to reduce the consumed electric power.

Further, in the first embodiment, although the rotational speed of each of the motors 11b and 12b of the inside fan devices 11 and 12 is variably controlled in two steps and concurrently the rotational speed of each of the motors 14b and 15b of the outside fan devices 14 and 15 is variably controlled in three steps, the invention is not limited to this arrangement, but the rotational speed of each of the motors 11b and 12b of each of the inside fan devices 11 and 12 may be variably controlled in three steps or more, or the rotational speed of each of the motors 14b and 15b of each of the outside fan devices 14 and 15 amy be variably controlled in two steps or more, or four steps or more, or the rotational speed of each of the motors 11b and 12b, 14b and 15b may be variably controlled in a linear manner.

In the first embodiment, since each of the control segments 69 of each of the drivers 25 to 28 detects a load current flowing in each of the motors 11b, 12b, 14b and 15b by the current sensor 71, the relay contact point for alarm may be turned off and the LED for displaying each of the abnormal operations may light in the case when the sensor detects that the value of the load current is larger to a certain degree than that of a normal operation or in the case when the value is slightly lower than that of a normal operation.

On the other hand, although air flows in the housing 2 and in the first fluid passage 7 in the first embodiment, liquid such as oil or water and the like may flow in place of the air. In this case, it is preferable to install an inside pump in place of the inside fan devices 11 and 12. Further, although the air (outside air) flows in the outside fluid passage and the second fluid passage 8, liquid such as oil or water and the like may flow in place of the air. In this case, it is preferable that an outside pump may be installed in place of the outside fan devices 14 and 15.

In addition, in the first embodiment, although the boiling type heat exchanger 30 is employed as the heat exchanger 10, it is also preferable to install a so-called heat pipe in place of the boiling type heat exchanger 30. Further, in the first embodiment, the relay contact point 63 for alarm is turned on or off to transmit a signal indicative of the occurrence of abnormal operation to the electronic equipment 1 (the alarm signal input 45); however, the abnormal state signal for determining (specifying) the type of abnormal operation to the electronic equipment 1 (the alarm signal input 45) may be transmited. In this way, since the type of abnormal operation can be determined at the electronic equipment 1, it becomes possible to respond according to the type of abnormal operation also at the electronic equipment 1. More specifically, when it is informed that the fan devices 11, 12, 14 and 15 are troubled, it may also be possible at the electronic equipment 1 to reduce a heat generating amount of each of the electronic component parts 3 and 4 or to stop completely the operation of each of the electronic component parts 3 and 4.

Next, a second embodiment of the present invention will be described.

Figure 8:
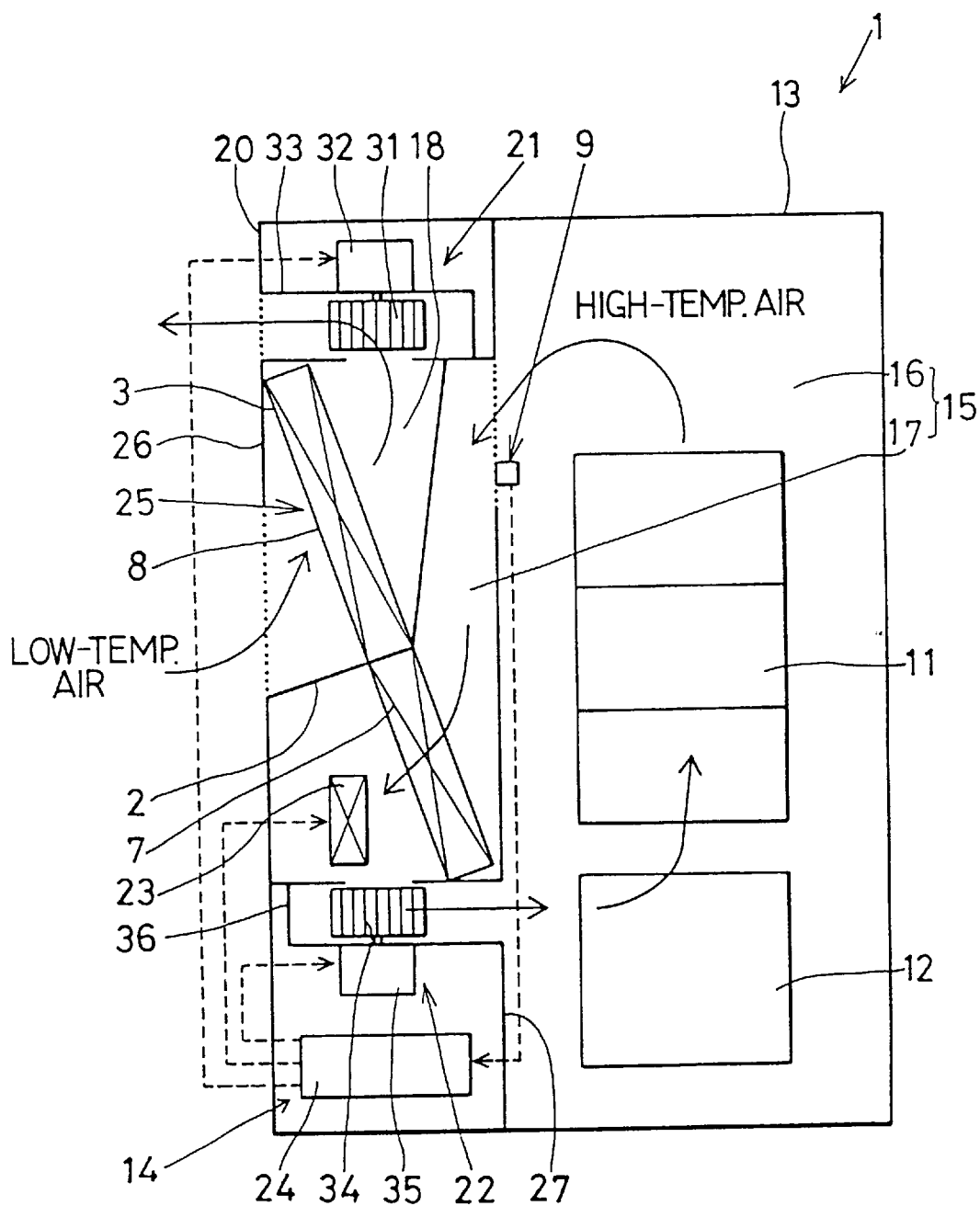
FIG. 8 is a schematic view for showing an entire structure of an electronic equipment in a second embodiment.

FIGS. 8 to 13 illustrate the second embodiment of the present invention, wherein FIG. 8 is a view for showing an entire structure of the electronic equipment.

An electronic equipment 1 is a radio base station device for a mobile radio telephone such as a portable telephone set or an automobile telephone or the like, for example, wherein this electronic equipment 1 includes a housing 13 for air-tightly accommodating electronic component parts 11 and 12, and a cooling device (cooler) 14 for cooling the electronic component parts 11 and 12 or the like.

The electronic component part 11 is a heat generating element which performs a predetermined operation when an electricity is supplied thereto and generates heat (a semiconductor switching element constituting a high frequency switching circuit assembled in a transmitter or a receiver, for example). The electronic component part 12 is a heat generating element which performs a predetermined operation when an electricity is supplied thereto and generates heat (a semiconductor amplifying element or the like such as a power transistor assembled in a power amplifier, for example).

The housing 13 is a casing for air-tightly sealing an inside from an outside, wherein an closed space 15 is formed in the casing. This closed space 15 is air-tightly partitioned from the outside by a fluid separation plate of the cooling device 14 (described later) or the like in order to prevent performances of the electronic component parts 11 and 12 from being deteriorated due to depositions of foreign materials such as dust, trash or moisture or the like on the electronic component parts 11 and 12.

Then, the closed space 15 is divided into an electronic component part accommodating space 16 for accommodating the electronic component parts 11 and 12 and a high-temperature-side heat transfer space 17 functioning as a passage in the casing by the fluid separation plate of the cooling device 14 and by the casing of the cooling device 14. This high-temperature-side heat transfer space 17 has a narrow passage area to reduce a depth size of the cooling device 14 at an upwind side thereof as much as possible and also has a wider flow passage area at a downwind side thereof than that of the upstream side. Further, the housing 13 forms a high-temperature-side heat transfer space 17 and a low-temperature-side heat transfer space 18 functioning as a passage outside the casing air-tightly, which is partitioned by the fluid separation plate.

The cooling device 14 includes a casing 20 provided integrally with the housing 13; two centrifugal upper side blowers 21 for generating air flows of low-temperature air (outside fluid, low-temperature fluid); two centrifugal lower side blowers 22 for generating air flows of high-temperature air (inside fluid, high-temperature fluid); an electrical heater 23 for increasing a temperature of air in the closed space 15 not to be less than a lower limit temperature (0° C., for example); a controller 24 for electrifying and controlling these electrical devices of the cooling device-14; and a heat exchanger 25 for setting a temperature of air in the closed space 15 not to be more than an upper limit temperature (70° C., for example) or the like.

The casing 20 is composed of an outer wall 26 disposed at the outer-most location of the electronic equipment 1, and a rear surface side separation plate 27 enclosing the hightemperature-side heat transfer space 17, wherein the outer wall 26 and the rear surface side separation plate 27 are fixed to the housing 13 by a connection such as spot welding, a fastening member such as a screw or a bolt, or the like.

The two upper side blowers 21 are low-temperature-side blowers and have a centrifugal fan 31 for generating an air flow in the low-temperature-side heat transfer space 18; an electric motor 32 for rotating the centrifugal fan 31; and a scroll casing 33 for rotatably accommodating the centrifugal fan 31, respectively.

The two lower side blowers 22 are high-temperature-side blowers and have a centrifugal fan 34 for generating an air flow in the high-temperature-side heat transfer space 17; an electric motor 35 for rotating the centrifugal fan 34; and a scroll casing 36 for rotatably accommodating the centrifugal fan 34, respectively.

The electrical heater 23 is an inside fluid heating means for heating air flowing in the high-temperature-side heat transfer space 17 in such a manner that a temperature in the closed space 15 may not be less than a lower limit temperature, because performances of the electronic component parts (semiconductor elements, for example) 11 and 12 are deteriorated when the temperature in the closed space 15 is lower than a lower limit temperature (0° C., for example). The electrical heater 23 in the second embodiment is a heater having a heat generating value of 1.2 kW, for example.

The controller 24 is a control circuit for controlling the electrical devices such as two electric motors 32 for the upper side blowers 21, two electric motors 35 for the lower side blowers 22, and an electric heater 23 or the like in response to the detection temperature in the closed space 15 detected by the temperature sensor 9 (temperature sensing means) composed of thermo-sensitive elements such as thermistor or the like.

The controller 24 operates the two upper side blowers 21 and the two lower side blowers 22 in a Hi-operation (a large amount of air) or a Lo-operation (a small amount of air) when the temperature in the closed space 15 is not less than the lower limit temperature (0° C., for example), and turns OFF the electrical heater 23. Further, in the second embodiment, the controller 24 operates the two upper side blowers 21 and the two lower side blowers 22 in such a manner that these blowers 21 and 22 have the same amount of air with substantial same rotational speed of the blowers during a normal operation (day time) in which the temperature in the closed space 15 is not less than the lower limit temperature. Then, at night time or mid-night, the rotational speed of at least one of the two upper side blowers 21 is decreased (relative to the normal operation) to decrease the amount of blown-air and in turn the rotational speed of at least one of the two lower side blowers 22 is increased (relative to the normal operation) to increase the amount of blown-air.

Further, the determination of the day time, night-time and mid-night can be set such that 7:00 to 18:00 is a day time, 18:00 to 21:00 is a night time and 21:00 to 7:00 is a mid-night time, respectively, for example, by a clock (not shown) as time counting means. During 18:00 to 21:00, a night-time signal (either a noise reducing request signal or a first noise reducing request signal) is outputted to perform the above-described control. Further, during 21:00 to 7:00, a mid-night signal (either the noise reducing request signal or a second noise reducing request signal) can be outputted to perform the above-described control. It is also possible to apply a time band determination circuit for determining any one of a day time and a night time by detecting brightness with a photo-electrical energization element (such as a solar cell, a photo-diode, a photo-transistor, for example) as optical amount measuring means (not shown). Further, it is also possible to combine both the time counting means and the photo-amount measuring means. With such an arrangement, during the night time and mid-night where noise becomes a problem when the upper side blowers 21 are operated, it is possible to reduce noise of the upper side blowers 21. An example of control is shown in Table 1.

TABLE 1

| | | | |
|---|---|---|---|
| Time determined by time counting means | 7 to 18 | 18 to 21 | 21 to 7 |
| Photo-electromotive force of optical amount measuring means | Middle-High-Middle | Middle-Low | Low-Middle |
| Determined operation time band | Day time | Night time | Mid-night |
| Air amount blown by upper side blowers | 70 | 60 | 40 |
| Air amount blown by lower side blowers | 70 | 80 | 100 |

In this Table 1, the numerical value of each of the blowers indicates a rate of the rotational speed in the case the rate is set for 100 when a rated voltage is applied. To change the numerical value, either a controlling operation for a wave height value of the applied voltage, for example, or a PWM (Pulse Width Modulation) control for controlling a pulse width, is performed.

Further, the controller 24 turns OFF the two electric motors 32 for the upper side blowers 21, performs a Hi-operation (a large amount of air) or a Lo-operation (a small amount of air) of the two electric motors 35 for the lower side blowers 22 when the temperature in the closed space 15 is not more than the lower limit temperature (0° C., for example), and turns ON the electrical heater 23.

Figure 9A:
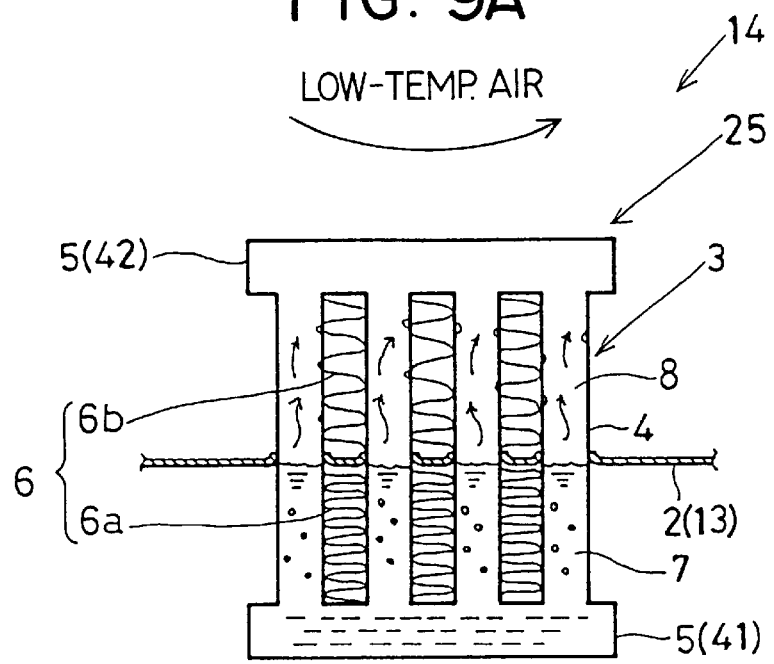
FIG. 9A is a cross sectional view for showing a schematic structure of a heat exchanger of a cooling device in the second embodiment.
Figure 9B:
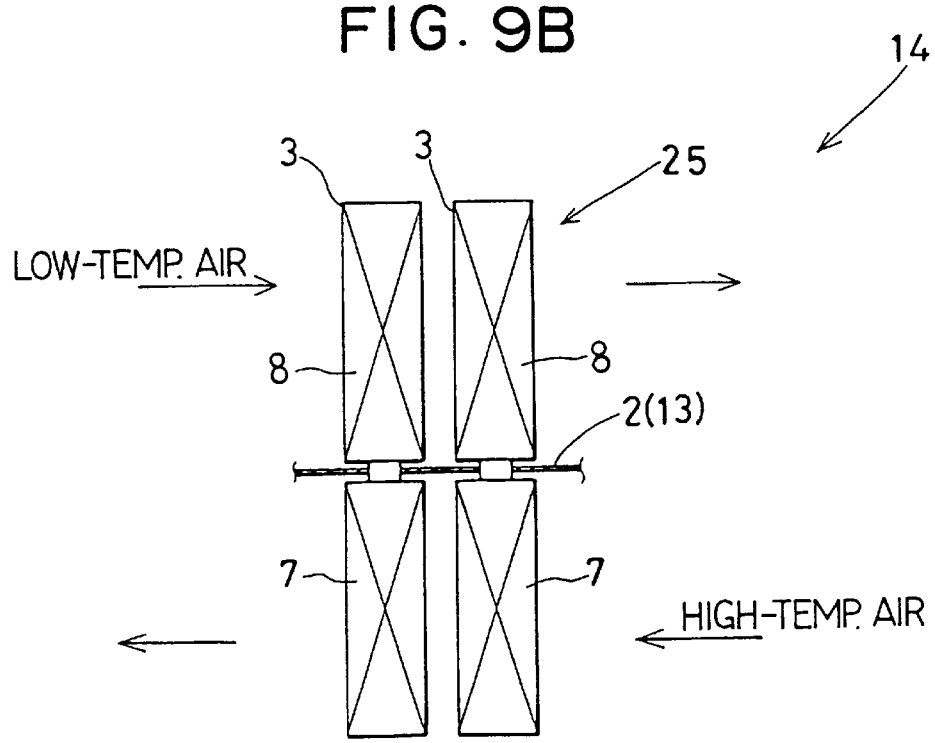
FIG. 9B is another schematic view for showing the heat exchanger of the cooling device in the second embodiment.
Figure 10:
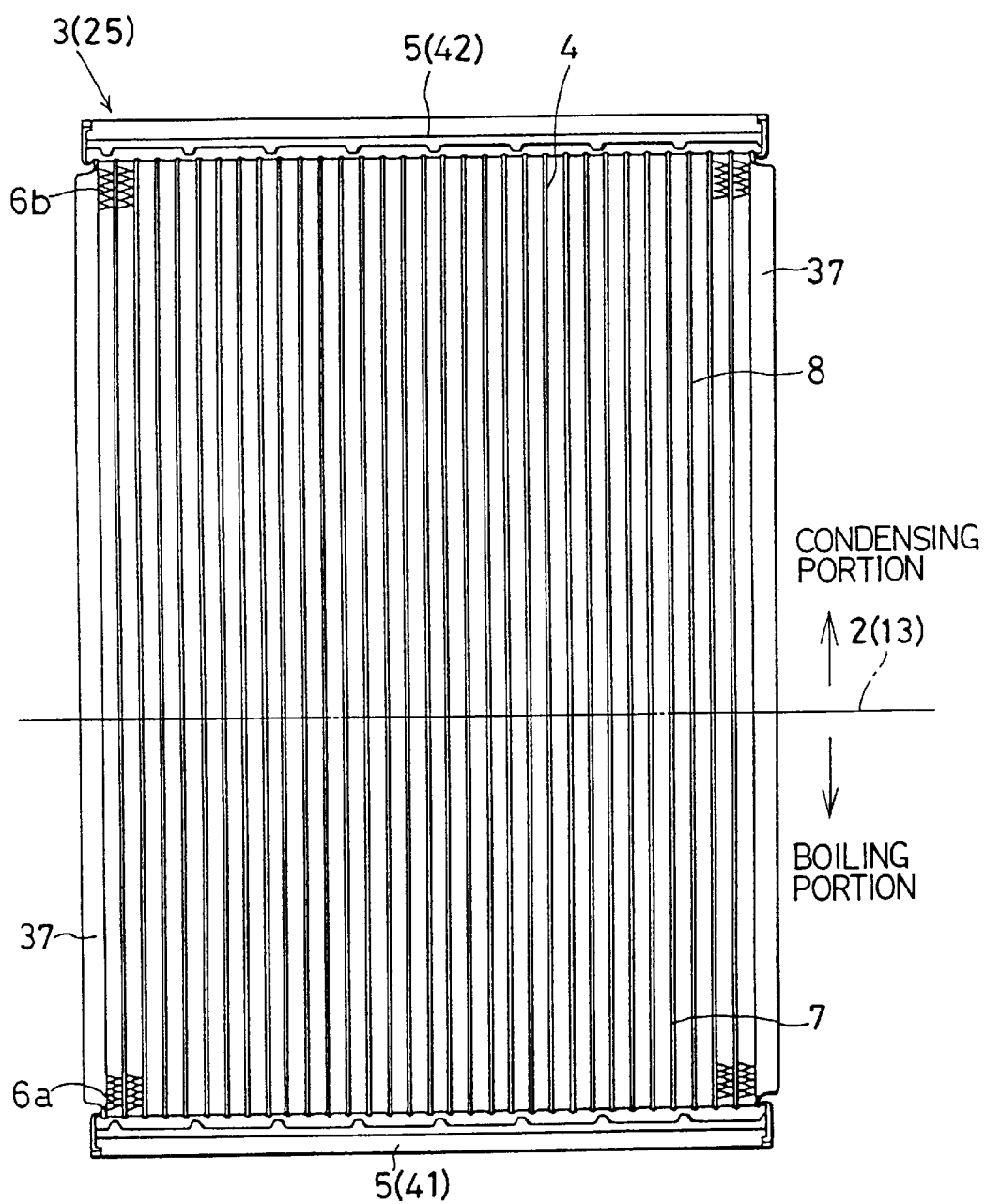
FIG. 10 is a front elevational view for showing a structure of the cooling device in the second embodiment.

Next, referring to FIGS. 8 to 12, the heat exchanger device 25 provided with the cooling device will be described in detail. FIG. 9A shows a schematic structure of the cooling device, FIG. 9B shows a heat exchanging device having the cooling devices arranged in multi-stage, FIG. 10 shows a specific structure of the cooling device, and FIGS. 11 and 12 show a fluid separation plate for dividing the cooling device into two segments.

The heat exchanger device 25 includes a fluid separation plate 2 for air-tightly separating high-temperature air which is the inside air circulating in the housing 13 (fluid in the casing, so-called inside air) from low-temperature air which is outside air circulating outside the housing 13 (fluid outside the casing, so-called outside air), and multi-stage (two-stage) cooling unit 3 assembled into the fluid separation plate 2 while passing through the fluid separation plate 2.

The fluid separation plate 2 constitutes one wall surface of the housing 13 (a part of the casing). The housing 13 constitutes one wall surface of the closed space 15 having a high-temperature inside and another wall surface of the low-temperature-side heat transfer space 18 having a low-temperature inside. For example, the fluid separation plate 2 is of a thin plate made of metallic material such as aluminum having a superior thermal conductivity and is integrally connected (brazed) to the cooling unit 3 and the casing 20 in such a manner that the closed space 15 including the high-temperature-side heat transfer space 17 and the outside including the low-temperature-side heat transfer space 18 are air-tightly partitioned.

Figure 11:
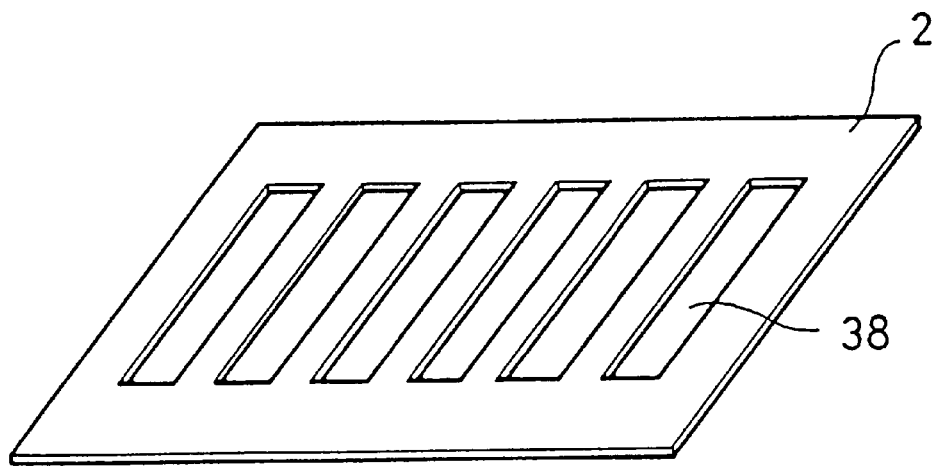
FIG. 11 is a perspective view for showing a fluid separation plate for separating the cooling device shown in FIG. 8 in the second embodiment.
Figure 12:
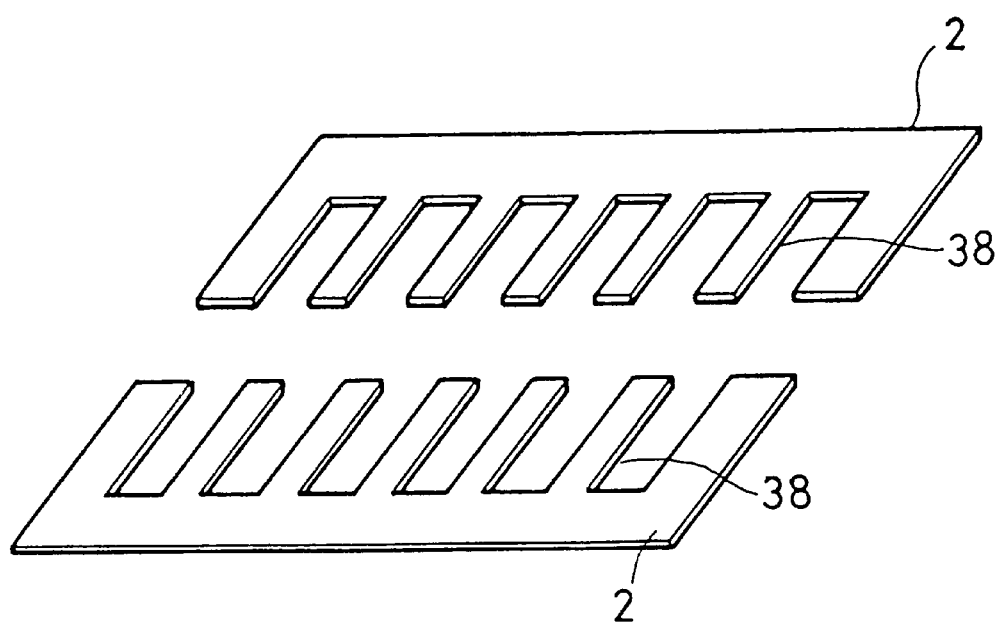
FIG. 12 is a perspective view for showing a fluid separation plate for separating the cooling device shown in FIG. 1 in the second embodiment.

As shown in FIG. 11, the fluid separation plate 2 is provided with a plurality of through-pass holes 38 (width: 1.7 mm, and length: 16.0 mm) of elongated rectangular shape or oval shape, disposed with every predetermined interval, through which each of the cooling pipes of the cooling unit 3 (described later) passes. The fluid separation plate 2 may be of a divided member (two-divided segments in the embodiment) as shown in FIG. 12.

The cooling unit 3 is a multi-flow type heat exchanger which is structured of a plurality of cooling pipes 4 assembled in multi-stage (two stages) while being inclined in the casing 20 by a predetermined angle and having refrigerant of fluorocarbon type therein, a pair of connection pipes 5 for communicating with each of the cooling pipes 4 and a plurality of heat transfer fins fixed to the outside of the cooling pipe 4. To both sides of the cooling unit 3 are fixed side plates 37 fastened to the fluid separation plate 2 and the casing 20 by a fastening member to reinforce a plurality of cooling pipes or a plurality of heat transfer fins 6. Further, the cooling devices 3 are piled up in multi-stage (two stages, for example) in a direction of flow of the high-temperature air and a direction of flow of the low-temperature air, respectively.

The plurality of cooling pipes 4 are formed such that metallic material having a superior thermal conductivity such as aluminum or copper or the like, for example, is formed into flat pipes (width: 1.7 mm, length: 16.0 mm) having a cross section of elongated rectangular shape or oval shape, and the pipes pass through the through-holes 38 of each of the fluid separation plates 2, respectively. In the cooling unit 3 composed of these cooling pipes 4, one side (lower side as seen in FIG. 10) disposed at the high-temperature air side from the fluid separation plate 2 constructs the refrigerant tank (boiling portion) 7 and the other side (upper side as seen in FIG. 10) disposed at the low-temperature air side from the fluid separation plate 2 constructs a radiator (condensing portion) 8. In this embodiment, the boiling portion 7 has a width (a width size) of 360 mm, a height size of 330 mm and a thickness size of 16 mm, and the condensing portion 8 has a width size of 360 mm, a height size of 430 mm and a thickness size of 16 mm.

The connection pipe 5 is composed of a high-temperature-side tank 41 connected to the lower end of each of the plurality of cooling pipes 4 (the boiling portion 7) and a low-temperature-side tank 42 connected to the upper end of each of a plurality of cooling pipes 4 (the condensing portion 8) so as to communicate with the cooling pipes 4 each other. These high-temperature-side and low-temperature-side tanks 41 and 42 include core plates disposed at the cooling pipe 4 and the substantial inverse U-shaped tank plate connected to the core plate. Either one of the high-temperature-side tank 41 or the low-temperature-side tank 42 is provided with only one refrigerant sealing inlet (not shown) for sealing the refrigerant into the cooling unit 3. The refrigerant is sealed in each of the cooling pipes 4 of the cooling unit 3 until liquid surface is substantially coincided with a position of the fluid separation plate 2, i.e., until a height of the boiling portion 7. The refrigerant is sealed after the heat transfer fins 6 are brazed to the cooling pipe 4. Further, the high-temperature-side tank 41 may be eliminated.

The heat transfer fins 6 are composed of heat-receiving fins 6a placed between the adjoining cooling pipes 4 at the high-temperature side (boiling portion 7) of the cooling unit 3 and the radiating fins 6b placed between the adjacent cooling pipes 4 at the low-temperature side (condensing portion 8) of the cooling unit 3. The heat transfer fins 6 are corrugated fins in which a thin plate (for example, a plate thickness of approximately 0.02 to 0.50 mm) made of metallic material having a superior thermal conductivity such as aluminum or the like is alternatively folded to form a corrugated shape and is brazed to a flat outer wall surface of the cooling pipe 4. That is, the water wall surface of the cooling pipe 4 and the thermal transfer fins 6 are connected while being melted to each other.

The heat-receiving fins 6a are disposed below the fluid spacer 2, wherein a fin pitch P1 is 2.40 mm, for example, and a fin width B1 is 16 mm, for example. Further, the fin pitch P1 is preferably in a range of 1.50 mm to 2.90 mm, for example, and more preferably in a range of 2.00 mm to 2.50 mm. The radiating fins 6b are spaced apart above the fluid separation plate 2, wherein a fin pitch P2 is preferably in a range of 3.00 mm to 4.50 mm and more preferably in a range of 3.50 mm to 4.00 mm. That is, the cooling unit 3 is set such that the fin pitch P1 of the heat-receiving fins 6a is reduced to be more than the fin pitch P2 of the radiating fins 6b by approximately 50% to 65%, for example.

As shown in FIGS. 8 and 9B, in the heat exchanging device 25, multi-stages of the cooling units 3 are disposed in the flowing directions of the high-temperature air and the low-temperature air in such a manner that the high-temperature air (clean air in the housing 13) circulates in the high-temperature-side heat transfer space 17 of the closed space 15 becomes a counter-flow against the low-temperature air (polluted air outside the housing 13) circulating in the low-temperature-side heat transfer space 18.

That is, in the heat exchanging device 25 composed of multi-stage cooling devices 3 or the like, the right side as seen in the figure of the lower end (the boiling portion 7) of each of the cooling pipes 4 in the second-stage of the cooling unit 3 constructs the high-temperature air inlet, and the left side as seen in the figure of the lower end (the boiling portion 7) of each of the cooling pipes 4 of the first-stage of cooling unit 3 constructs an output for the high-temperature air. Further, in the heat exchanging device 25, the left side as seen in the figure of the upper end (the condensing portion 8) of each of the cooling pipes 4 of the first-stage cooling unit 3 constructs an inlet for the high-temperature air, and the right side as seen in the figure of the upper end (the condensing portion 8) of each of the cooling pipes 4 of the second-stage cooling unit 3 constructs an outlet for the high-temperature air.

Next, referring now to FIG. 9 and FIG. 10, there will be described simply an operation of the cooling device 14 provided with the heat exchangers 25 having multi-stages of the cooling units 3 of this embodiment is disposed in such a manner that the high-temperature air and the low-temperature air become counter-flows from each other.

When the temperature in the closed space 15 in the housing 13 is not less than the lower limit temperature (0° C., for example), the electric motors 32 for the two upper side blowers 21 and the electric motors 35 for the two lower side blowers 22 are electrified to circulate the high-temperature air (clean air not including foreign materials such as dust, trash or moisture, outside fluid) in the low-temperature-side heat transfer space 18 within the housing 13.

Then, the cooling unit 3 fixed while passing through the fluid separation plate 2 of the housing 13 is operated such that the refrigerant sealed in each of the cooling pipes 4 of the multi-stage type cooling unit 3 receives heat transmitted from the high-temperature air through the heat-receiving fins 6a, boils and gasifies, as shown in FIG. 9A. The gasified refrigerant vapor is condensed and liquefied on the inner wall surface by the condensing portion 8 disposed at the upper end side of the cooling unit 3 which is exposed to the low-temperature air to be a low temperature, the condensed latent heat is transmitted to the low-temperature air through the radiating fins 6b.

As shown in FIG. 9A, the refrigerant condensed and liquefied at the condensing portion 8 drops by its own weight along the inner wall surface of each of the cooling pipes 4 and drops onto the boiling portion 7 disposed at the lower end of the cooling unit 3. As described above, the refrigerant sealed in each of the cooling pipes 4 of the cooling unit 3 repeats boiling, gasifying, condensing and liquefying alternatively, so that the heat of the high-temperature air is moved to the low-temperature air to radiate the heat generated at the electronic component parts 11 and 12 by the multi-stage cooling unit 3.

With such an arrangement, it is possible to cool the electronic component parts 11 and 12 without mixing the high-temperature air (clean air in the housing 13) circulating in the high-temperature-side heat transfer space 17 of the closed space 15 with the low-temperature air circulating in the low-temperature-side heat transfer space 18 (polluted air outside the housing 13).

In the cooling unit 3 of this embodiment, since the fin pitch P1 of the heat-receiving fins 6a is smaller than the fin pitch P2 of the radiating fins 6b, an effective heat exchanging area of the boiling portion 7 projecting downwardly (projecting into the housing 13) from the fluid separation plate 2 is smaller than that of the condensing portion 8 projected upwardly (projecting outside the housing 13) from the fluid separation plate 2 of a plurality of cooling pipes 4; however, a heat exchanging performance of the boiling portion 7 is improved by an amount corresponding to a small fin pitch, resulting in that no deterioration in the heat exchanging performance may occur even if the heat exchanging effective area of the boiling portion 7 is decreased.

Figure 14:
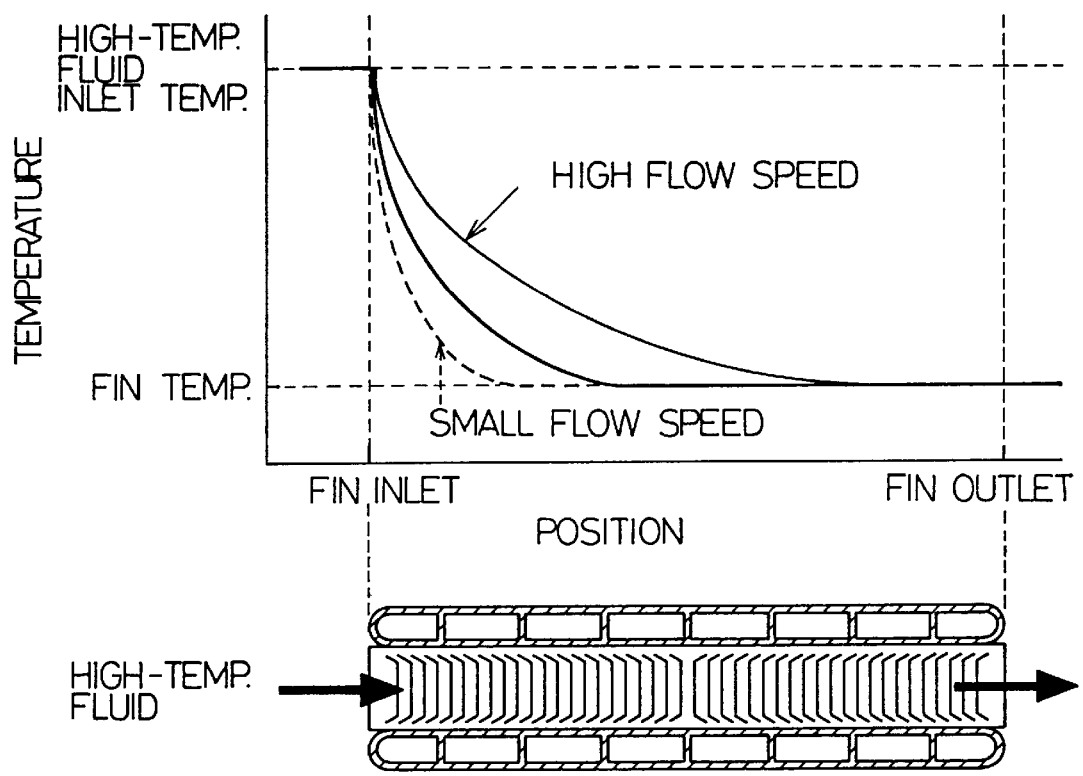
FIG. 14 is a view for showing a relationship between a temperature of high-temperature fluid with respect to a fin position in the second embodiment.

A temperature of the high-temperature fluid passing through the heat-receiving fins 6a varies as shown in FIG. 14. FIG. 14 shows a temperature of the high-temperature fluid at each of the positions of the heat-receiving fins 6a when a flow speed of the high-temperature fluid varies. For a sake of description, temperatures in the heat-receiving fins 6a are maintained uniform through each of the positions. The heat-receiving fins 6a of the cooling device of this embodiment are formed by the corrugated fins having louvers to have an extreme high thermal conductivity. When the inside of the housing 13 is cooled, a difference in temperature between the high-temperature fluid inlet temperature and the temperature of the fins 6a may be in a range of approximately several ° C. to several tens ° C., the high-temperature fluid passing through the heat-receiving fins 6a varies in temperature up to around the temperature of the heat-receiving fins 6a with a sufficient surplus state.

When the flow volume of the high-temperature fluid is increased, a flow speed of the high-temperature fluid is increased so that a thermal conductivity of the heat-receiving fins 6a is increased; however, since the time required for the fluid to pass through the heat-receiving fins 6a is shortened, the temperature of the high-temperature fluid varies slowly. However, since the heat-receiving fins 6a, fins having a high thermal conductivity and sufficient surplus capacity are employed, the high-temperature fluid varies in a temperature up to a fin temperature at the outlet of each of the fins. Further, as the flow volume of the fluid is decreased, the temperature varies sharply with a sufficient surplus amount. As described above, the corrugated fins (in particular, the corrugated fins having louvers) with a surplus capacity in the thermal conductivity are employed as the heat-receiving fins 6a to adjust the flow volume. Further, the above-described content may similarly be applied to the radiating fins.

Then, there will be described effects obtained by changing each air amount of the two upper side blowers 21 and the two lower side blowers 22.

Figure 15:
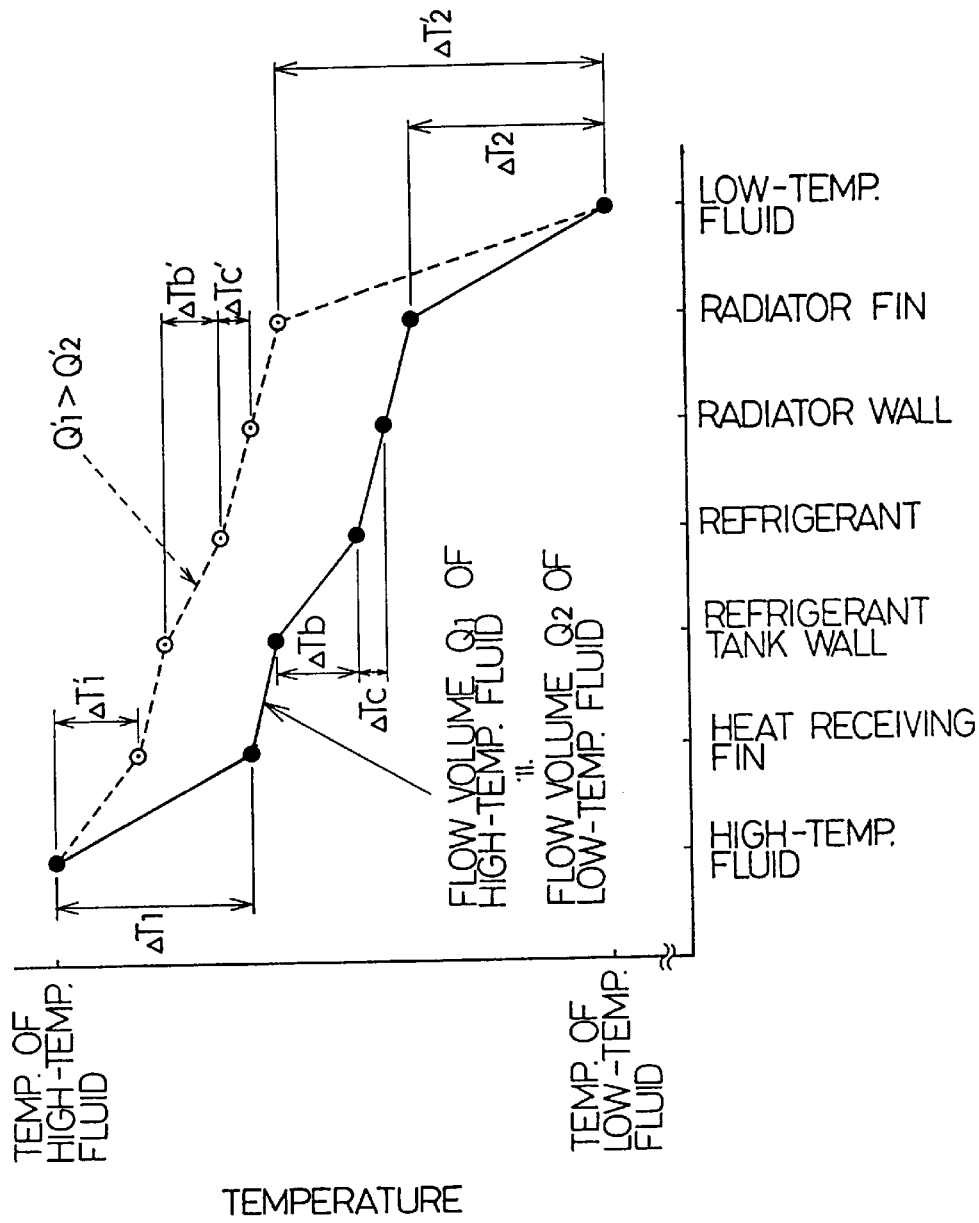
FIG. 15 is an illustrative view for showing a thermal transfer from a high-temperature fluid to a low-temperature fluid in the second embodiment.

In FIG. 8, as the flow volume of the inner fluid (high-temperature fluid) is increased to be more than a flow volume of the outside fluid (low-temperature fluid), a heat transfer by the cooling device changes as shown in FIG. 15. The high-temperature fluid transmits heat to the heat-receiving fins at the boiling portion 7 when passing through the boiling portion 7, resulting in that a temperature of the high-temperature fluid is reduced. A heating calorie q (J/s) of the high-temperature fluid transferred from the high-temperature fluid is a product of a thermal capacity of air and a reduced temperature. In other words, this can be expressed by an equation of a flow volume of high-temperature fluid $Q(m^3/s)\times$ a density of high-temperature fluid p $(kg/M^3)\times$ a specific heat of high-temperature fluid cp (J/kg C)×a temperature reduction amount $\Delta T(° C.)$.

In this case, since the density p of the high-temperature fluid and the specific heat cp are substantially constant (although the density ρ of the high-temperature fluid and the specific heat cp vary slightly in response to the temperature, these are minute in value), if the same heating calorie q is transferred from the high-temperature fluid, when the flow volume Q at the high-temperature side is increased, a temperature reducing amount $\Delta T$ of the high-temperature fluid is decreased ($\Delta T1'<\Delta T1$) and the heat-receiving fins 6a at the boiling portion 7 are maintained at a high temperature.

After the heating calorie is transferred to the heat-receiving fins 6a, it is possible to consider that a temperature difference between the heat-receiving fin 6a and the radiating fin 6b is substantially the same as the case in which a flow volume of the high-temperature fluid and a flow volume of the low-temperature fluid are approximately the same each other (although a gasification heat of the refrigerant varies in response to a saturation temperature of the refrigerant, it is within a range which can be substantially ignored), because thermal flow bundles (thermal transfer amount per unit area) among the heat-receiving fins 6a, boiling portion 7, refrigerant, condensing portion 8 and radiating fins 6b are the same one another (although the temperature difference varies slightly in response to a temperature, the temperature difference is minute in its value). When the temperature at the heat-receiving fins 6a increases by increasing flow volume of the high-temperature fluid, the temperature in the radiating fins increases.

Further, a heating calorie q (J/s) transferred from the radiating fins 6b to the low-temperature fluid can be expressed by an equation of a flow volume of low-temperature fluid $Q(m^3/s)\times$ a density of low-temperature fluid p $(kg/m^3)\times$ a specific heat of low-temperature fluid cp (J/kg ° C.)×a temperature increasing amount $\Delta T(° C.)$. In this case, since a temperature difference between the radiating fins and the low-temperature fluid is increased ($T2'>\Delta T2$ in FIG. 15), it is possible to decrease a flow volume of the low-temperature fluid. As described above, since the saturating temperature of the refrigerant is freely shifted by a variation in flow volume of the high-temperature fluid, it is possible to reduce the flow volume of the low-temperature fluid.

With such an arrangement, it is possible to reduce an air amount of the upper side blower 21, which has the highest influence on noise. Since the device is installed in the closed casing, by increasing the flow volume of the high-temperature fluid, the noise can be reduced. As a result, by increasing an air amount at the high-temperature side and decreasing air amount at the low-temperature side, it is possible to reduce the entire noise value greatly.

Further, by decreasing the flow volume of the low-temperature-side fluid, it is possible to decrease the adhering amount of stain at the thermal radiator and further to prolong a maintenance period for cleaning the heat exchanger or the like.

When the refrigerant is sealed up to around the fluid separation plate as in this embodiment, a boiling (evaporating) phenomenon generated in the cooling pipe 4 at the boiling portion 7 is maintained in a pool boiling state (boiling is produced due to occurrence of air bubbles at the boiling surface). The pool boiling theoretically has a higher heat resistance as compared with that of evaporation at the wall surface (in the case that a quite thin liquid film of refrigerant contacts a wall surface, the refrigerant is evaporated from the surface). That is, since a value of the heat resistance is dependent on a volume of occurrence of the boiling (evaporating) phenomenon against the entire area of the wall surface of the boiling portion 7, an evaporation of the refrigerant by the pool boiling is limited to the bubble part, whereas an evaporation of the thin liquid refrigerant is generated with wide area.

However, in the structure in which the boiling portion 7 in this embodiment is elongated in a vertical direction, the liquid film should be supplied to an extreme high level to be more than the liquid surface against the gravity, and therefore, it is difficult to maintain the thin liquid film state with the wide area of the wall surface in the vertical direction.

On the other hand, since a ratio of closing of wall surface of the condensing portion 8 with the condensed refrigerant within the condensing portion 8 is lower than that of the boiling portion 7 at the time of the pool boiling, so that the heat resistance is lower than that of the wall surface of the boiling portion 7 of the pool boiling ($\Delta Tb > \Delta Tc$ in FIG. 15). Accordingly, in the cooling unit 3 in which liquid refrigerant is present at most of the boiling portion 7 and the pool boiling is mainly performed, to decrease the amount of heat resistance $\Delta Tb$ at the boiling portion 7 is more advantageous in improving the performance. Thus, since the heat resistance at the wall surface of the condensing portion 8 is scarcely decreased ($\Delta Tc' \approx \Delta Tc$), especially by increasing the flow volume of the high-temperature fluid, a relationship of $\Delta Tb' < \Delta Tb$ is set. Therefore, a heat resistance from the wall surface of the boiling portion 7 up to the wall surface of the condensing portion 8 can be reduced like an equation of ($\Delta Tb' + \Delta Tc' < \Delta Tb + \Delta Tc$), and $\Delta T2'$ can be correspondingly increased.

Further, the high-temperature fluid circulates in the housing 13 and even if a circulating flow volume of the high-temperature fluid is increased, a part of the high-temperature fluid is converted into a pressure in the housing 13, which is applied to the suction side of the high-temperature fluid as a static pressure, resulting in that a part of the energy of the fluid blown into the housing 13 can be recovered. To the contrary, even if the flow volume of the low-temperature fluid is increased, a speed and a pressure energy of the discharged low-temperature fluid are released into the atmosphere and the energy of the fluid can not be recovered. Thus, the flow volume of the high-temperature fluid is increased and the flow volume of the low-temperature fluid is decreased so that the consumed electric power of each of the blowers 21 and 22 can be reduced. Further, when the flow speed of the high-temperature fluid is increased, the temperature distribution in the housing 13 can be reduced.

The flow volumes of the low-temperature fluid and the high-temperature fluid can be changed even with the same number of blowers, if the number of rotations of the lower side blower 21 and the upper side blower 22 are changed. Further, if there is a place for installing the blower, the amount of blown-air is changed by changing the number of blowers each having the same specification (rotational speed, a fan diameter of the blower and a consumed electric power).

Figure 16:
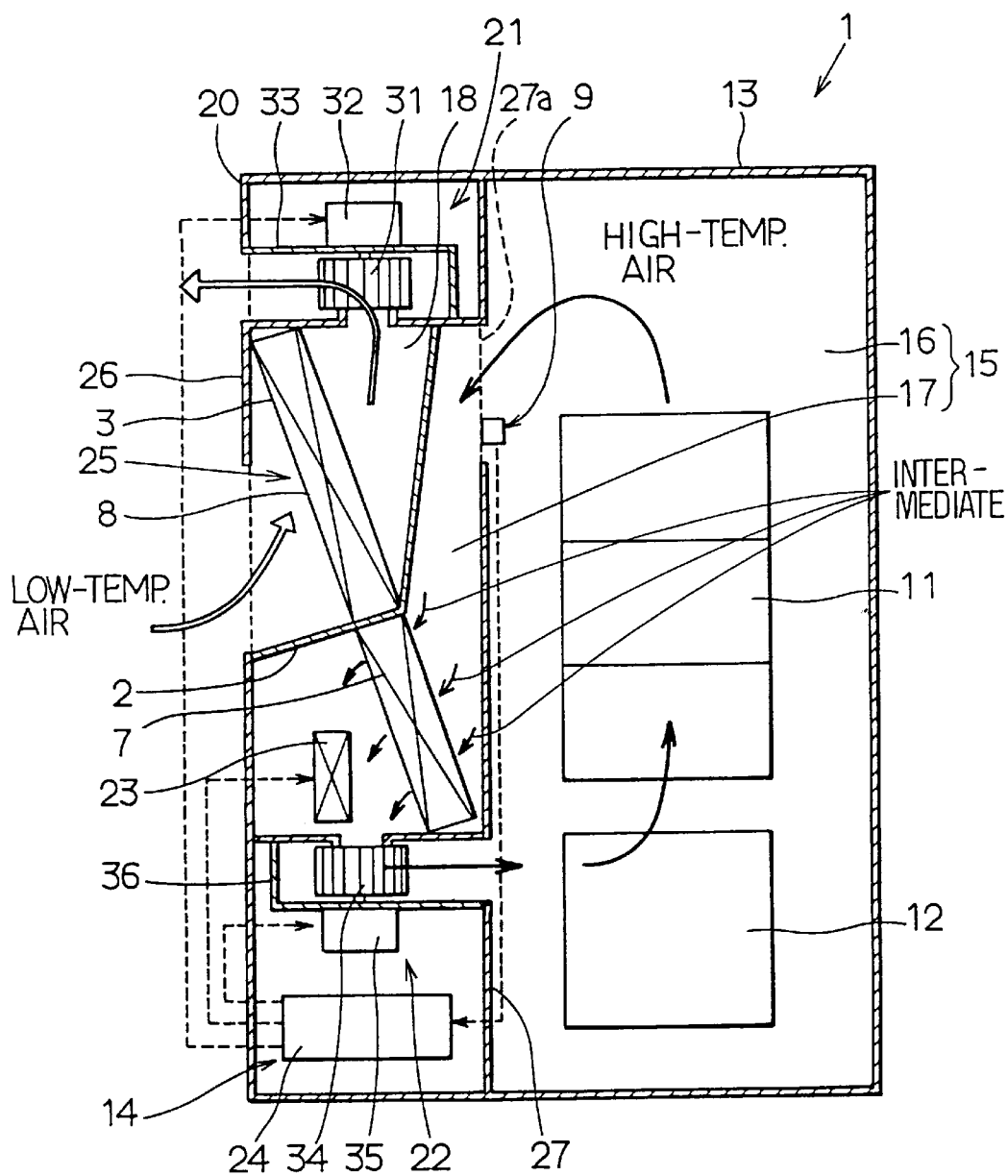
FIG. 16 is an illustrative view for showing the cooling device shown in FIG. 8 in the second embodiment.

As shown in FIGS. 8 and 16, in this embodiment, there is provided a high-temperature fluid suction duct 27a opened at an upper location in the housing 13, for positively introducing the upper high-temperature fluid. When the flow volume of the high-temperature fluid is increased, the high-temperature fluid in the housing 13 can be prevented from being accumulated at the upper part by the high-temperature fluid suction duct 27a, and the high-temperature fluid ascending at the upper part is sucked so that an efficiency of the heat exchanger is increased.

Figure 17:
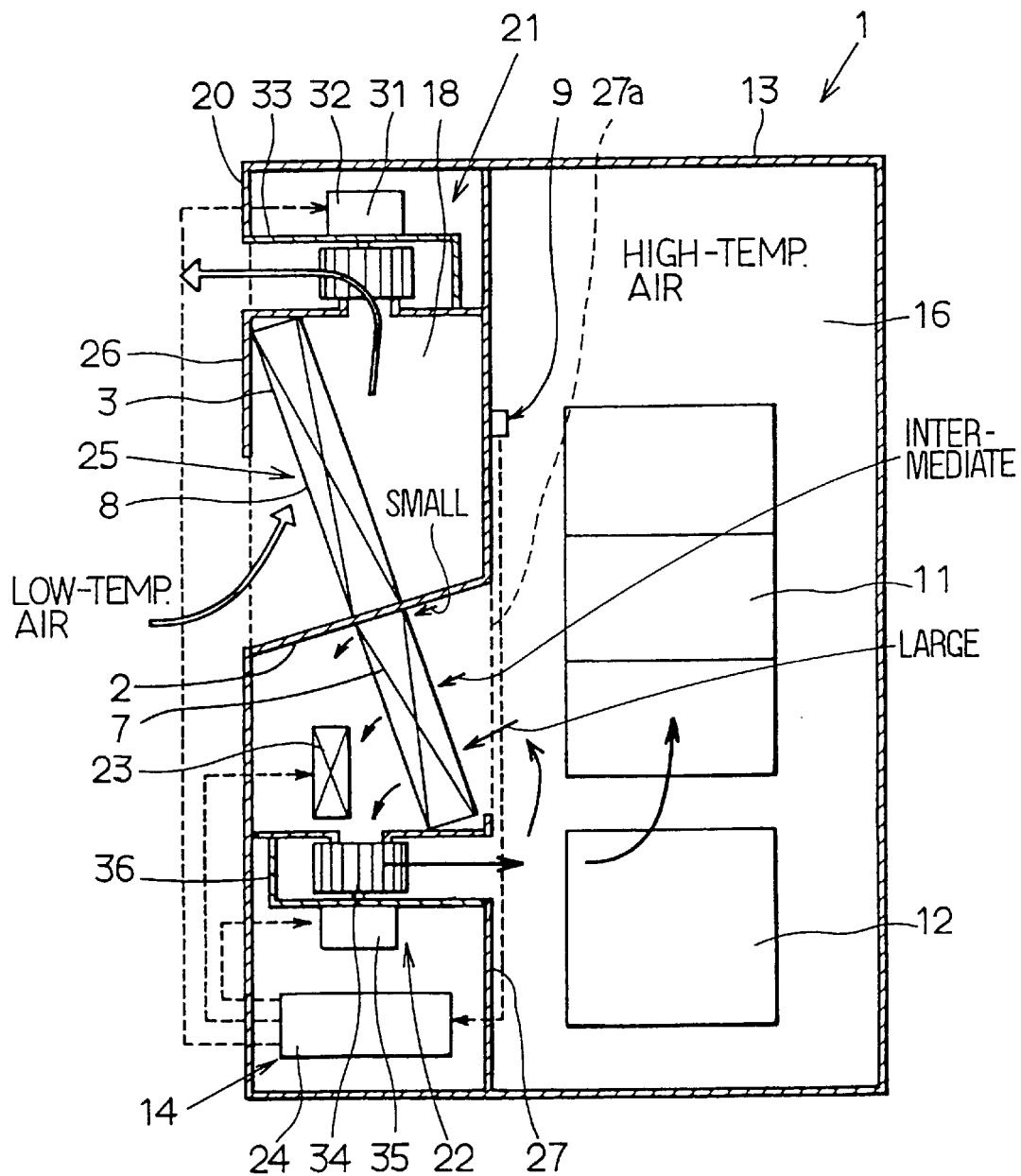
FIG. 17 is an illustrative view for showing an example of comparison of the cooling device shown in FIG. 8.

A construction in which the high-temperature fluid suction duct is not provided is shown in FIG. 17 as a comparison example. In this case, the flow speed of the high-temperature fluid passing through the boiling portion 7 forms a distribution (high, middle and low) having a great difference. As shown in FIG. 17, the flow speed of the fluid is concentrated at the lower part of the boiling portion 7 proximate to the lower side blower 22 (a flow speed at the upper side is decreased) so that the boiling portion 7 may not be efficiently utilized. That is, since a large amount of liquid refrigerant is present below the boiling portion 7, the pool boiling is likely to generate. Therefore, the higher the position in the boiling portion 7 becomes, the more the bubbles are present and a probability of presence of the liquid refrigerant is decreased, so that an evaporation of the thin liquid film-like refrigerant may easily be produced. Accordingly, when the flow speed of the fluid at the upper part of the boiling portion 7 is decreased, a heat transfer from the high-temperature fluid to the heat-receiving fins 6a is not performed efficiently.

To the contrary, as shown in FIGS. 8 and 16, when the high-temperature fluid suction duct 27a is provided, a flow of high-temperature fluid is formed from above, no difference is produced in fluid passages at the upper part and the lower part of the boiling portion 7 as viewed from the lower side blower 22, the flow speed is averaged to supply a flow volume of high-temperature fluid positively into the upper part of the boiling portion 7. With such an arrangement, an efficiency of the boiling portion 7 can be increased especially when a flow volume of the high-temperature fluid is increased.

Further, the high-temperature fluid suction duct 27a can solve the problem of a short circuit in which the high-temperature fluid cooled by the boiling portion 7 is sucked into the boiling portion 7 just after the fluid is blown out from the lower side blower 22. When the short circuit occurs, it may cause a problem that the fluid has an extreme high temperature partially, e.g., at the upper part of the housing 13.

Figure 18:
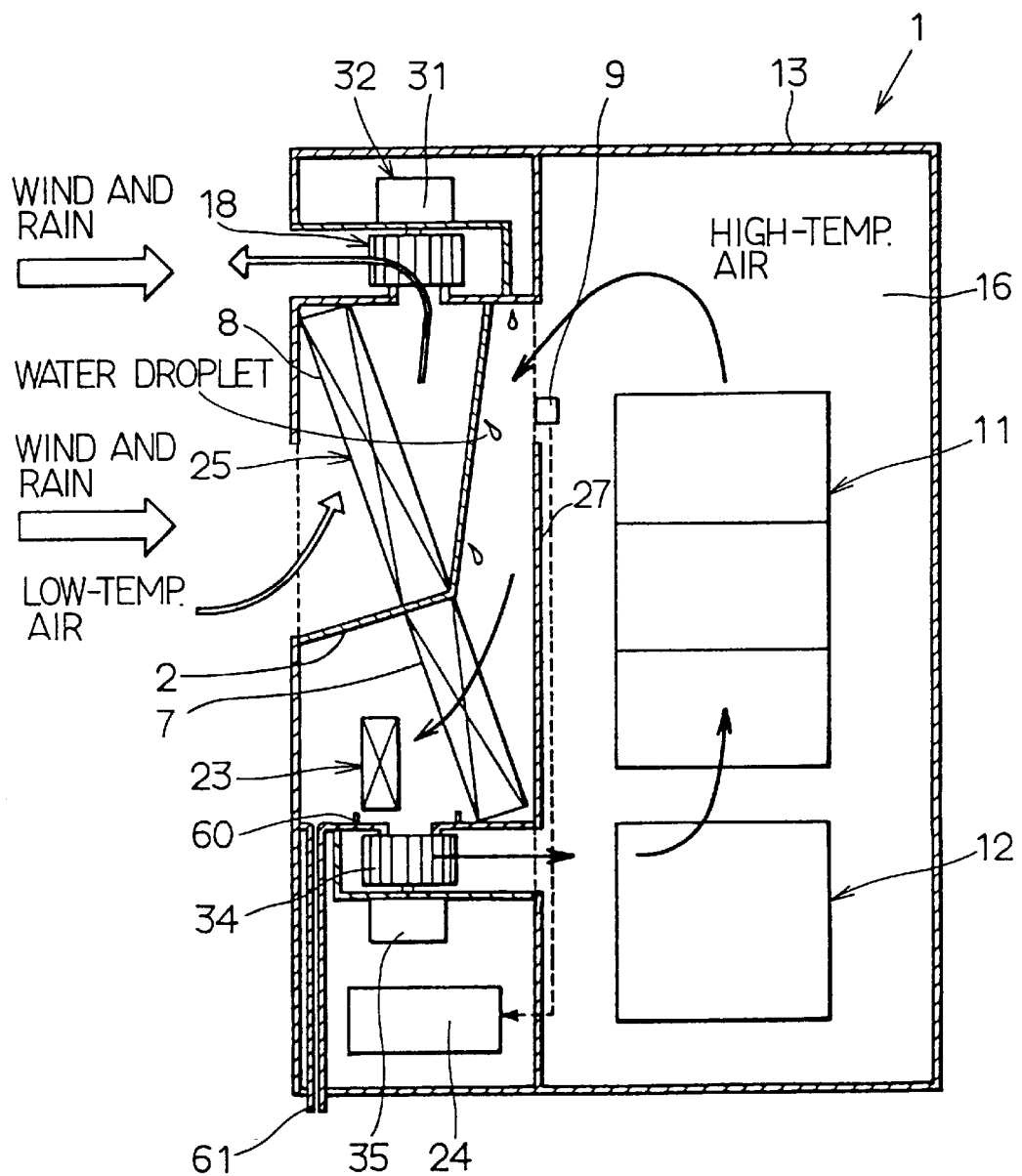
FIG. 18 is an illustrative view for showing the cooling device shown in FIG. 8.

In addition to the effect as shown in FIG. 16, by providing the high-temperature fluid suction duct 27a, it is possible to prevent the water droplets from reaching an electric circuit in the housing 13 even when the sealing performance of the partition wall for partitioning the high-temperature fluid and the low-temperature fluid is deteriorated due to a certain reason. The water droplets prevented from entering the housing 13 by the high-temperature fluid suction duct 27a are discharged out of the housing 13 by the drain pipe 61 disposed at the lower part of the boiling portion 7 in FIG. 18. Further, since the flow volume of the low-temperature fluid is reduced, a dynamic pressure of the upper side blower 22 acting on the low-temperature passage requiring a waterproof state can be restricted to a low value, so that the water-proof performance can be improved.

Next, referring to FIGS. 13A and 13B, there will be described features of the heat exchanging device in which the cooling units 3 are disposed in the multi-stage form in a flowing direction of each of the high-temperature air and the low-temperature air.

FIGS. 13A and 13B are schematic views for showing a temperature distribution of air in a flow passage direction and a temperature distribution of refrigerant in a flow passage direction in each case of a single stage (one stage) cooling unit 3 and multi-stage (two stages) cooling units 3. An ordinate of FIGS. 13A and 13B indicates a temperature (the lower the position, the higher the temperature) and an abscissa indicates a flowing direction of the fluid (air), respectively.

In the case that the cooling unit 3 is a single stage (one stage) type heat exchanger, the high-temperature air flows from the right side of the lower stage cooling device (the boiling portion 7) as viewed in the figure and a temperature of the high-temperature air is decreased as the heat is radiated to the upper stage cooling device (the condensing portion 8) thereafter the high-temperature air, heat of which is radiated, i.e., cooled high-temperature air, flows from the left side of the cooling unit 3 as viewed in the figure. Further, in the case that the cooling unit 3 is a single stage (one stage) heat exchanging device, as shown in FIG. 13A, the low-temperature air flows from the left side of the upper stage cooling device (condensing portion 8) as viewed in the figure, a temperature of the high-temperature air is increased as the heat is received from the cooling unit 3 and the air flows from the right side of the cooling unit 3 as viewed in the figure.

When a temperature difference between inlet air and outlet air of the condensing portion 8 of the cooling unit 3 is defined as $\Delta T1$, the heat exchanging fluid which heat exchanges with the refrigerant sealed in the cooling unit 3 is air. Therefore, the low-temperature air is heated rapidly by the radiating fins 6b of the cooling unit 3 so that the temperature of the low-temperature air is increased rapidly at the inlet; however, thereafter the air is saturated and the temperature difference $\Delta T1$ (cooling performance) is not so increased.

To the contrary, in the case of the heat exchanger device 25 having the cooling units 3 disposed in multi-stages as shown in FIG. 13B, it is possible to perform a heat exchange between refrigerant sealed in the cooling unit 3 and air at least in two stages in an air flowing direction. At this time, since the refrigerant sealed in the first stage cooling unit 3 and the refrigerant sealed in the second stage cooling unit 3 have a temperature difference (a radiating fin temperature difference and a heat-receiving fin temperature difference) as indicated by broken lines in the figure, the low-temperature air has a saturation temperature in the midway part of the condensing portion 8 of the first stage cooling unit 3 as shown in FIG. 13B, thereafter the temperature is increased near the inlet of the second stage cooling unit 3 and the high-temperature air has a saturation temperature in the midway part of the boiling portion 7 of the second stage of the cooling unit 3 and the temperature near the inlet of the first stage cooling unit 3 is decreased.

Accordingly, as indicated in FIGS. 13A and 13B, a temperature difference $\Delta T2$ in the case of this embodiment (the heat exchanging device 25 having the cooling units 3 disposed in multi-stages) can be increased to be more than a temperature difference $\Delta T1$ in the prior art (the heat exchanging device having a single stage of cooling unit 3 disposed), so that the heat of the high-temperature air is radiated to the low-temperature air and a cooling performance of the high-temperature air can be improved. With such an arrangement, it is possible to improve an effect for cooling the electronic component parts 11 and 12, so that the electronic component parts 11 and 12 perform a stable operation. In the case that the radiating performance in this embodiment is compared with that (a cooling performance) in the prior art, a heat exchanging effective area (a radiating effective area) of the cooling unit 3 can be decreased, so that an entire size of the cooling device 14 provided with such a compact heat exchanging device 25 can be reduced.

The heat exchanger device 25 having the cooling units 3 disposed in multi-stage is installed such that the high-temperature air and the low-temperature air flow in the opposite directions with each other. Accordingly, since it is possible to provide an effective temperature difference between the temperature of refrigerant (radiating fin temperature and heat-receiving fin temperature) sealed in the first stage cooling unit 3 and the temperature of refrigerant (radiating fin temperature and heat-receiving fin temperature) sealed in the second stage cooling unit 3, it is possible to increase and decrease the low-temperature air and the high-temperature air in sequence by using refrigerant having temperature difference. With such an arrangement, a cooling performance can be improved and an entire size of the cooling device 14 can be reduced.

In this embodiment, the case in which the cooling units 3 are disposed in two stages has been described; however, the multi-stage of three stages or more can also be employed in the case that a temperature difference at the air inlet and the air outlet of the boiling portion 7 and the condensing portion 8 of the heat exchanging device 25 is increased. The operation and effect are the same as the above; and therefore, the description will be omitted.

In the cooling unit 3 of this embodiment, since the high-temperature side is air-tightly sealed by the housing 13 (the fluid separation plate 2), a fin pitch P1 of the heat-receiving fins 6a disposed at the cooling pipe 4 constituting the boiling portion 7 having no possibility of producing any clogging is set to be smaller than a fin pitch P2 of the radiating fins 6b disposed at the cooling pipe 4 constituting the condensing portion 8 exposed to the atmosphere including dust, trash or moisture and the like.

With such an arrangement, a cooling performance of the high-temperature air can be improved by setting a pitch P1 of the boiling portion 7 to be smaller than a fin pitch P2 of the condensing portion 8 while preventing the condensing portion 8 from being clogged as compared with the case in which the fin pitch at the high-temperature side (inside air side) and the fin pitch at the low-temperature side (outside air side) of the fluid separation plate 2 are set to be same to each other. Further, as much as the fin pitch P1 is reduced, a vertical size of the heat-receiving fins 6a is shortened to be less than the vertical size of the radiating fins 6b. In this way, a vertical size of the boiling portion 7 of a plurality of cooling pipes 4 (radiating effective area) can be reduced; and therefore, the entire size of the cooling unit 3, subsequently the entire size of the cooling device 14 can be reduced.

A third embodiment of the present invention will be described.

Figure 19:
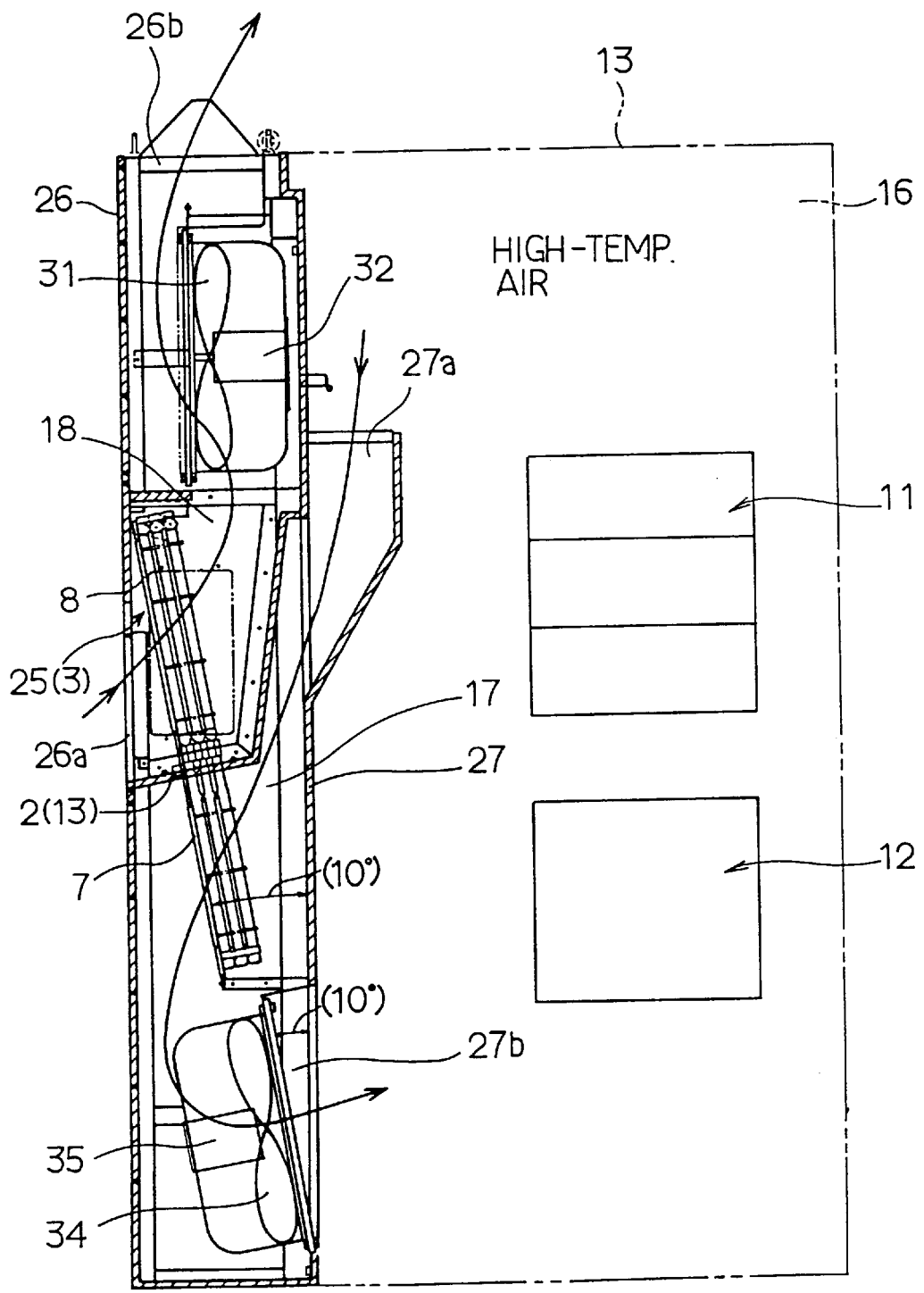
FIG. 19 is a schematic view for showing an entire structure of an electronic equipment in a third embodiment.
Figure 20:
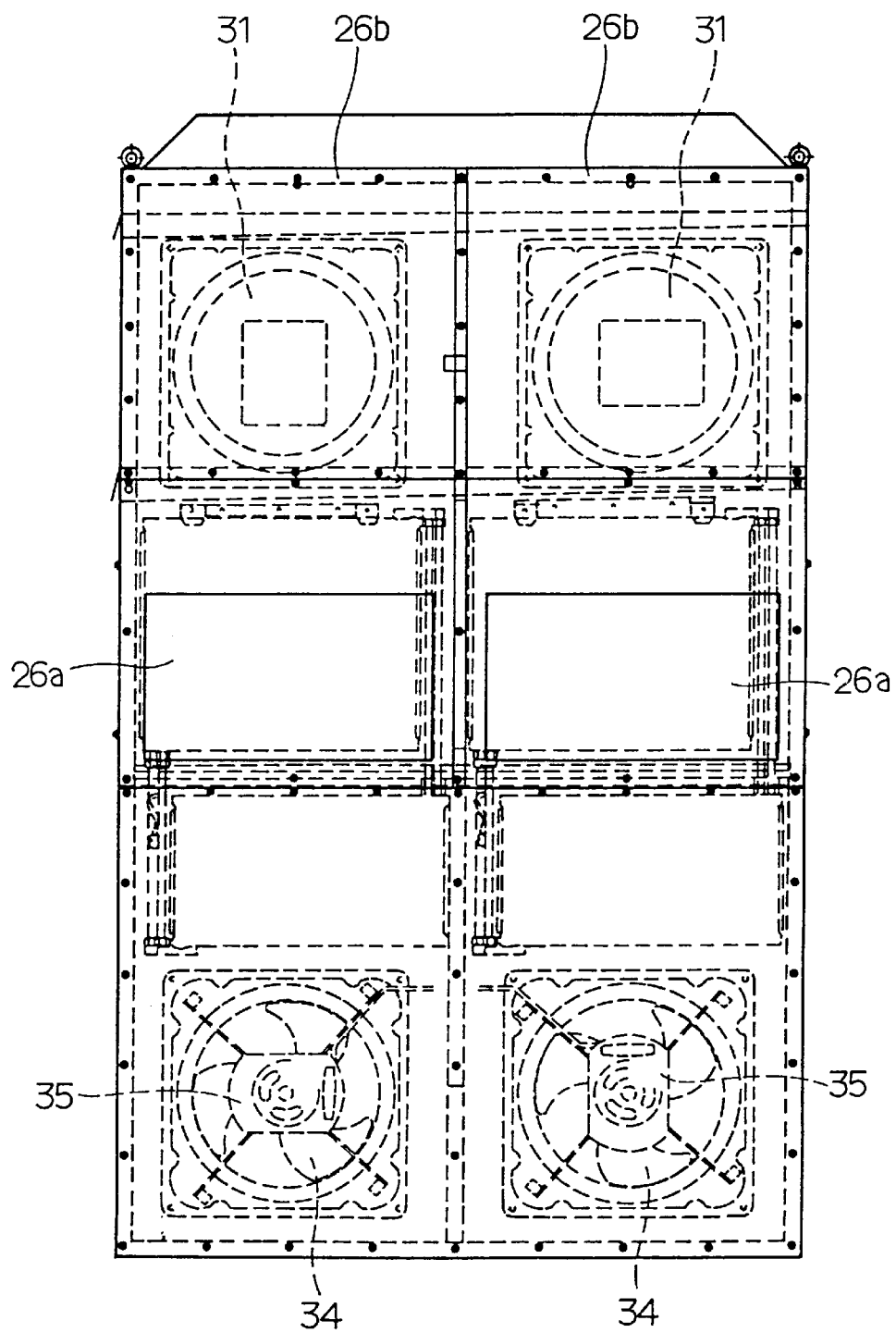
FIG. 20 is a side elevational view for showing the electronic equipment shown in FIG. 19 in the third embodiment.
Figure 21:
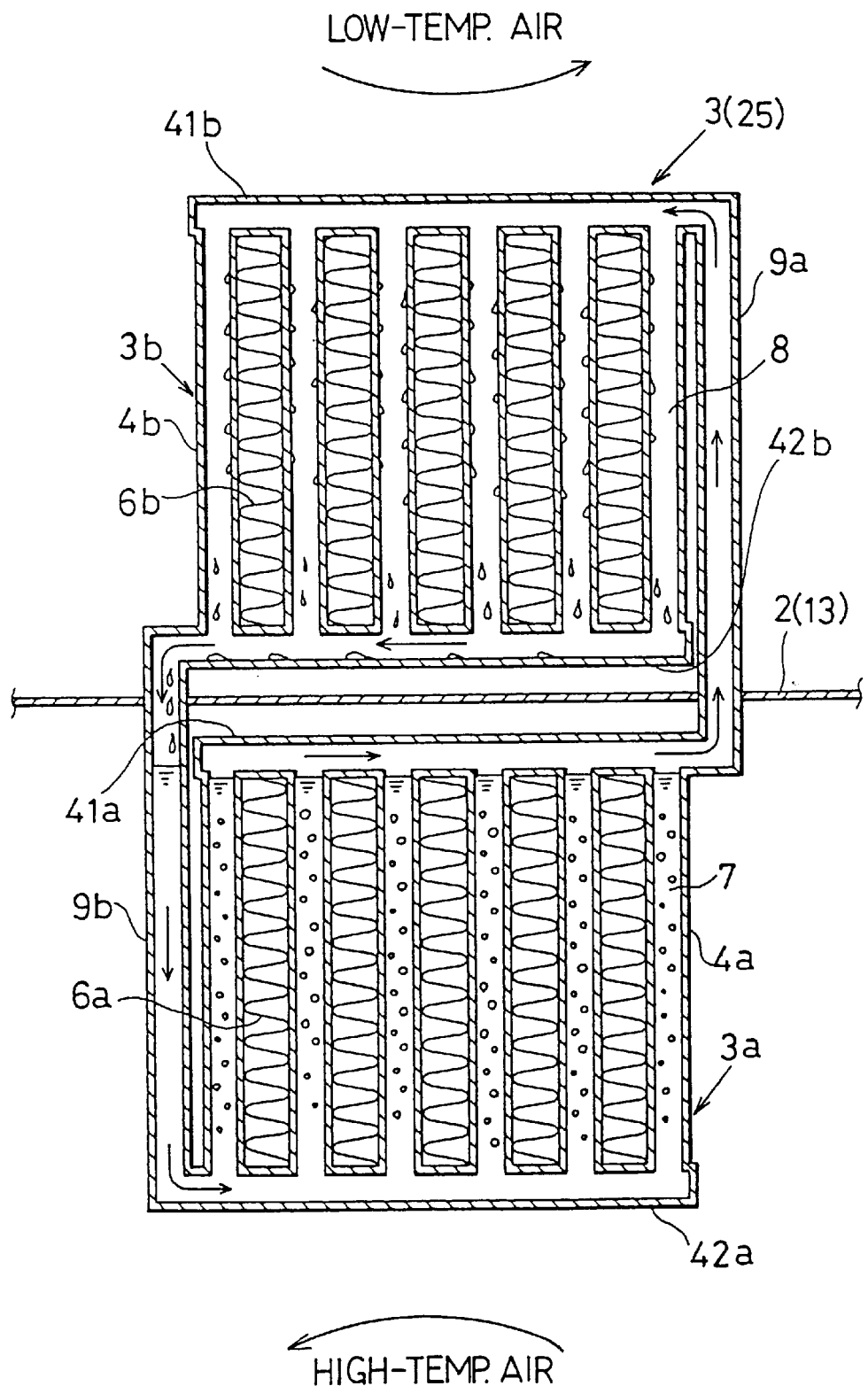
FIG. 21 is an illustrative view for showing the cooling device shown in FIG. 19 in the third embodiment.
Figure 22:
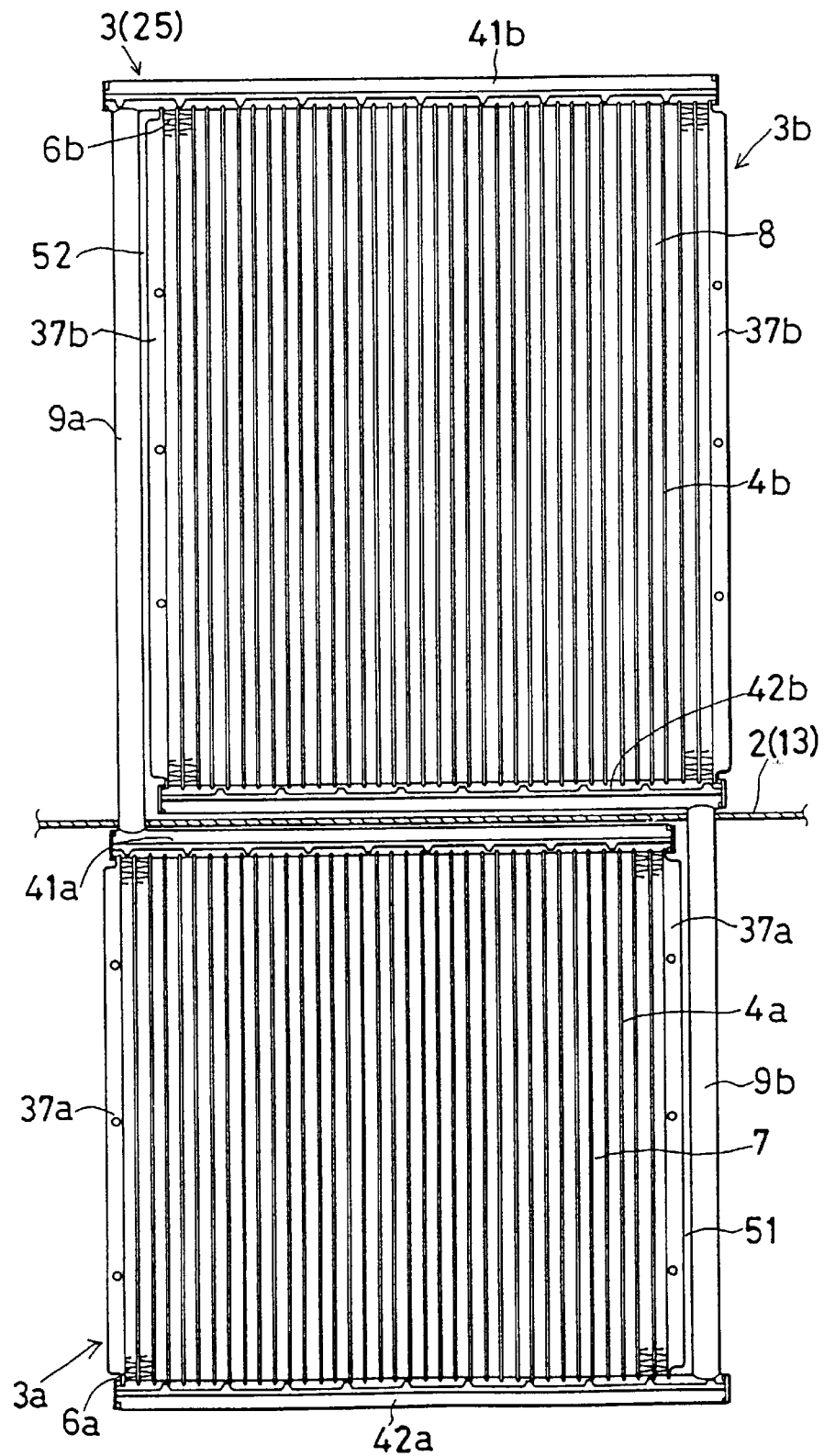
FIG. 22 is a front elevational view for showing a structure of the cooling shown in FIG. 21 in the third embodiment.

FIG. 19 is a side elevational view for showing a case in which the cooling unit 3 in the third embodiment is applied to a box-shaped cooling device, and FIG. 20 is a top plan view as viewed from an outside of FIG. 19, i.e., from a left side in the sheet. FIG. 21 is an illustrative view for showing the cooling device shown in FIG. 19, and FIG. 22 is a front elevational view of FIG. 21.

As shown in FIG. 19, the cooling unit 3 of this embodiment is installed in a housing 13 forming an electronic component part accommodating space 16 (hereinafter called as a accommodating space 16). Then, within the accommodating space 16 are accommodated the heat generating elements 11 and 12 composed of a transmitter or receiver such as communicating devices or the like and a power amplifier for driving the transmitter or receiver.

As shown in FIG. 19, each of the upper part and the lower part of the cooling unit 3 is provided with a high-temperature fluid suction duct 27a and a high-temperature fluid discharging duct 27b communicating with the accommodating space 16. In order to supply the gas contained in the accommodating space 16 into the high-temperature-side heat transfer space 17, the high-temperature fluid suction duct 27a is cooperatively disposed at the opening communicated with the upper part of the accommodating space 16. More specifically, the high-temperature heat transfer side space 17 extending in a vertical direction within the cooling unit 3 is formed by the side wall surface and the rear surface side defining plate 27, the upper end of the high-temperature-side heat transfer space 17 is opened toward the upper part (the part above the fluid separation plate 2) in the accommodating space 16 as the high-temperature fluid suction duct 27a.

With such an arrangement, since the gas heated by heat produced by the heat generating elements 11 and 12 is introduced from the high-temperature fluid suction duct 27a into the high-temperature-side heat transfer space 17 and further guided smoothly into the high-temperature-side heat exchanger 3a, it is possible to maintain the temperature in the accommodating space 16 at a uniform value. That is, since the gas of high temperature heated with heat produced by the heat generating members 11 and 12 ascends in the accommodating space 16 by convection, it is preferable to dispose the high-temperature fluid suction duct 27a at the upper part in the accommodating space 16 in order to cool the accommodating space 16 efficiently. In other words, when the high-temperature fluid suction duct 27a is located at a lower position than that of the fluid separation plate 2, comparatively low-temperature gas contained in the accommodating space 16 is introduced from the high-temperature fluid suction duct 27a into the high-temperature heat transfer space 17 and also guided to the high-temperature-side heat exchanger 3a, so that there is a possibility that a cooling efficiency in the accommodating space 16 is deteriorated.

Further, the entire cooling device is disposed in a state while being inclined in a forward or a rearward direction (a rightward or a leftward direction in FIG. 19) such that gas passing through each of the high-temperature-side heat exchanger 3a and the low-temperature-side heat exchanger 3b within the high-temperature-side heat transfer space 17 and the low-temperature-side heat transfer space 18 may flow smoothly from the high-temperature fluid suction duct 27a and the low-temperature fluid suction port 26a toward the high-temperature fluid discharging duct 27b and the low-temperature-side discharging port 26b, respectively. With such an arrangement, it is possible to slacken a variation in flowing direction of gas passing through the high-temperature-side heat exchanger 3a and the low-temperature-side heat exchanger 3b, so that a loss in the air passage within a narrow space can be reduced. As a result, a size of the lower side blower 34 in the accommodating space 16 (composed of a fan part 34, a motor part 35 which are hereinafter called as a lower side blower 34) can be reduced. Further, a heat generating amount of the lower side blower 34 can be reduced, so that the heat generating amount of the heat generating members 11 and 12 can be correspondingly increased. (That is, when the size of the lower side blower 34 is increased to increase its cooling capacity, a heat generating amount of the lower side blower 34 is also increased, resulting in that the heat generating amount of each of the heat generating members 11 and 12 may not be increased.)

As shown in FIGS. 19 and 20, the lower side blower 34 as the high-temperature-side blower is composed of an axial flow fan and further sucks the high-temperature air (high-temperature air acting as high-temperature fluid) introduced through the high-temperature-side suction duct 27a into each of the cooling pipes 4a of the high-temperature-side heat exchanger 3a (refer to FIG. 21). Then, the lower side blower 34 is inclined to be in parallel with the cooling pipe 4a of the high-temperature-side heat exchanger 3a. In this case, the lower side blower 34 may be inclined with respect to the cooling pipe 4a of the high-temperature-side heat exchanger 3a.

The upper side blower 31 as the low-temperature-side blower (the fan 31 and the motor 32 which are hereinafter defined as the upper side blower 31) is composed of an axial flow fan, and further sucks the low-temperature air (low-temperature air as low-temperature fluid) introduced through the low-temperature-side suction duct 26a into each of the cooling pipes 4b of the low-temperature-side heat exchanger 3b (refer to FIG. 21). Then, the upper side blower 31 is inclined with respect to the cooling pipe 4b of the low-temperature-side heat exchanger 3b and disposed in parallel with the outer wall plate 26. A discharging side of the upper side blower 31 is provided with the outer wall plate 26 for deflecting the air discharged out of the upper side blower 31 in an upward direction. Air blown from the upper side blower 31 passes through the low-temperature-side discharging port 26b opened at the upper surface of the cooling unit 3 by the outer wall plate 26 and is discharged out.

Each rotational speed and operating time of the lower side blower 34 and the upper side blower 31 are controlled by a controller 24 (not shown).

The controller 24 is for controlling the electrical devices such as the electric motors 32 for the two upper side blowers 21, the electric motors 35 for the two lower side blowers 34 and an electrical heater 23 or the like on the basis of a detection temperature in the closed space 15, detected by the temperature sensor 9 (not shown) composed of the thermosensitive elements such as a thermistor.

The controller 24 performs a Hi-operation (a large amount of air) or a Lo-operation (a small amount of air) of the two upper side blowers 31 and the two lower side blowers 34 when the temperature in the closed space 15 is not less than the low limit value (0° C., for example), and turns OFF the electrical heater 23. In this embodiment, the controller 24 operates two upper side blowers 31 and two lower side blowers 34 during a normal operation (day time) in which a temperature in the closed space 15 is not less than the lower limit temperature in such a manner that each of the air amount may become the same with the substantial same rotational speed. Then, at night time and mid-night, the rotational speed (relative to the normal operation) of at least one of the two upper side blowers 31 is decreased to reduce the air amount, the rotational speed of at least one of the two lower side blowers 34 is increased (relative to the normal operation) to increase the air amount. In this case, a determination for each of the day time, night time and mid-night can be performed by a clock (not shown) as time counting means, in which 7:00 to 18:00 is a day time, 18:00 to 21:00 is a night time and 21:00 to 7:00 is a mid-night, respectively, for example. A brightness is detected by a photo-electromotive force element (not shown) as optical amount measuring means (a solar cell, a photo-diode and a photo-transistor, for example) to determine the day time or night time. Then, it is also possible to combine the time counting means and the optical amount measuring means. With such an arrangement, it is possible to reduce noise of the upper side blower 31 at night time and mid-night in which noise when the upper side blower 31 is operated becomes a problem.

Further, the controller 24 turns OFF the electric motors 32 for the two upper side blowers 31, performs a Hi-operation (a large amount of air) or a Lo-operation (a small amount of air) of the electric motors 35 for the two lower side blowers 34 and turns ON the electric motor 23 when the temperature in the closed space 15 is not more than a lower limit temperature (0° C., for example).

At a side part of the low-temperature-side heat exchanger 3b of the cooling unit 3 shown in FIG. 19 is disposed a maintenance cover (indicated by a two-dotted line) for maintaining the low-temperature-side heat exchanger 3b. Since the low-temperature-side heat exchanger 3b introduces outside air, there is a possibility that the dust or trash or the like contained in the outside air are clogged between the cooling pipes 4b. However, by disposing the maintenance cover, it is possible to remove these obstacles easily. The maintenance cover is fixed to the cooling unit 3 during the operation and is removed during being cleaned.

In the box-shaped cooling device of this embodiment is constructed such that a plurality of cooling devices 25 shown in FIG. 21 are laminated in each of the directions of flowing of the high-temperature fluid and the low-temperature fluid.

As shown in FIGS. 21 and 22, the cooling device 25 includes the fluid separation plate 2 for separating the high-temperature fluid (for example, high-temperature air) and the low-temperature fluid (for example, low-temperature air); a high-temperature-side heat exchanger 3a composed of a plurality of cooling pipes 4a disposed at the high-temperature fluid side rather than the fluid separation plate 2; refrigerant sealed in the cooling pipes 4a, receiving heat from the high-temperature fluid, to be boiled and gasified; a pair of low-temperature-side communication pipe 9b and high-temperature-side communication pipe 9a, one of which being air-tightly communicated with the high-temperature-side heat exchanger 3a and the other passing through the fluid separation plate 2 and extended at the low-temperature fluid side; a low-temperature-side heat exchanger 3b air-tightly communicated with the other of the low-temperature-side communication pipe 9b and the high-temperature-side communication pipe 9a, disposed at the low-temperature-side fluid other than the fluid separation plate 2 and composed of a plurality of cooling pipes 4b; heat-receiving fins 6a connected in a state in which these are melted (for example, brazed state) between each of the cooling pipes 4b of the high-temperature-side heat exchanger 3a; radiating fins 6b connected while being melted between each of the cooling pipes 4b of the low-temperature-side heat exchanger 3b (for example, brazed state); and heat insulating materials (not shown) as heat transfer restricting means (for example, urethane-foam of foamed resin), embedded between the high-temperature-side heat exchanger 3a and the low-temperature-side communication pipe 9b and between the low-temperature-side heat exchanger 3b and the low-temperature-side communication pipe 9a, for restricting a heat transfer from the high-temperature-side heat exchanger 3a to the low-temperature-side communication pipe 9b and a heat transfer from the low-temperature-side heat exchanger 3b to the high-temperature-side communication pipe 9a.

The fluid separation plate 2 constitutes one wall surface of the housing 13 having a high-temperature inside, and is made of metallic material such as aluminum or the like and the plate is integrally connected (for example, by brazing) to the low-temperature-side communication pipe 9b and the high-temperature-side communication pipe 9a. The fluid spacer 2 is formed with a plurality of insertion holes through which the low-temperature-side communication pipe 9b and the high-temperature-side communication pipe 9a pass. Between the fluid separation plate 2 and each of the communication pipes, there may be provided resin such as rubber for restricting a heat transfer. Further, the fluid separation plate 2 may be thermally insulated from the circumference (at least one of the low-temperature fluid or the high-temperature fluid) with the thermal insulating material of foam resin such as urethane foam or the like.

The high-temperature-side heat exchanger 3a is composed of a plurality of cooling pipes 4a as tube members disposed substantially in parallel with each other; a high-temperature-side lower tank 42a disposed below the cooling pipes 4a and communicating with these cooling pipes 4a; and a high-temperature-side upper tank 41a communicating with these cooling pipes 4a at the upper part thereof. The cooling pipes 4a are constructed such that metallic material having a superior heat transfer characteristic (aluminum or copper, for example) is formed into a flat pipe having a cross section of an oval shape (or an elongated rectangular shape).

The cooling pipes 4a are flat pipes having an oval-shaped cross section and formed with a plurality of inner partition plates over a vertical direction therein (a substantial grid cross section). The cooling pipes 4a are constituted as porous pipes, an interior of which is divided into a plurality of small-passages. That is, the tubular members constituting the cooling pipes 4a are constructed such that the opposing two wall surfaces and a plurality of plate-like members contacting with the two wall surfaces therein are disposed, and small passages are enclosed by a plurality of plate-like members and the two wall surfaces. With such an arrangement, it is possible to improve a withstand pressure performance and an endothermic efficiency accompanied by an expansion of the contact surface area with the refrigerant or the like. Further, the cooling pipes 4a may easily be formed by an extruding process. It is preferable that a diameter of each of the small passages (the maximum diameter of each of the sides in the case that the small passage is of a rectangle, or the maximum diameter in the case that the small passage is of either a circle or an ellipse) is about 1 to $10^2$ times of a bubble diameter when the refrigerant is boiled and removed from the inner wall of the heat-absorbing pipe. In this embodiment, it is set in a range of 0.5 to 1 mm. The heat-absorbing pipe is disposed such that the small passage is opened in a vertical direction (from the high-temperature-side lower tank 42 toward the high-temperature-side upper tank 41a) and the small passages are piled up in such a direction as one in which the high-temperature fluid flows.

The low-temperature-side heat exchanger 3b is composed of a plurality of cooling pipes 4b disposed substantially in parallel with each other; a lower temperature-side lower tank 42b disposed below the cooling pipes 4b and communicating with these cooling pipes 4b at a lower position; and a low-temperature-side upper tank 41b disposed above the cooling pipes 4b and communicated with these cooling pipes 4b at an upper position. Each of the cooling pipes 4b is also formed into a flat pipe in which a metallic material having a superior heat transfer characteristic (aluminum or copper, for example) is formed to have an oval (or elongated rectangular) cross section. Each of the cooling pipes 4b is also constituted by the flat pipe in which a cross section thereof is oval, and a plurality of inner partition plates are formed in a vertical direction. With such an arrangement, it is possible to improve a withstand pressure performance and a radiating efficiency accompanied by an expansion of a contact surface area with the refrigerant or the like. This cooling pipe 4b may also be formed by the extruding process. This cooling pipe 4b is also disposed such that the small passage is opened toward a vertical direction (from the low-temperature-side lower tank 42b toward the low-temperature-side upper tank 41b), and the small passages are piled up in such a direction as one in which the low-temperature fluid flows.

The high-temperature-side communication pipe 9a is communicated with the high-temperature-side upper tank 41a of the high-temperature-side heat exchanger 3a and with the low-temperature-side upper tank 41b of the low-temperature-side heat exchanger 3b so as to discharge the refrigerant having been boiled and gasified by the high-temperature-side heat exchanger 3a. Then, the high-temperature-side communication pipe 9a is disposed every predetermined interval (preferably an interval larger than an interval between each of the heat-absorbing pipes 31b, more preferably an interval more than twice of the mutual interval) substantially in parallel with the heat-absorbing pipe 31b.

The low-temperature-side communication pipe 9b is communicated with the low-temperature-side lower tank 42b of the low-temperature-side heat exchanger 3b and with the high-temperature-side lower tank 42a of the high-temperature-side heat exchanger 3a so as to return the refrigerant having been cooled and liquefied by the low-temperature-side heat exchanger 3b. The low-temperature-side communication pipe 9b is disposed every predetermined interval (preferably an interval larger than an interval between each of the mutual radiating pipes 31a, and more preferably an interval more than twice of the mutual interval) substantially in parallel with the radiating pipe 31a.

The refrigerant is of HFC-134a (chemical formula: $CH_2FCF_3$) or water and the like, which is set to be boiled by high-temperature fluid within a range where an interior pressure of a container is not so high (for HFC-134a, for example, a pressure of several tenths air pressure), and is also set to be condensed by the low-temperature fluid. More specifically, the refrigerant is selected to be boiled at a temperature of 100° C. as the maximum temperature value or less. In this case, as the refrigerant, refrigerants of a plurality of substances may be mixed with each other, and mainly the refrigerant of single substance may be used. Further, the refrigerant is sealed in the high-temperature-side heat exchanger 3a in such a degree as one in which the liquid surface is coincided with a position of the fluid separation plate 2 during non-operating state or such a degree as one in which the liquid surface is placed in the heat-absorbing upper part communicating part 42. It is preferable that an amount of refrigerant is set such that the liquid surface does not reach the cooling pipe 4b during the operation. The refrigerant is sealed after the endothermic fins 6a and the radiating fins 6b are brazed to and connected to each of the cooling pipes 4a and the cooling pipes 4b.

The heat-receiving fins 6a are disposed between each of the cooling pipes 4a, the radiating fins 6b are disposed between each of the cooling pipes 4b. The heat-receiving fin 6a and the radiating fin 6b are corrugated fins in which a thin (a plate thickness: about 0.02 to 0.5 mm) metallic plate having a superior heat transfer characteristic (aluminum, for example) is alternatively folded to form a corrugated shape, wherein these fins 6a and 6b are brazed to the flat outer wall surfaces of the cooling pipe 4a and the cooling pipe 4b (i.e., these are connected while being melted). The heat-receiving fins 6a sufficiently transmits heat of the high-temperature fluid to refrigerant and also improves a strength of the cooling pipe 4a. Further, the radiating fins 6b sufficiently transmits heat of the refrigerant to the low-temperature fluid and also improves a strength of the cooling pipe 4b.

In this embodiment, a fin pitch P1 of the heat-receiving fin 6a disposed at the high-temperature-side heat exchanger 3a (in a range of 1.50 mm to 2.90 mm, for example, preferably in a range of 2.00 mm to 2.50 mm, and 2.40 mm is employed in this embodiment) is set to be smaller than a fin pitch P2 of the radiating fin 6b of the low-temperature-side heat exchanger 3b (in a range of 3.00 mm to 4.50 mm, for example, preferably in a range of 3.50 mm to 4.00 mm, and 3.75 mm is employed in this embodiment). That is, the cooling unit is set such that the fin pitch P1 of the heat-receiving fins 6a is lower than the fin pitch P2 of the radiating fins 6b by approximately 50% to 65%, for example.

An operation of the third embodiment will be described.

Upon operation of the device, the heating elements 11 and 12 generate heat, and the interior of the accommodating space 16 becomes a high temperature. The lower side blower 34 generates a circulation of hot air and introduces the high-temperature air into the high-temperature-side heat exchanger 3a. Refrigerant sealed into each of the cooling pipes 4a of the high-temperature-side heat exchanger 3a receives heat transmitted by high-temperature air through the heat-receiving fins 6a, is boiled and gasified. The gasified refrigerant vapor is condensed and liquefied at the inner wall surface of each of the cooling pipes 4b of the low-temperature-side heat exchanger 3b maintained at a low-temperature while being exposed to the low-temperature fluid, and the condensed latent heat is transmitted to the low-temperature air through the radiating fins 6b. The refrigerant condensed and liquefied by the low-temperature-side heat exchanger 3b drops along the inner wall surface by its own weight into the high-temperature-side lower tank 42a of the high-temperature-side heat exchanger 3a. In this case, the upper side blower 31 continues to introduce the low-temperature air from the outside into the low-temperature-side heat exchanger 3b. By repeating the boiling, condensing and liquefying of the refrigerant, it is possible to efficiently radiate the heat of the heat generating members 11 and 12 to the outside without mixing the high-temperature air with the low-temperature air.

A fin pitch of the heat-receiving fins 6a of the boiling portion 7 is smaller than that of the radiating fins of the condensing portion 8. With such an arrangement, when the flow volume of the high-temperature fluid is increased, a flow speed of fluid through the cooling pipe 4a is increased and a decreasing of time to transmit the heating amount of the high-temperature air to the heat-receiving fins 6a can be compensated.

As described in this embodiment, no convection flow of the vapor refrigerant and the condensed refrigerant is generated in the cooling device in which a circulation of the refrigerant is repeated to transfer heat from the high-temperature fluid to the low-temperature fluid, the boiling portion 7 receives heat of the high-temperature fluid, the boiled vapor refrigerant ascends in the high-temperature-side communication pipe 9a, reaches the condensing portion 8, radiates the heat to the low-temperature fluid in the condensing portion 8, the refrigerant is condensed and liquefied, the liquid refrigerant descends in the low-temperature-side communication pipe 9b and again the refrigerant returns back again to the boiling portion 7. Therefore, a heat resistance at the radiating wall surface becomes low as compared with that of the cooling device of the type shown in FIG. 9 in which the gaseous phase refrigerant and the liquid refrigerant flow back and forth in the same pipe. That is, in this embodiment, since a heat resistance at the wall surface of the condensing portion 8 becomes low as compared with a heat resistance at the wall surface of the boiling portion 7, it is preferable to reduce a heat resistance of the high-temperature-side heat exchanger 3a in order to improve a performance of the device. Thus, by increasing the flow volume of the high-temperature fluid, it is possible to reduce a heat resistance of the high-temperature-side heat exchanger 3a, resulting in that the performance of the device can be improved.

In this embodiment, as compared with a case in which a fin pitch at the high-temperature-side (inner air side) of the fluid separation plate 2 is the same as a fin pitch (outside air side) of the low-temperature-side, the fin pitch P1 of the high-temperature-side heat exchanger 3a is set to be lower than the fin pitch P2 of the low-temperature-side heat exchanger 3b while preventing a clogging of the low-temperature-side heat exchanger 3b. In this way, a cooling performance of the high-temperature air can be improved and an entire size of the cooling unit 3, and subsequently the entire size of the cooling device 14 can be reduced.

In this embodiment, there is provided the cooling device 14 having the cooling unit 325 having cooling units 3 connected circularly by the first and second two connection pipes 9a and 9b with the boiling portion 7 and the condensing portion 8 together in multi-stage in a flowing direction of air. With such an arrangement, a circulating flow of the refrigerant is generated in each of the cooling units 3 so as to prevent the refrigerant vapor (boiling vapor) and the refrigerant liquid (condensing liquid) from being struck against to each other, so that a radiating performance of each of the cooling units 3 by itself can be improved more than that of the second embodiment. By providing the cooling units 3 in multi-stage, it is possible to improve the radiating performance (cooling performance) of the cooling units 325 more than that of the second embodiment.

A fourth embodiment of the present invention will be described.

Since this configuration has the same cooling device as one shown in FIGS. 19 to 22 other than the controlling method of the controller 24, the description for the construction is omitted and the controlling method of the controller 24 will be mainly described.

The controlling method of this embodiment detects an inside temperature and an outside temperature of the housing 13 with an inside temperature sensor and an outside temperature sensor disposed inside and outside the housing 13 so as to control a lower side blower 34 for generating an inside circulation and an upper side blower 31 for generating an outside circulation as indicated in Table 2 in response to the detection temperature.

TABLE 2

| Outside temperature | High | Low | High | Low |
|---|---|---|---|---|
| Inside temperature | High | High | Low | Low |
| Air amount by upper side blower | 80 | 50 | 30 | 20 |
| Air amount by lower side blower | 100 | 80 | 50 | 40 |

In Table 2, each of the numerical values of each of the blowers indicates a volume in the case that the rotational speed when a rated voltage is applied is defined as 100. The numerical values can be changed by a PWM control for controlling a wave height value of the applied voltage or a pulse width.

The most noticeable point is that an air amount (the rotational speed) of the upper side blower is set to be lower than an air amount (the rotational speed) of the lower side blower. With such an arrangement, it is possible to reduce noise when the upper side blower 31 is operated.

In the second to fourth embodiments, the rotational speed (an air amount) of each of the blowers is changed in response to a time, a brightness and an inside or outside temperature; however, each of the rotational speed is maintained constant and the air amount (rotational speed) of the upper side blower may be set to be lower than that of the air amount (rotational speed) of the lower side blower.

Further, in the second to fourth embodiments, as the cooling unit 3, the high-temperature-side heat exchanger 3a and the low-temperature-side heat exchanger 3b, there has been employed a corrugate-fin-tube type multi-flow-path type heat exchanger; however, there may be employed a plate-fin-tube type heat exchanger, a fine pin fin-tube type heat exchanger, a serpentine type heat exchanger having a flat tube (tube) bent and formed in a zig-zag shape and a drawn-cup type heat exchanger having cooling pipes with two forming plates adhered to each other laminated in multi-stages as the cooling unit 3, the high-temperature-side heat exchanger 3a and the low-temperature-side heat exchanger 3b. Either slit fin or louver fin may also be employed as the heat-receiving fins 6a or the radiating fins 6b.

Further, as the inside air of the housing 13 and the high-temperature air (inside air) as the inside fluid of the casing, high-temperature gas such as high-temperature air, temperature of which is increased by the heater elements such as electronic component parts 11 and 12 or the like, has been employed; however, as the high-temperature fluid, cooling water for cooling the heat generating elements such as electronic component parts 11 and 12 or high-temperature liquid such as oil (including operation oil or lubricant oil or the like) may also be employed. Similarly, not only the low-temperature gas such as low-temperature air or the like but also the low-temperature liquid such as water or oil may be used as outside air of the housing 13 and the outside fluid (outer air) of the outer fluid of the casing. In these cases, as means for generating a circulation of the inner fluid of the casing or a circulation of the outside fluid of the casing, a pump may be employed. Further, as driving means for driving a pump or the centrifugal fans 31, 34, not only the electric motors 32, 35 of these embodiments but also an internal combustion engine, a water mill and a wind mill or the like may be employed.

An fifth embodiment of the present invention will be described.

Figure 23:
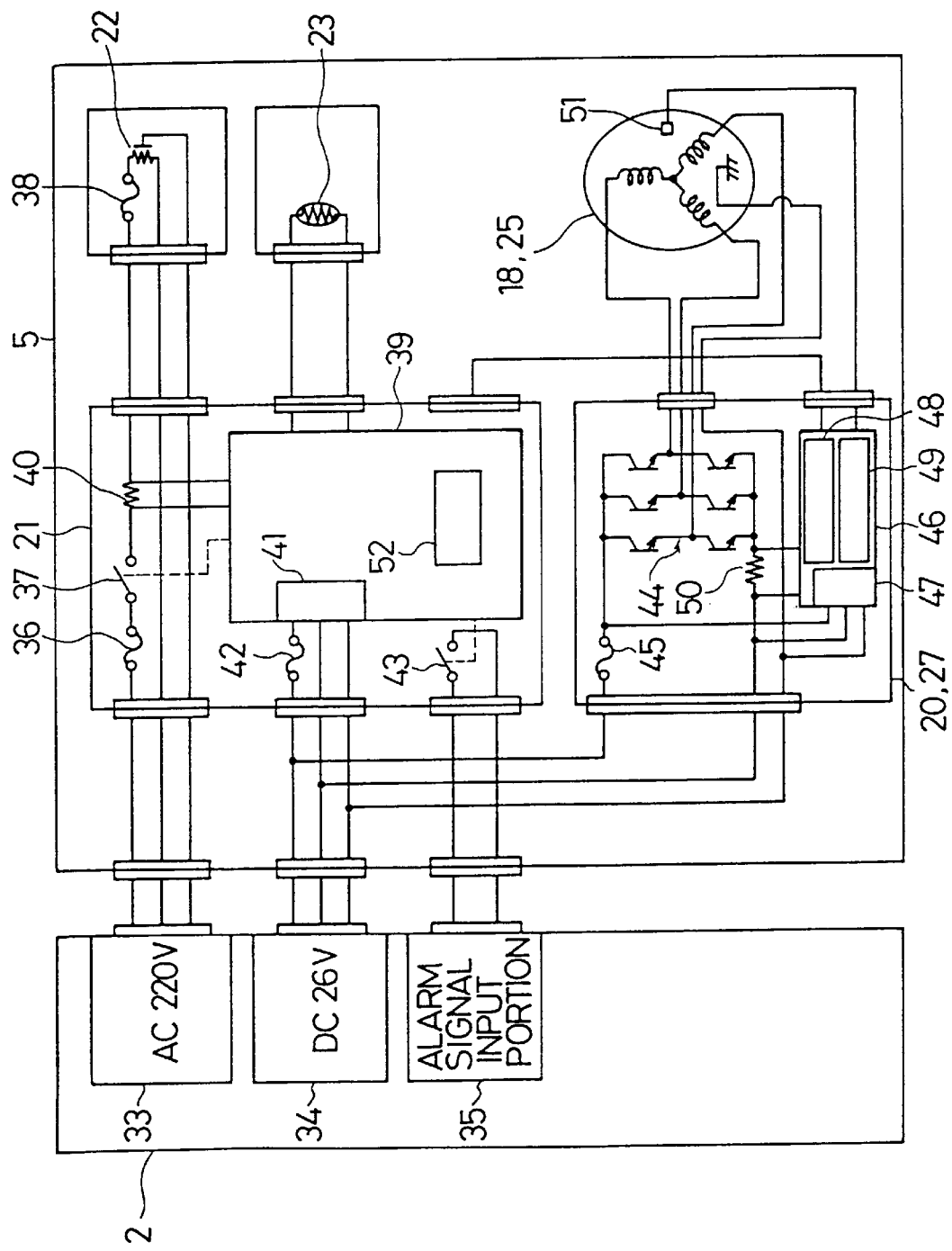
FIG. 23 is a schematic diagram showing an electrical configuration according to a fifth embodiment of the present invention.
Figure 24:
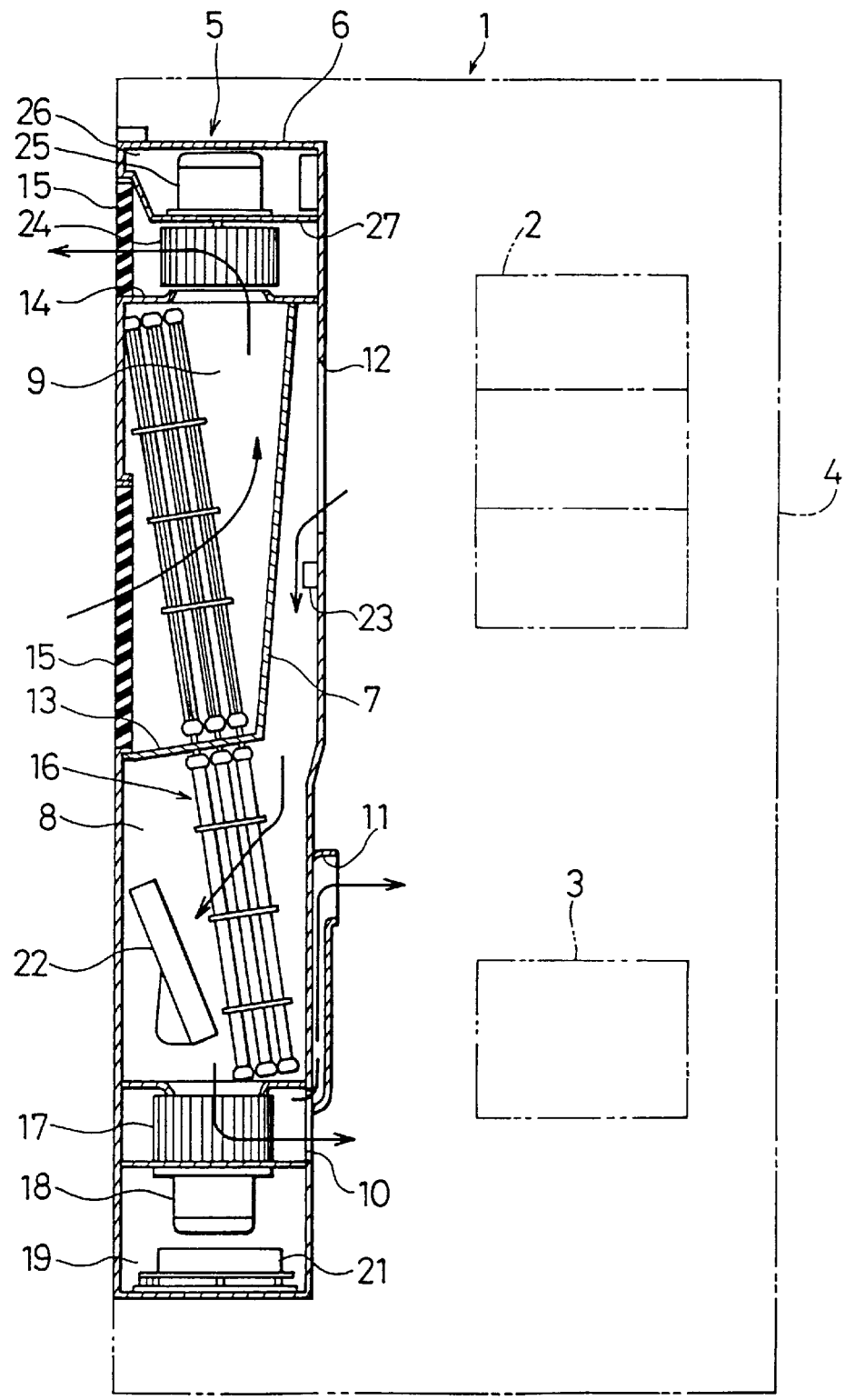
FIG. 24 is a vertical cross sectional view of a cooling device in the fifth embodiment.

FIG. 23 shows a cross section of an entire structure of an electronic system 1. In FIG. 24, the electronic system 1 is, for example, a radio base station of a mobile radiotelephone such as cordless telephone or car telephone and includes a housing 4 and a cooling device 5 for air-tightly sealing a front opening of the housing 4, through which an electronic device 2 and a power supply 3 are incorporated in the housing.

Figure 25:
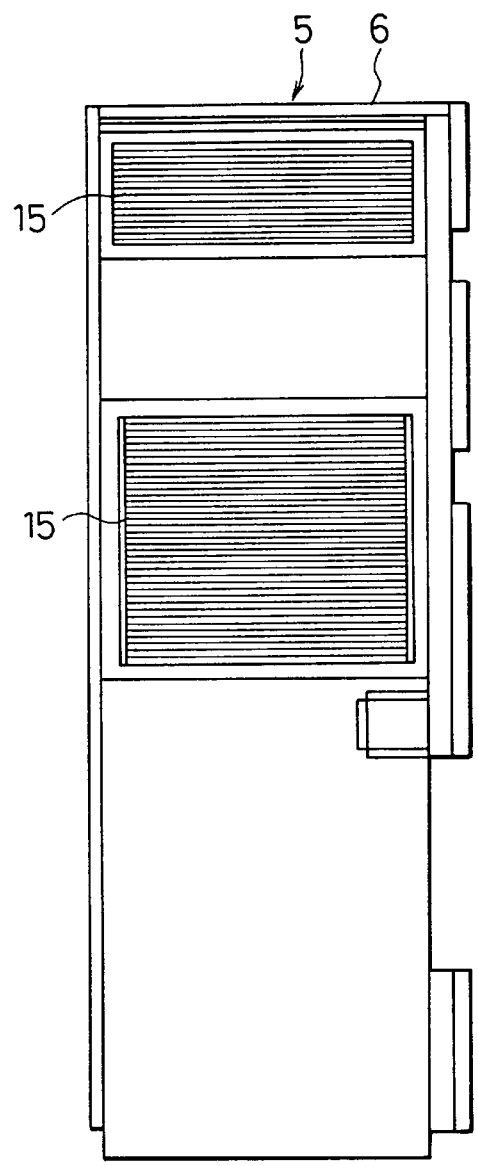
FIG. 25 is a front view of the cooling device in the fifth embodiment.

The cooling device 5 will be described below with reference to FIGS. 25 and 26. FIG. 25 is a front view of the cooling device, and FIG. 26 is a rear view.

An interior of a system body 6 is separated into a high-temperature space 8 and a low-temperature space 9 by means of a fluid separation plate 7.

Figure 26:
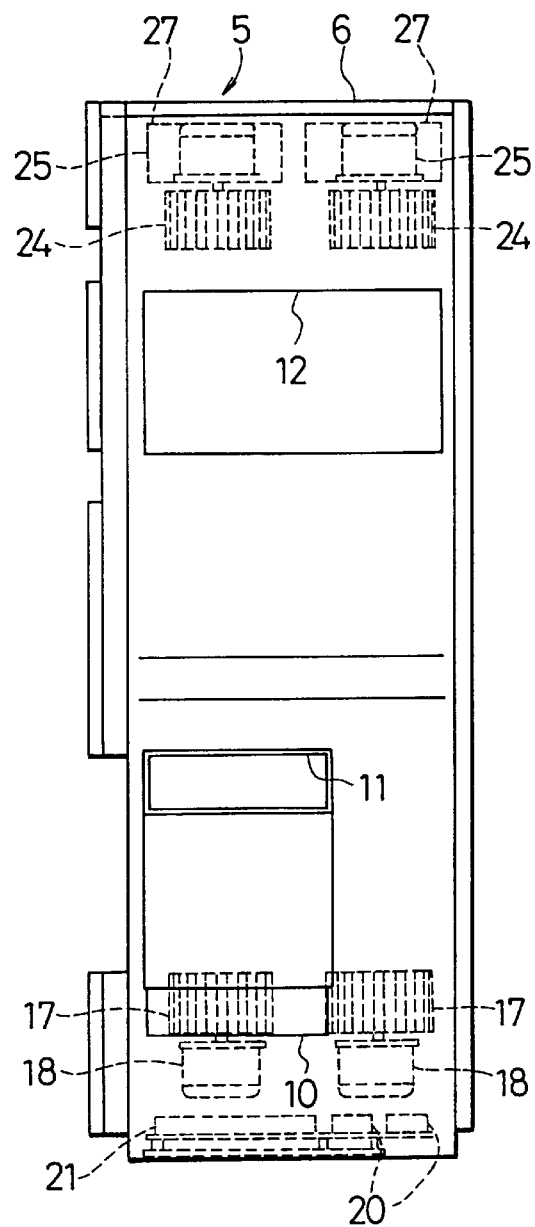
FIG. 26 is a rear view of the cooling device in the fifth embodiment.

The high-temperature space 8 communicates with the interior of the housing 4 through an exhaust port 10 and an exhaust duct 11 both formed on the rear side of the device body 6 and also through an intake port 12 (see FIG. 26). The low-temperature space 9 communicates with the outside through an intake port 13 and an exhaust port 14 both formed on the front side of the device body 6. A louver 15 (see FIG. 25) is mounted to each of the intake port 13 and the exhaust port 14 to prevent the entry of comparatively large foreign materials or rain droplets into the device body 6.

A heat exchanger 16 is disposed to pass through the fluid separation plate 7. A lower half portion of the heat exchanger 16 is positioned in the high-temperature space 8 and is exposed to the interior of the housing 4, while an upper half portion thereof is positioned in the low-temperature space 9 and is exposed to the outside air.

Two low-temperature-side fans (Scirocco fans) 17 are disposed side by side on the bottom of the high-temperature space 8, and low-temperature-side fan motors 18 for rotating the low-temperature-side fans 17 are disposed in a machine room 19. Drivers 20 and a control unit 21 (see FIG. 26) are also disposed in the machine room 19 to control the rotation of the low-temperature-side fan motors 18. When the low-temperature-side fan motors 18 are driven by the drivers 20, a circulation air passage (indicated with arrow in FIG. 24) is formed between the high-temperature space 8 and the housing 4 by the high-temperature-side fans 17. Further, an electric heater 22 is disposed in the high-temperature space 8 and heats the air passing through the space 8 when electrified.

In the high-temperature space 8, a temperature sensor 23 is disposed in the vicinity of the intake port 12 to detect the temperature of air which enters the high-temperature space 8 through the intake port 12.

On an upper surface of the low-temperature space 9 are disposed two low-temperature-side fans (Scirocco fans) 24 side by side, and low-temperature-side fan motors 25 for rotating the low-temperature-side fans 24 are disposed in a machine chamber 26. In the machine chamber 26 are also disposed drivers 27 as the rotation control means for controlling the rotation of the low-temperature-side fan motors 25. When the fan motors 25 are driven by the drivers 27, an outside air inflow path (indicated with arrow in FIG. 24) to the low-temperature space 9 is formed by the low-temperature-side fans 24.

The heat exchanger 16 disposed to pass through the fluid separation plate 7 will be described.

Figure 27:
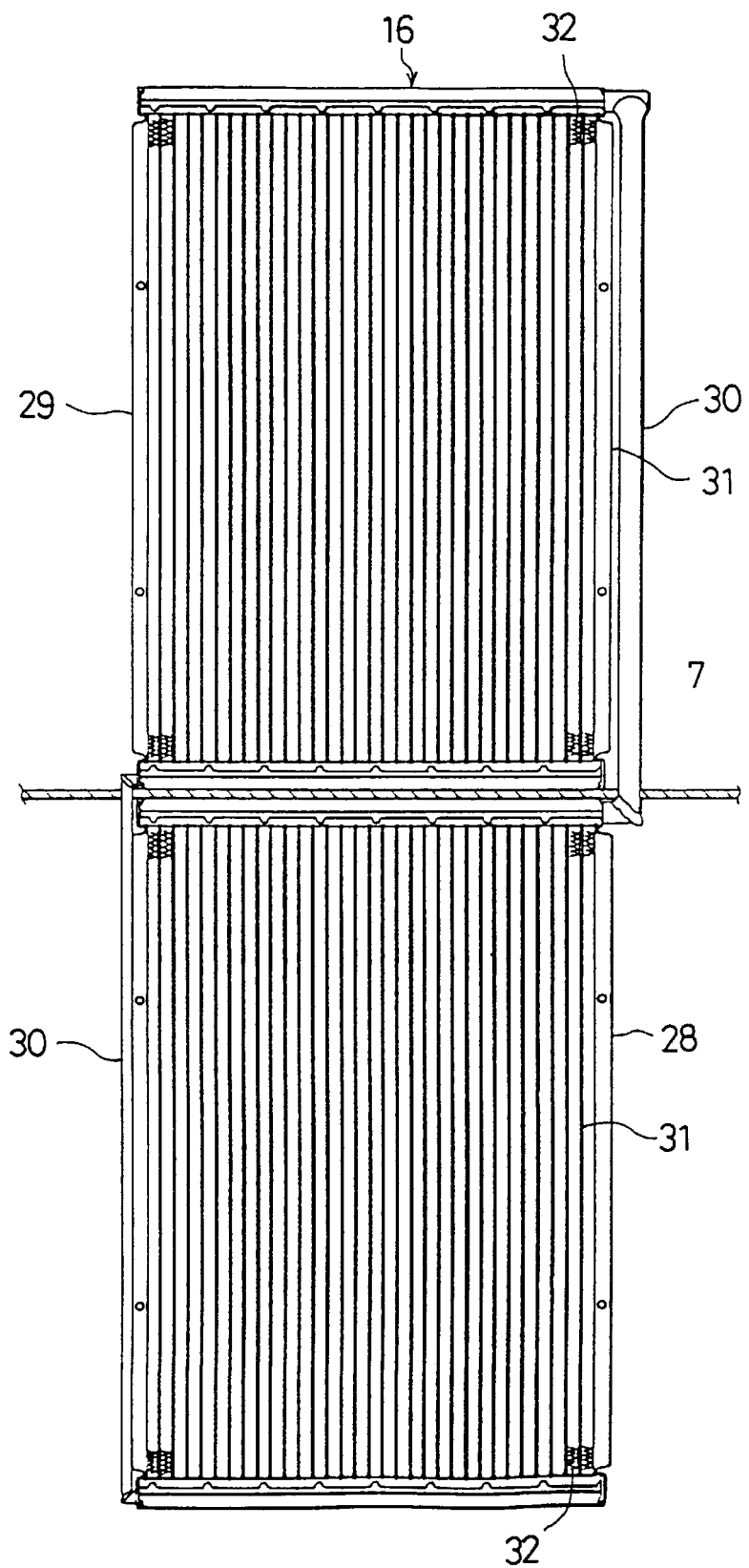
FIG. 27 is a front view of a heat exchanger in the fifth embodiment.
Figure 28:
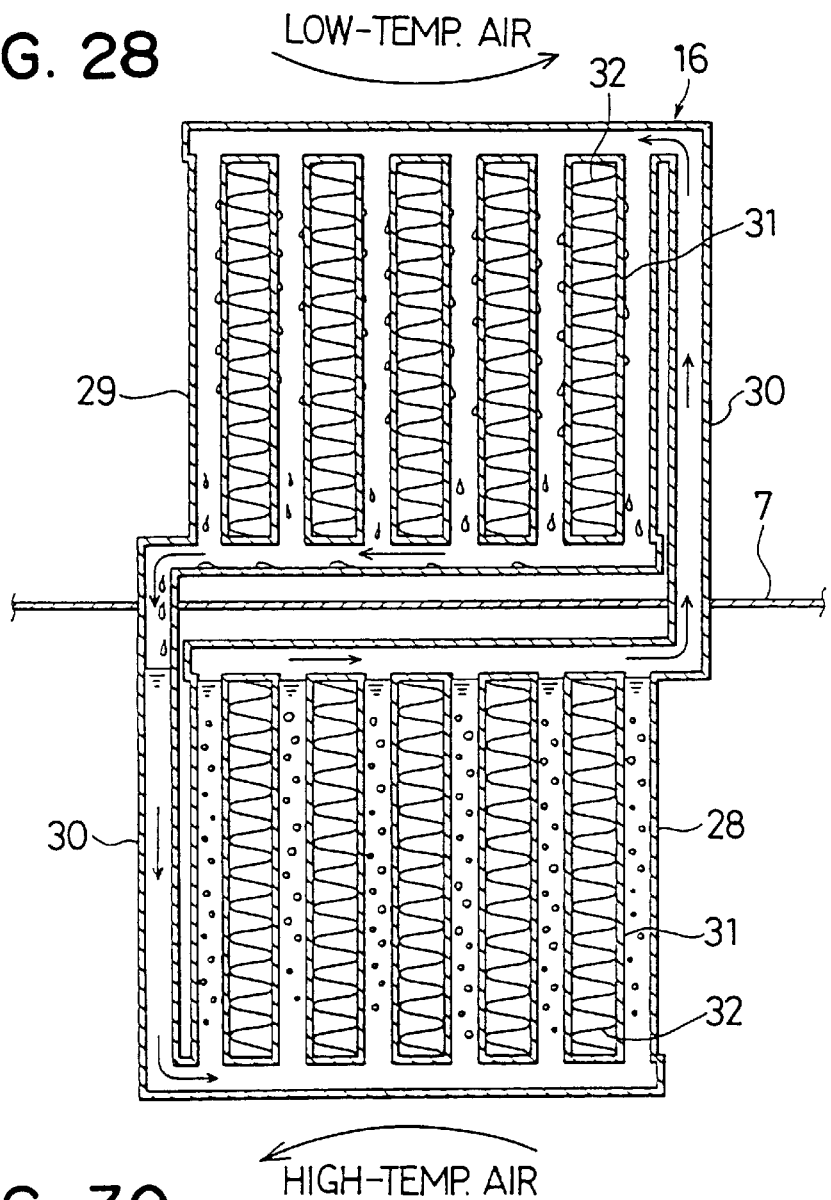
FIG. 28 is a schematic diagram showing a cross section of the heat exchanger in the fifth embodiment.

FIG. 27 is a front view of the heat exchanger 16, and FIG. 28 is a schematic cross sectional view thereof. In these figures, the heat exchanger 16 is divided into two sections which are a high-temperature-side heat exchanger portion 28 positioned in the high-temperature space 8 and a low-temperature-side heat exchanger portion 29 positioned in the low-temperature space 9. The heat exchanger portions 28 and 29 are connected to each other through connecting pipes 30. A chlorofluorocarbon type or freon type refrigerant is sealed in a nearly full condition into the high-temperature-side heat exchanger portion 28. Since the heat exchanger portion 28 is positioned in the high-temperature space 8 separated from the exterior, it is not exposed to the outside air containing foreign materials such as dust and moisture.

The high- and low-temperature-side heat exchanger portions 28 and 29 are constituted in the shape of a multiple flow path wherein a plurality of cooling tubes 31 of a rectangular cross section are connected to each other with corrugated fins 32, so that air passes through the corrugated fins 32.

FIG. 23 schematically illustrates an entire electrical construction. In the same figure, the electronic device 2 disposed in the housing 4 constitute a system in a radio base station and is provided with an AC 220 V power supply 33, a DC 26 V power supply 34, and an alarm signal input portion 35. These are connected to the control unit 21 in the cooling device 5.

The control unit 21 has a fuse 36 and a relay 37. The AC 220 V power supply 33 in the electronic devices 2 and the electric heater 22 disposed in the high-temperature space 8 are connected to each other through the fuse 36 and the relay 37. A thermal fuse 38 is connected to the electric heater 22 such that, when an electric current larger than the rated current of the electric heater 22 flows through the heater, the fuse becomes blown out to cut off the power supply. In this case, a control portion 39 as the trouble judging means turns ON the relay 37 in accordance with the result of detection provided from the temperature sensor 23 which detects the temperature of the high-temperature space 8, thereby connecting the AC 220 V power supply 33 to the electric heater 22. In the control portion 39, a current sensor 40 is wound round a wire leading to the electric heater 22, and the electric current supplied to the heater 22 is detected by the current sensor 40, thereby detecting a trouble in the current supply.

The control portion 39 has a power supply 41, to which is connected the DC 26 V power supply 34 of the electronic device 2 through a fuse 42.

The control unit 21 has a relay 43 which is turned on and off by the control portion 39. Terminals of an alarm signal input portion 35 of the electronic device 2 are connected to each other through the relay 43.

On the other hand, the drivers 20 and 27 for driving the fan motors each incorporate an inverter portion 44 therein, and the DC 26 V power supply 34 of the electronic device 2 is connected to the inverter portion 44 through a fuse 45. A control portion 46 of each of the drivers 20 and 27 controls the electric current to be supplied to each of the fan motors 18 and 25 through the inverter portion 44 in accordance with a command provided from the control unit 21, thereby rotating the fan motors 18 and 25 to rotate at a set speed. The control portion 46 has a power supply 47.

The control portion 46 of each driver 27 has a load trouble detecting portion 48 as the load trouble detecting means and a speed trouble detecting portion 49 as the speed trouble detecting means. The load trouble detecting portion 48 detects the electric current supplied to the cooling fan motor 25, using a current sensor 50 connected to the wiring of the inverter portion 44. Further, the load trouble detecting portion 48 calculates the total of the supplied current values for a certain time period as a load on the fan motor 25 and, when this load deviates from a set range, informs it to the control portion 39. The speed trouble detecting portion 49 detects the rotational speed of the cooling fan motor 25 and hence that of the cooling fan 24 on the basis of a detected rotation angle signal provided from a Hall element attached to the fan motor 25 and, when the detection rotation speed is outside a set range, informs it to the control portion 39.

The control portion 39 of the control unit 21 has a trouble alarm portion 52 as the trouble alarm means and includes a plurality of LEDs. On the basis of the trouble informed from the driver 27, the control portion 38 checks the contents of the trouble and lights an LED corresponding to the trouble in the trouble alarm portion 52.

An operation of the cooling device constructed as above will be described below.

When the system starts, the electronic device 2 operates and the electronic system 1 functions as a radio base station. As a result, the electronic device 2 generates heat and hence the temperature in the housing 4 rises.

On the other hand, since the control portion 39 of the cooling device 5 drives the high-temperature-side fan motors 18 when the system is started, a circulation passage is formed through the high-temperature space 8 and through the interior of the housing 4, so that the internal temperature of the housing 4 is made uniform.

At that time, the refrigerant present within the high-temperature-side heat exchanger portion 28 of the heat exchanger 16 absorbs heat in the housing 4. Then, the refrigerant boils and moves to the low-temperature-side heat exchanger portion 29, in which the refrigerant radiates heat. The refrigerant is condensed into droplets and drop into the high-temperature-side heat exchanger portion 28. In this way, there is performed heat exchange between the high and low-temperature-side heat exchanger portions 28 and 29.

Using the temperature sensor 23, the control portion 39 of the control unit 21 monitors the internal temperature of the housing 4, and when the temperature detected by the temperature sensor 23 has exceeded a set level, the control portion 39 drives the low-temperature-side fan motors 25, so that the low-temperature-side heat exchanger portion 29 of the heat exchanger 16 is cooled with the outside air and thus the heat radiating efficiency is improved. As a result, the cooling efficiency by the heat exchanger 16 is improved and the temperature in the housing 4 drops.

When the temperature in the housing 4 has dropped to be lower than the set level, the control portion 39 stops the operation of the low-temperature-side fan motors 25, so that the heat radiating efficiency of the low-temperature-side heat exchanger portion 29 in the heat exchanger 16 decreases. As a result, the cooling efficiency by the heat exchanger 16 decreases and the temperature in the housing 4 increases.

Through the above operations, the temperature in the housing 4 is controlled to be equal to the set temperature.

When the temperature of the outside air has dropped excessively and the temperature in the housing 4 has become lower than the set temperature range, the control portion 39 supplies an electric current to the electric heater 22 to operate the high-temperature-side fan motors 18. In this way, the temperature in the housing 4 is prevented from dropping excessively.

The outside air passes through the low-temperature-side heat exchanger portion 29 in the heat exchanger 16; and therefore, as the operation time of the cooling device 5 becomes long, dust is deposited on the heat exchanger portion 29, thus causing a problem that the heat exchanger portion 29 is clogged and the cooling efficiency of the heat exchanger 16 is deteriorated. Further, when any trouble occurs in a low-temperature-side fan motor 25, the electric current supplied to the fan motor 25 may increase abnormally even if the amount of air blown by the low-temperature-side fan 24 is normal, or the rotational speed of the fan 24 may decrease and the cooling efficiency of the heat exchanger 16 is deteriorated. Further, in the event of failure of a driver 27 for controlling the rotation of the low-temperature-side fan motor 25, the rotational speed of the low-temperature-side fan may become abnormal, or the supply of an electric current in the fan motor 25 may become abnormal.

In this embodiment, the control portion 39 of the control unit 21 checks the contents of a trouble upon occurrence, then alarms the occurrence of the trouble to the outside, and turns ON the relay 43 to inform the electronic device 2 of the occurrence of the trouble.

More specifically, the load trouble detecting portion 48 of each driver 27 monitors the electric current supplied to the low-temperature-side fan motor 25, sums up the supplied current values at every certain time to checks whether the load thus obtained is within, above, or below, a set range, and informs the result of the determination to the control unit 21.

The speed trouble detecting portion 49 of each driver 27 monitors the rotational speed of the low-temperature-side fan motor 25, determines whether the rotational speed is within, above, or below, a set range, and informs the result of the determination to the control unit 21.

Upon receipt of information from the driver 27, the control portion 39 of the control unit 21 checks the contents of the trouble in accordance with the flow chart of FIG. 29.

(1) Normal Operation

When the load on the low-temperature-side fan motor 25 is within the set range and the rotational speed of the low-temperature-side fan 24 is within the set range, (YES in steps S1 and S2), the control portion 39 determines that the operating condition is normal (step S3).

(2) Clogging (of the Heat Exchanger)

When the load on the low-temperature-side fan motor 25 is below the set range and the rotational speed of the low-temperature-side fan 24 is within the set range, (NO in step S5 and YES in step S11), the control portion 39 determines that clogging occurs (step S12). This is because, when the outside air flow path is clogged, the load becomes smaller in view of characteristics of the Scirocco fan and therefore the electric current supplied to the low-temperature-side fan motor 25 decreases under the condition that the fan motor 25 is controlled so as to rotate at the set speed.

Figure 30:
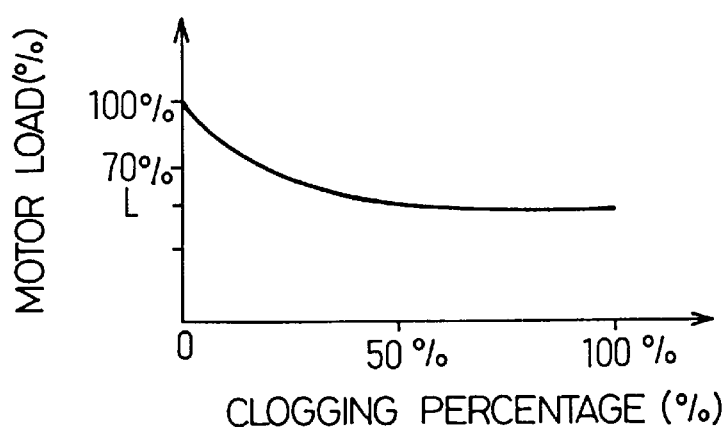
FIG. 30 is a diagram showing a relationship between clogging percentage and a motor load in the fifth embodiment.

FIG. 30 shows a relationship between clogging percent and fan motor load.

(3) Failure Caused by an External Factor on the Low-temperature-side Fan Motor 25

When the load on the low-temperature-side fan motor 25 is above the set range and the rotational speed of the low-temperature-side fan 24 is within the set range, (YES in steps S5 and S6), the control portion 39 determines that a failure occurs due to an external factor (step S7). This is because, for example when the bearing of the low-temperature-side fan motor 25 becomes rusty, the load on the fan motor 25 becomes large and therefore the electric current supplied to the motor 25 increases under the condition that the fan motor 25 is controlled so as to rotate at the set speed.

(4) Failure Caused by an Internal Factor in the Low-temperature-side Fan Motor 25

When the load on the low-temperature-side fan motor 25 is above the set range and the rotational speed of the low-temperature-side fan 24 is below the set range, (YES in step S5 and NO in step S8), the control portion 39 determines that a failure occurs due to an internal factor in the fan motor 25 (step S10). For example, when the bearing of the fan motor 25 is damaged, the rotational speed of the fan motor 25 does not increase even if the motor 25 is controlled so as to rotate at a constant speed and the driver 27 increases the supplied electric current for increasing the rotational speed up to the set speed.

(5) Failure of the Driver 27

When the load on the low-temperature-side fan motor 25 is within the set range and the rotational speed of the low-temperature-side fan 24 is outside the set range, (YES in step S1 and NO in step S2), the control portion 39 determines that the driver 27 is out of order (step S4). This is because, when the driver 27 is in normal condition, the rotational speed of the low-temperature-side fan 24 is surely controlled within the set range as long as the load on the low-temperature-side fan motor 25 is within the set range.

When the load on the fan motor 25 is above the set range and the rotational speed of the fan 24 is above the set range, (YES in steps S5 and S8), the control portion 39 determines that the driver 27 is out of order (step S9). That is, when the driver 27 is in normal condition, the rotational speed of the low-temperature-side fan 4 is controlled within the set speed range not to exceeds the range.

Further, when the load on the low-temperature-side fan motor 25 is below the set range and the rotational speed of the low-temperature-side fan 24 is outside the set range (NO in steps S5 and S11), the control portion 39 determines that the driver 27 is out of order (step S13). This is because, when the driver 27 is in normal condition and when the rotational speed of the fan 24 has decreased, the control portion 39 makes control so as to increase the electric current supplied to the fan motor 25.

Through the above operations of the control portion 39 the contents of each trouble are checked on the basis of both speed of the low-temperature-side fan 24 and load on the low-temperature-side fan motor 25, as shown in Table 3.

TABLE 3

| Fan speed | Fan Motor Load | State |
| --- | --- | --- |
| Normal (fixed) | Normal (fixed) | Normal |
| Normal (fixed) | Decrease | Clogging (of heat exchanger fin) |
| Normal (fixed) | Increase | Trouble due to external factor |
| Low-speed abnormal | Increase | Trouble due to internal factor of motor |
| Abnormal | Normal (fixed) | Driver trouble |
| High-speed abnormal | Increase | driver trouble |
| Abnormal | Decrease | Driver trouble |

When the control portion 39 of the control unit 21 determines that a trouble occurs in a manner described above, the control portion 39 lights the LED corresponding to the contents of the trouble in the trouble alarm portion 52, to inform the user of the occurrence of the trouble.

Further, upon determining the occurrence of a trouble, the control portion 39 turns ON the relay 43, to inform the alarm signal input portion 35 of the electronic device 2 that a trouble has occurred.

When the current sensor 40 should fail to detect any electric current upon turning ON of the relay 37 for the supply of an electric current to the electric heater 22, the control portion 39 lights the corresponding LED in the trouble alarm portion 52 and turns ON the relay 43, to inform the electronic device that a trouble has occurred.

Also when the temperature detected by the thermistor 23 has reached a level not lower than 70° C. or not higher than 0° C., the control portion 39 lights the corresponding LED in the trouble alarm portion 52 and turns ON the relay 43, to inform the electronic device 2 of the occurrence of a trouble.

When the alarm signal input portion 35 receives a trouble alarm signal from the cooling device 5, the electronic device 2 informs the base station of the occurrence of a trouble through a telephone line.

When a maintaining worker in charge is informed of the occurrence of a trouble through a telephone line, the worker checks the contents of the trouble on the basis of the state of lighting of the LED in the trouble alarm portion 52 which is provided in the control unit 21 of the cooling device 5, and handles the trouble.

In the case where the trouble is clogging, the worker cleans the heat exchanger 16 or rotates the low-temperature-side fan motor 25 in the reverse direction to solve clogging. If the trouble is induced by an external factor on the low-temperature-side fan motor 25, the motor 25 is repaired or replaced. If the trouble is caused by an internal factor in the low-temperature-side fan motor 25, the motor 25 is replaced. Further, if the trouble is a failure of the driver 27, the driver 27 is replaced.

According to the above construction, when it is detected by the driver 27 that the load on the low-temperature-side fan motor 25 has deviated from the set range and that the rotational speed of the low-temperature-side fan 24 has deviated from the set range, the control portion 39 checks the contents of the trouble on the basis of the result of the detection by the driver 27 and then alarms the contents of the trouble in the trouble alarm portion 52. Therefore, in comparison with the prior art in which a fuse is merely blown out upon increase in the load current of the fan motor or the supply of an electric current to the electronic device is stopped upon increase in the internal temperature of the housing, it is possible to handle quickly and appropriately the trouble by checking the contents of the trouble on the basis of the state of lighting of the corresponding LED in the trouble alarm portion 52 of the control unit 21.

The present invention is not limited to the above embodiment, but may be modified as follows.

The heat exchanger may be of a heat pipe type.

As the high-temperature fluid, there may be employed cooling water or oil for cooling the electronic device 2.

The contents of a trouble may be outputted to the electronic device 2 from the control unit 21 in the cooling device 5.

As the trouble alarm means, there may be employed a display device for displaying a message or a voice for alarm.

A sixth embodiment of the present invention will be described.

Figure 42:
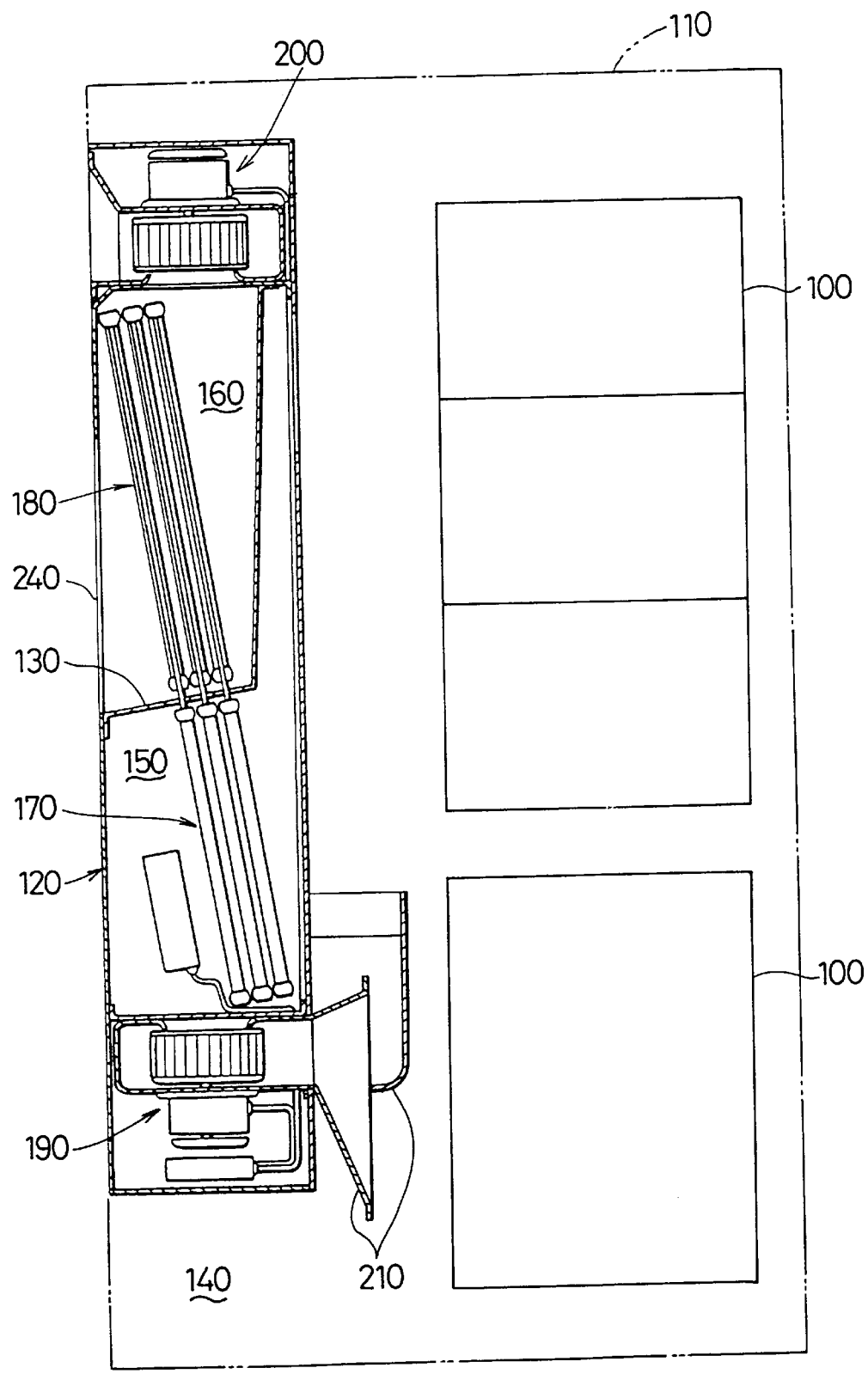
FIG. 42 is an entire cross sectional view of a cooling device in a related art.
Figure 45:
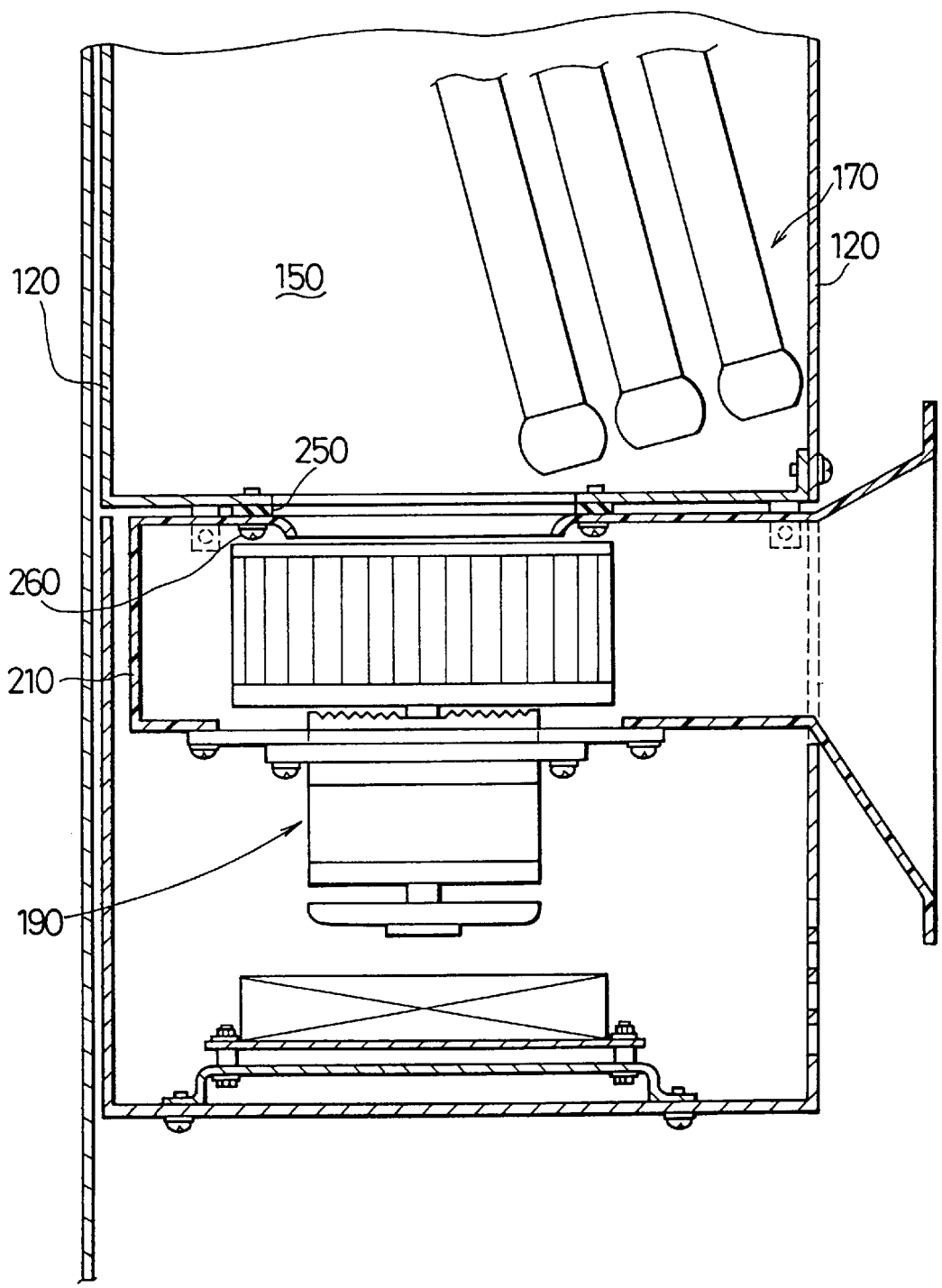
FIG. 45 is a cross sectional view showing a mounted state of an inside blower in the related art.

Applicant has proposes a cooling system for heat-exchanging inside air with outside air (Japanese Patent Application No. Hei 8-77157 filed on Mar. 29, 1996). As shown in FIG. 42, this cooling system is provided with a casing 120 disposed within a housing 110 for housing therein heat generating elements 100 such as electronic components. The interior of the casing 120 is air-tightly partitioned by a partition plate 130 into an inside heat transfer space 150 communicating with a closed space 140 formed in the housing 110 and an outside heat transfer space 160 communicating with the outside (outside air) of the housing 110. To the casing 120 are mounted a heat exchanger having a boiling portion 170 disposed in the inside heat transfer space 150 and a condensing portion 180 disposed in the outside heat transfer space 160, an inside blower 190 (see FIG. 45) for blowing air to the boiling portion 170, and an outside blower 200 (see FIG. 43) for blowing air to the condensing portion 180.

Figure 43:
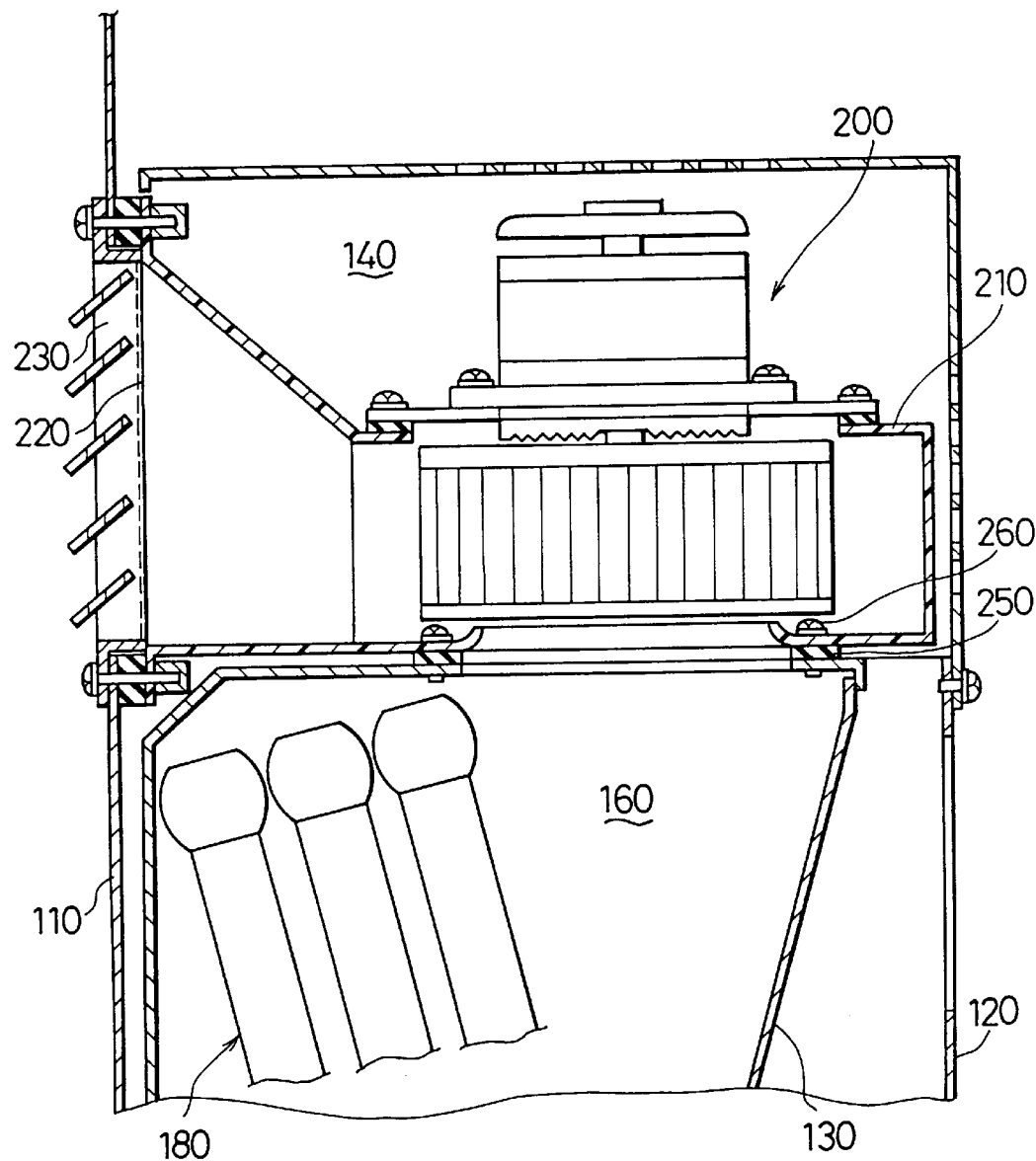
FIG. 43 is a cross sectional view showing a mounted state of an outside blower in the related art.

However, in the outside blower 200 used in the cooling system, as shown in FIG. 43, most of a fan case 210 constitute a wall surface which partitions between the closed space 140 and the outside heat transfer space 160, and therefore sealing performance (waterproof) of the fan case 210 is important. That is, since the outside air flows through the interior of the fan case 210 of the outside blower 200, the occurrence of leakage in the fan case 210 causes entry of water such as rain water into the closed space 140 through an air outlet port 220 formed in the fan case 210, and there is a possibility of adverse influence on the electronic components (heat generating elements 100).

Figure 44:
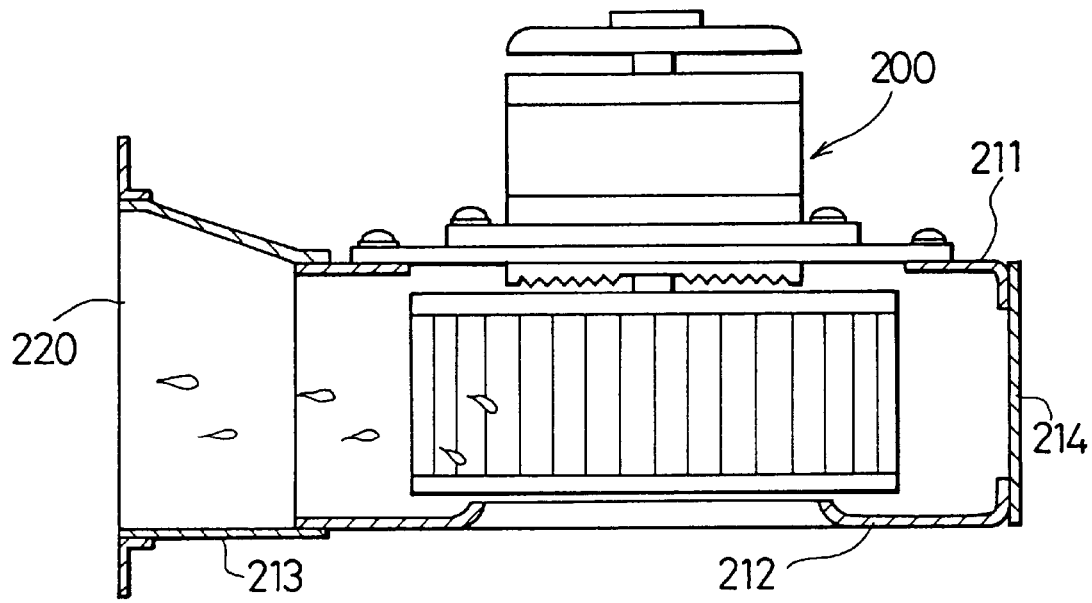
FIG. 44 is a cross sectional view of the outside blower in the related art.

According to the related art, for avoiding such a problem, as shown in FIG. 44, there is provided a sealing material in each of connecting portions among an upper plate 211, a lower plate 212, an air outlet duct 213, and a scroll wall 214, which constitute the fan case 210, to ensure air-tightness. In the relate art, however, since a scroll fan is used, most of the connecting portions are curved; and therefore, it is difficult to perform the sealing work.

Besides, in the case of installing plural blowers, since the blowers are disposed adjacent to each other side by side, it is extremely difficult to adjust the sealing work later even if leakage is discovered on the side of the adjacent blower in an inspection process after assembled.

In the wall surface of the housing 110 to which is mounted the cooling system there are formed an upper opening 230 (see FIG. 43) corresponding to the air outlet opening 220 of the outside blower 200 and a lower opening (not shown) corresponding to an outside air intake opening 240 (see FIG. 42) formed in the wall surface of the casing 120 of the cooling device. However, since the fan case 210 of the outside blower 200 and the casing 120 of the cooling device are separated from each other, it is difficult to adjust the positional relationships between the air outlet opening 220 and the upper opening 230, as well as between the outside air intake opening 240 to the lower opening, while fixing the fan case 210 to the casing 120, thereby causing an increase in the number of working steps.

Figure 13:
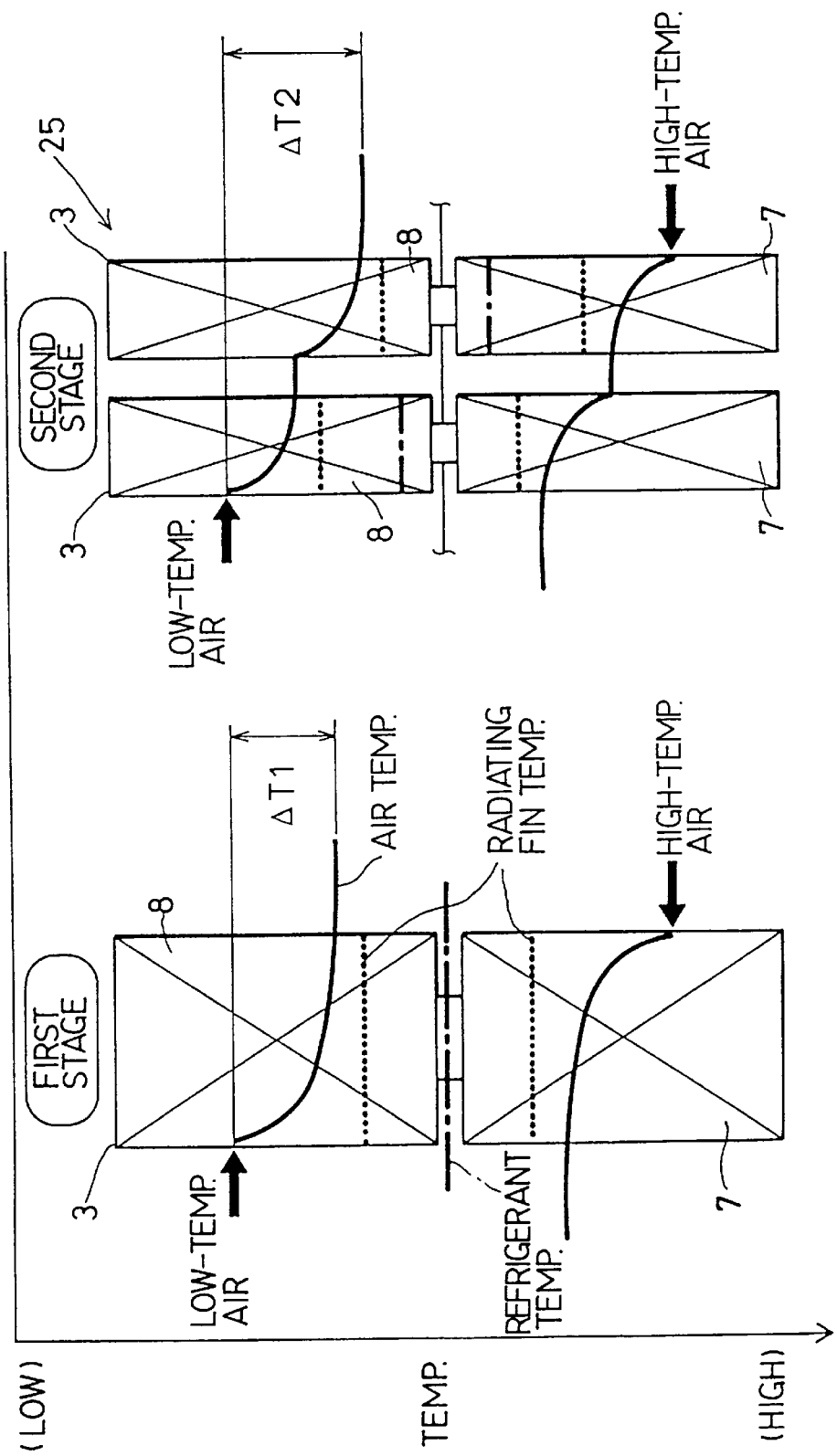
FIG. 13 is a schematic view for expressing a temperature distribution in a flow passage direction of air and refrigerant in the second stage type in the second embodiment, as compared with a temperature distribution in a flow passage direction of air and refrigerant in the first stage type.

Besides, since it is necessary to seal the connecting portion between the fan case 210 and the casing 120, such a sealing work is required as an additional step. That is, as shown in FIGS. 13 and 15, the sealing work is performed by inserting a packing 250 between the fan case 210 and the casing 120 and fixing with the bolt 260.

Figure 31:
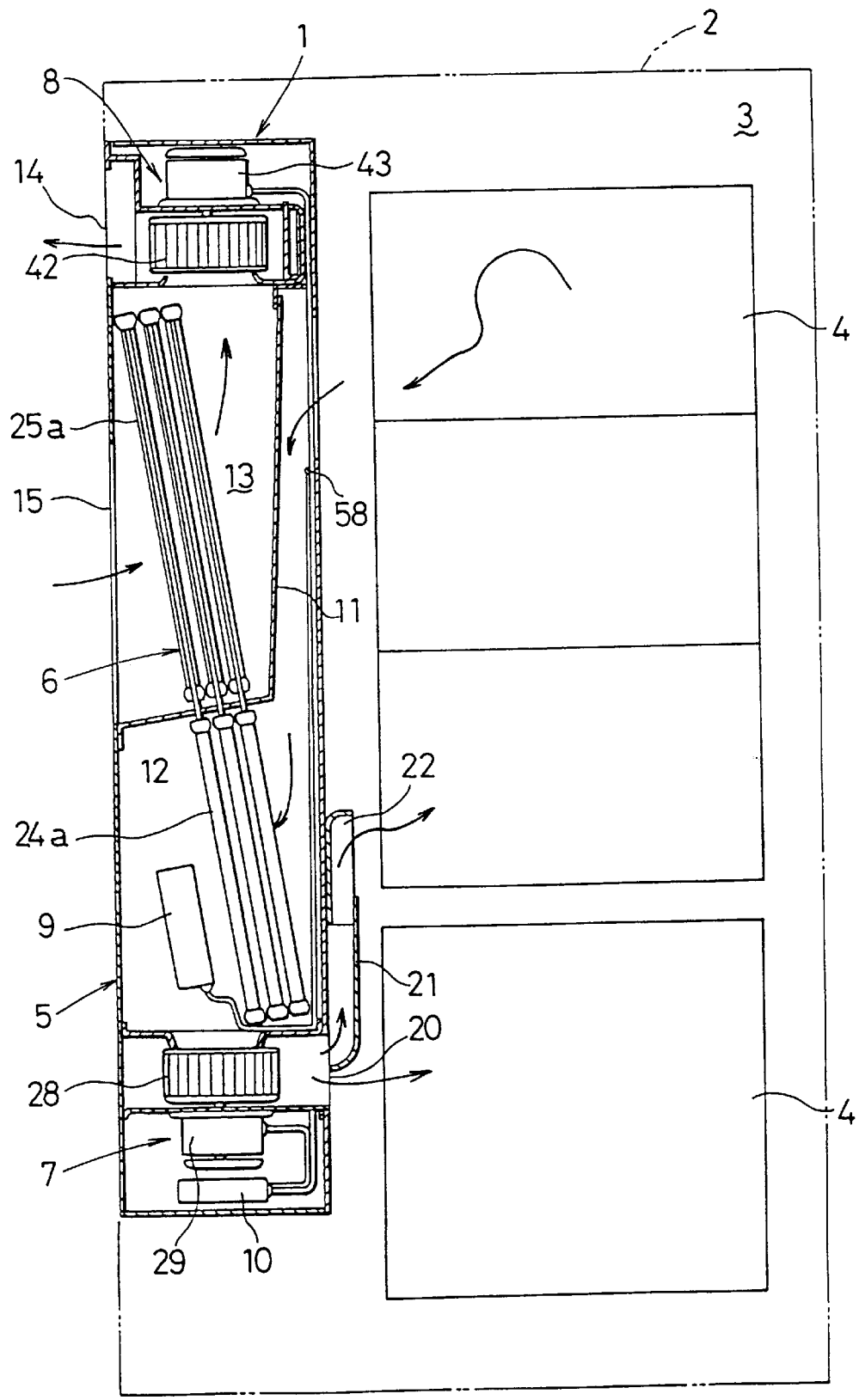
FIG. 31 is an entire cross sectional view of a cooling device according to a sixth embodiment of the present invention.

Next, the sixth embodiment will be described specifically. FIG. 31 is an entire cross sectional view of the cooling device 1.

The cooling device 1 of this embodiment is housed within a hosing 2 of an electronic system and is for cooling a closed space 3 formed within the housing 2.

The electronic system 1 is, for example, a radio base station of a mobile radiotelephone such as cordless telephone or car telephone and includes various electronic components 4 (e.g., semiconductor switching elements and power transistors) mounted in the closed space 3 formed in the housing 2.

As shown in FIG. 31, the cooling device 1 includes a casing 5, a heat exchanger 6, an inside blower 7, an outside blower 8, an electric heater 9, and a controller 10. The cooling device 1 is fixed to the inside of a door 2A (see FIGS. 36 and 39) which is provided on the front side (left side in FIG. 31) of the housing 2.

Within the casing 5 are formed an inside heat transfer space 12 and an outside heat transfer space 13 by means of a partition plate 11 and fan cases (described later) of the inside and outside blowers 7 and 8, respectively. In the front face of the casing 5 are formed an upper opening (air outlet port of the outside blower 8) and a lower opening (outside air intake port) 15 for communicating the outside heat transfer space 13 with the outside (outside air) of the housing 2. Thread holes 14a and 15a are formed around the openings 14 and 15 of the casing 5, and bolts 16 are fastened into the thread holes 14a and 15a from outside the door 2A, so that the casing 5 is fixed to the door 2A (see FIG. 39). Between the door 2A and the casing 5 are disposed packings 17 around the openings 14 and 15 to ensure air-tightness.

Also in the door 2A of the housing 2 to which is mounted the casing 5 are also formed an upper opening 18 (see FIG. 39) and a lower opening (not shown) in positions opposed to the openings 14 and 15. To prevent the entry of water droplets such as rain water and foreign materials such as dust from the upper opening 18, the door 2A is provided with a louver or a filter (not shown).

In the rear face of the casing 5, as shown in FIG. 33, there are formed an upper opening (air intake port) 19 and a lower opening (air outlet port of the inside blower) 20 for communicating the inside heat transfer space 12 with the closed space 3 in the housing 2, and there is also formed a communication port 22 for communicating with the lower opening 20 through a duct 21. The duct 21 has a width which covers the whole width of the opening 20 and is fixed to the rear side of the casing 5 by passing screws 23 into four slide holes 21a formed in both ends. Since the slide holes 21a are formed long, by changing the position (height) in the slide holes 21a to be fixed with screws 23, it is possible to slide the duct 21 vertically within the vertical range of the slide holes. Therefore, by sliding the duct 21 vertically to change its mounting position relative to the casing 5, the opening ratio between the opening 20 and the communication port 22 can be changed freely.

Figure 34:
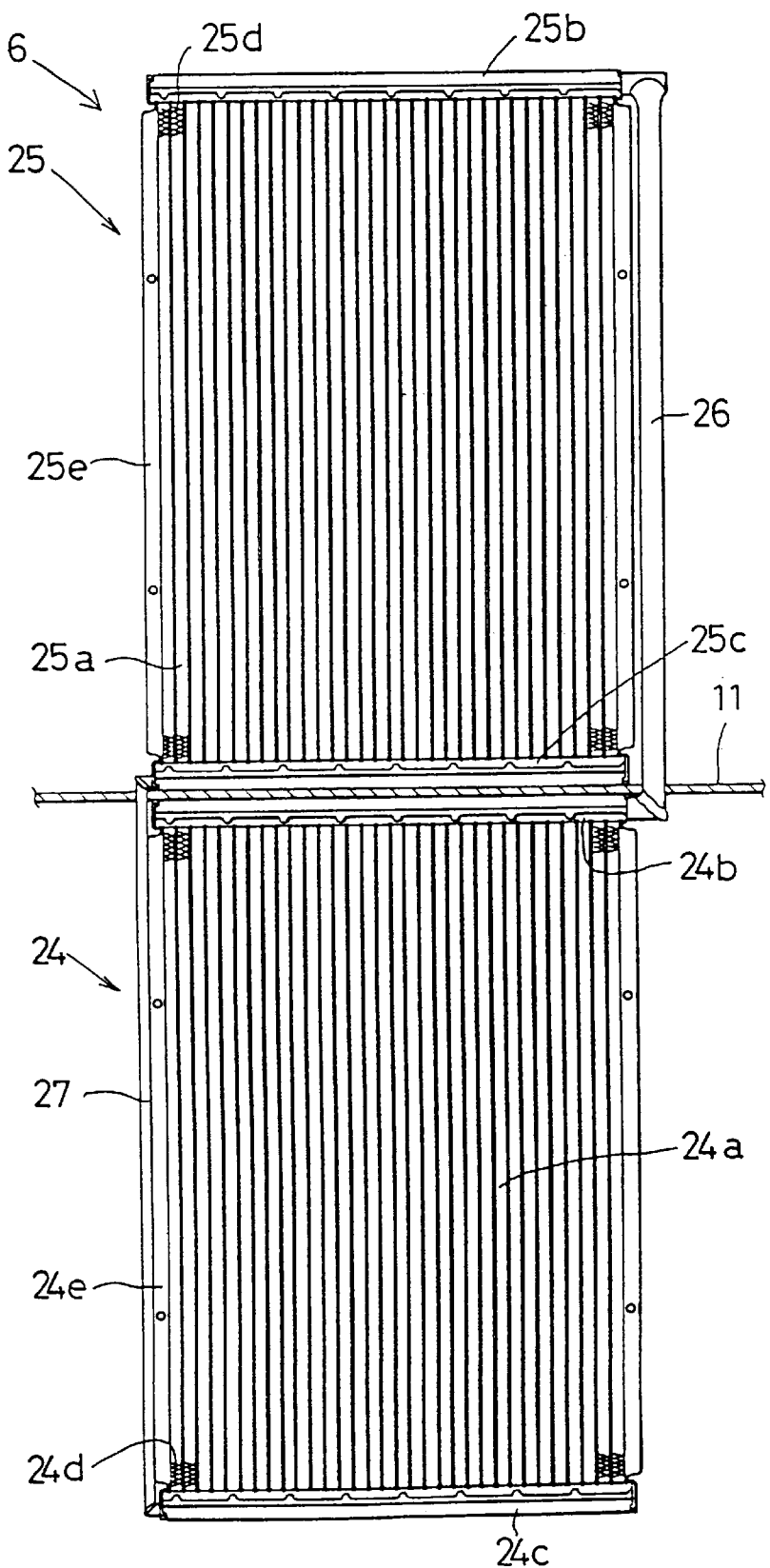
FIG. 34 is a front view of a heat exchanger in the sixth embodiment.

As shown in FIG. 34, the heat exchanger 6 has a boiling portion 24, a condensing portion 25, and a first connecting pipe 26 and a second connecting pipe 27 for connection between the boiling portion 24 and the condensing portion 25. A chlorofluorocarbon type or freon type refrigerant is sealed in the heat exchanger 6.

The boiling portion 4 includes a plurality of cooling tubes 24a, an upper tank 24b and a lower tank 24c, for communicating the cooling tubes 24a with each other, heat receiving fins 24d interposed between adjacent cooling tubes 24a, and side plates 24e. The boiling portion 24 is located in the inside heat transfer space 12 within the casing 5.

The cooling tubes 24a are flat tubes (e.g., 1.7 mm wide and 16.0 mm long) having an elongated rectangular or circular cross section. For example, the tubes 24a are formed of a metallic material having a superior heat conductivity such as aluminum or copper.

The upper tank 24b and the lower tank 24c are each composed of a core plate connected to the cooling tubes 24a and a tank plate joined to the core plate. Either one of the upper tank 24b and the lower tank 24c is formed with a single refrigerant inlet (not shown) for sealing a refrigerant into the cooling tubes 24a. The refrigerant is sealed into the tubes 24a up to a level almost equal to the upper end of each tube 24a (see FIG. 35). The refrigerant is sealed by sealing-off or using a service valve (check valve) (not shown) after the heat receiving fins 24d is soldered to the cooling tubes 24a.

The heat receiving fins 24d are corrugated fins formed by folding alternately a thin metallic sheet (e.g., 0.02–0.50 mm in thickness) having a superior thermal conductivity such as aluminum into a corrugated shape. The fins 24d are soldered to flat outer wall surfaces of the cooling tubes 24a.

The side plates 24e, which are provided on both sides of the boiling portion 24, are fixed to the partition plate 11 and the casing 5 with fastening means (not shown) such as screws. The side plates 24e also function to reinforce the cooling tubes 24a and the heat receiving fins 24d.

The condensing portion 25 includes a plurality of cooling tubes 25a, an upper tank 25b and a lower tank 25c, for communicating the cooling tubes 25a with each other, heat radiating fins 25d interposed between adjacent cooling tubes 25a, and side plates 25e. The condensing portion 25 is located in the outside heat transfer space 13 within the casing 5.

The cooling tubes 25a are formed in the same shape as the cooling tubes 24a in the boiling portion 24, with a metallic material having a superior thermal conductivity such as aluminum or copper.

The upper tank 25b and the lower tank 25c includes a core plate connected to the cooling tubes 25a and a tank plate joined to the core plate.

The heat radiating fins 25d, like the heat receiving fins 24d, are corrugated fins formed of a thin metallic sheet having a superior thermal conductivity, such as aluminum. The heat radiating fins 25d are soldered to flat wall surfaces of the cooling tubes 25a.

The side plates 25e, which are provided on both sides of the condensing portion 25, are fixed to the partition plate 11 and the casing 5 with fastening means such as screws. Like the side plates 24e in the boiling portion 24, the side plates 25e also function to reinforce the cooling tubes 25a and the heat radiating fins 25d.

A first connecting pipe 26 is for conducting the vapor of the refrigerant which has been boiled and vaporized in the cooling tubes 24a of the boiling portion 24 to the condensing portion 25. The first connecting pipe 26 connects the upper tank 24b in the boiling portion 24 to the upper tank 25b in the condensing portion 25 through the partition plate 11. A second connecting pipe 27 is for conducting the liquid of the refrigerant which has been condensed in the cooling tubes 25a of the condensing portion 25 to the boiling portion 24. The second connecting pipe 27 connects the lower tank 24c in the boiling portion 24 to the lower tank 25c in the condensing portion 25 through the partition plate 11. The first and second connecting pipes 26 and 27 are formed in a circular shape using the same metallic material as that of the cooling tubes 24a and 25a. The diameter of the first connecting pipe 26 through which the refrigerant vapor flow is set to be larger than that of the second connecting pipe 27 through which the refrigerant liquid flows.

Figure 36:
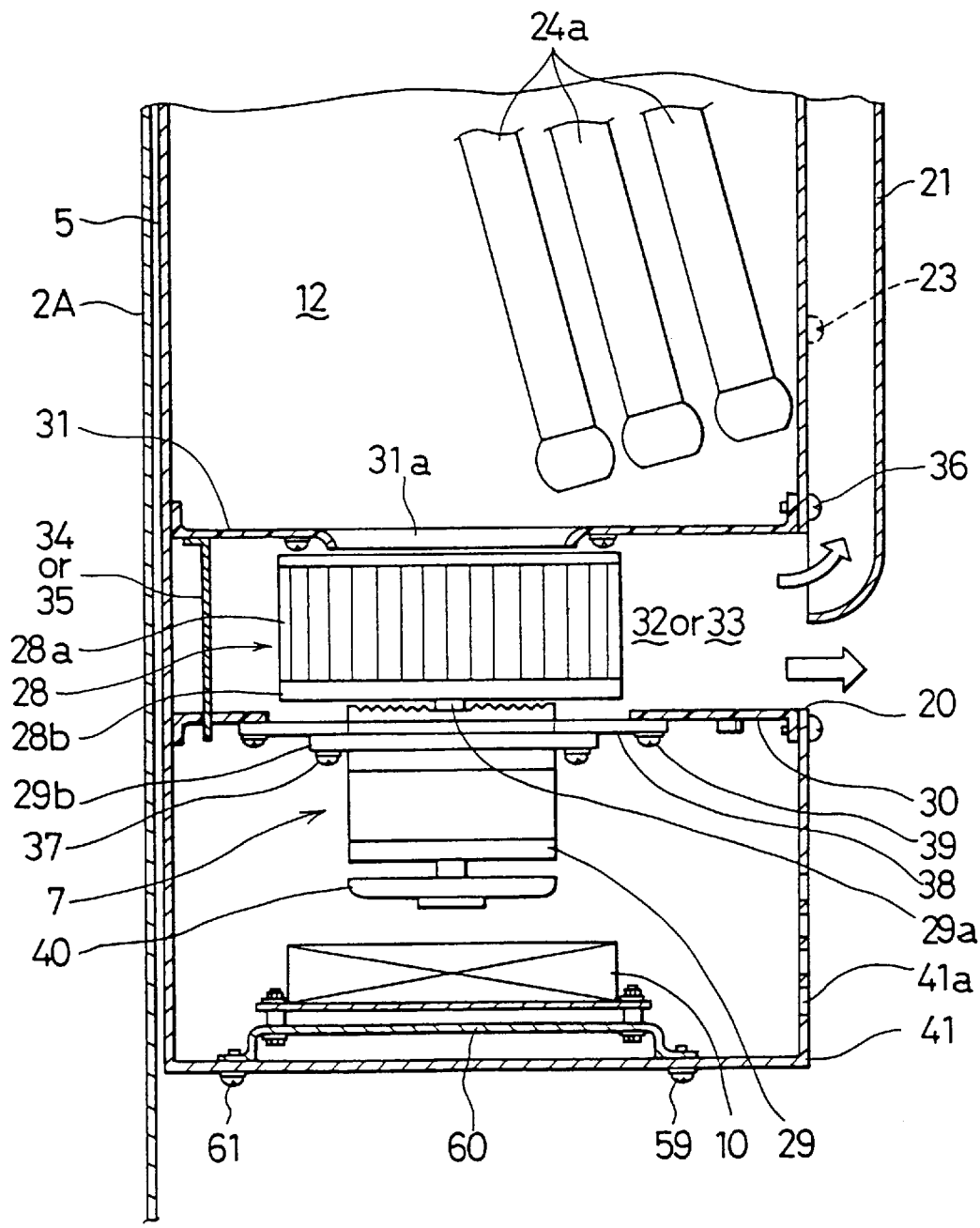
FIG. 36 is a cross sectional view showing a mounted state of an inside blower in the sixth embodiment.

As shown in FIG. 36, the inside blower 7 is disposed in the lower portion of the casing 5 (below the inside heat transfer space 12) such that air circulates between the closed space 3 in the housing 2 and the inside heat transfer space 12 formed in the casing 5.

The inside blower 7 includes a fan case (described later), a centrifugal fan 28 and a drive motor 29.

Figure 37:
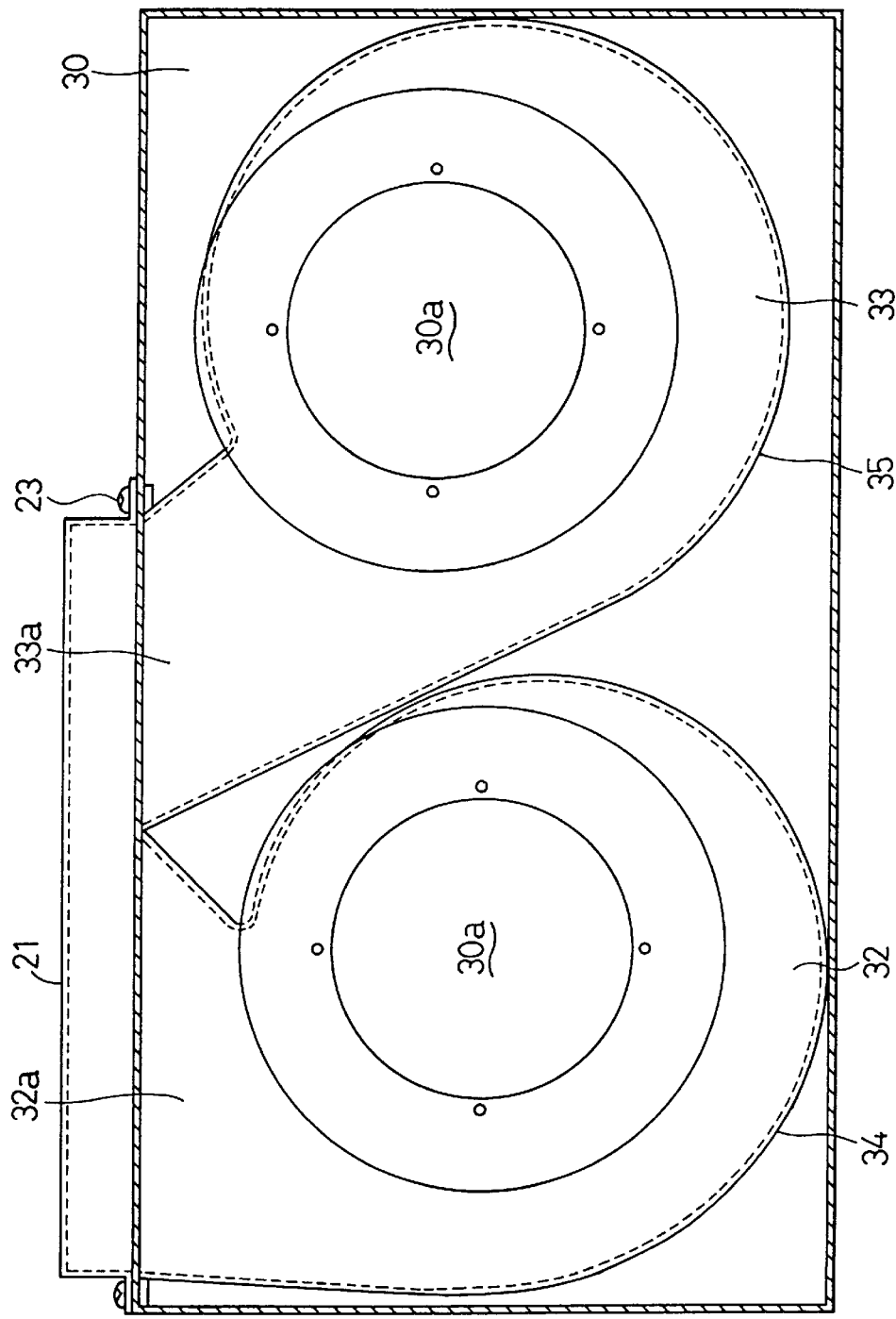
FIG. 37 is a plan view showing air paths in the inside blower in the sixth embodiment.

The fan case is formed by two outer plates 30 and 31 each having rectangular plan surfaces, a wall surface of the casing 5 which forms a side face between the two outer plates 30 and 31, and two side wall plates 34 and 35 which are sandwiched between two outer plates 30 and 31 to form scroll-shaped air paths 32 and 33 (see FIG. 37).

Of the two outer plates, one outer plate 30 is formed with two circular openings 30a (see FIG. 37) through which the centrifugal fans 28 is inserted, while the other outer plate 31 is formed with two bell-mouth-shaped air intake ports 31a at positions opposed to the openings 30a of the one outer plate 30.

Figure 38:
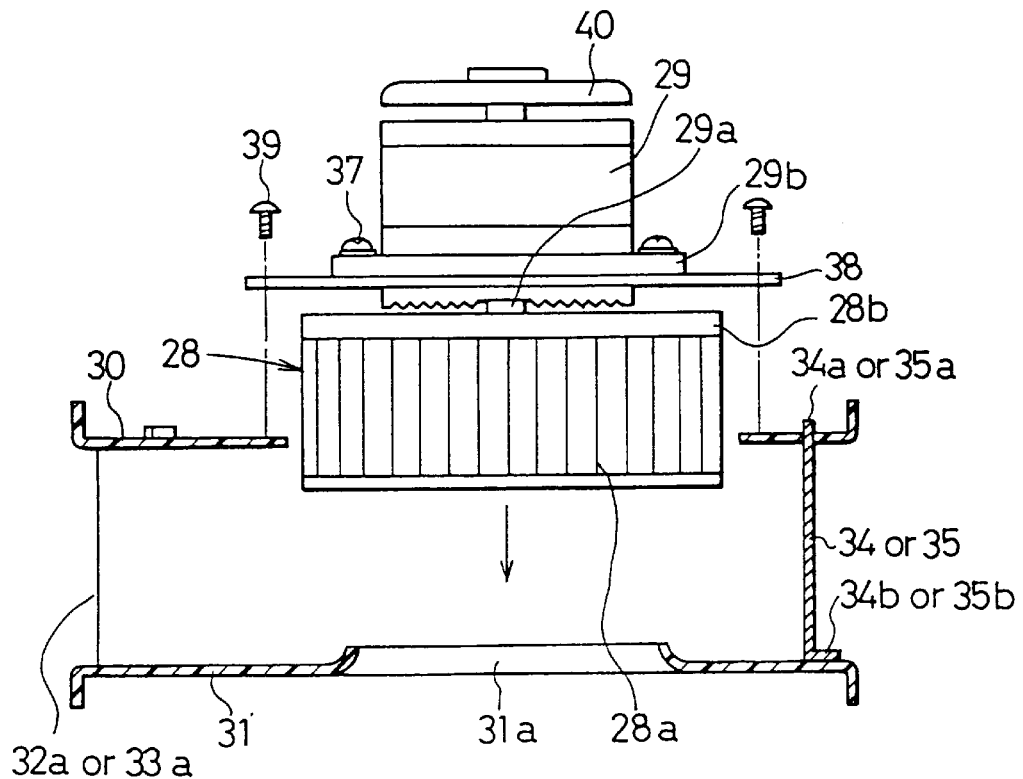
FIG. 38 is an exploded view of the inside blower in the sixth embodiment.

As shown in FIG. 37, the two side wall plates 34 and 35 are bent in a predetermined scroll shape and are disposed side by side on the planes of the outer plates 30 and 31. On one sides and the opposite sides of the side wall plates 34 and 35, there are formed plural projections 34a, 35a and 34b, 35b, respectively, as shown in FIG. 38. The projections 34a and 35a formed on one sides are fitted in fitting holes formed in one outer plate 30, while the projections 34b and 35b formed on the other sides are bent at right angles and welded to the other outer plate 31. The two side wall plates 34 and 35 are disposed so that outlets 32a and 33a of two air paths 32 and 33 are adjacent to each other (see FIG. 37).

The two outer plates 30 and 31 to which side wall plates 34 and 35 fixed are fixed to the casing 5 with fastening means 36 such as screws in such a manner that the outlets 32a and 33a of the air paths 32 and 33 coincide with the lower opening 20 formed in the rear side of the casing 5 (see FIG. 36). The side face between the two outer plates 30 and 31 other than the outlets 32a and 33a, is constructed by the wall surface of the casing 5. Thus, the outer case having a box-shaped structure is constructed by the two outer plates 30, 31 and the wall surface of the casing 5 which forms a side face between both outer plates.

As shown in FIGS. 36 and 38, the centrifugal fan 28 includes a plurality of blades 28a disposed in the circumferential direction and a disc-shaped support plate 28b for supporting the blades 28a. The support plate 28b is fixed to an output shaft 29a of a drive motor 29.

Upon receipt of an ON signal from the controller 10, the drive motor 29 drives the centrifugal fan 28 to rotate the fan. A stay 29b of a motor housing is fixed to a mounting plate 38 with screws 37 or the like, and the mounting plate 38 is fixed to one outer plate 30 with fastening means 39 such as screws, so that the drive motor 29 is mounted to the fan case. A cooling fan 40 is mounted on the output shaft 29a of the drive motor 29. While the cooling fan 40 is rotated, the outside air is blown to the drive motor 29 to cool the motor. The outer periphery of the drive motor 29 is covered with a motor cover 41 (part of the casing 5), and vent holes 41a communicating with the closed space 3 in the housing 2 are formed in the motor cover 41.

Figure 39:
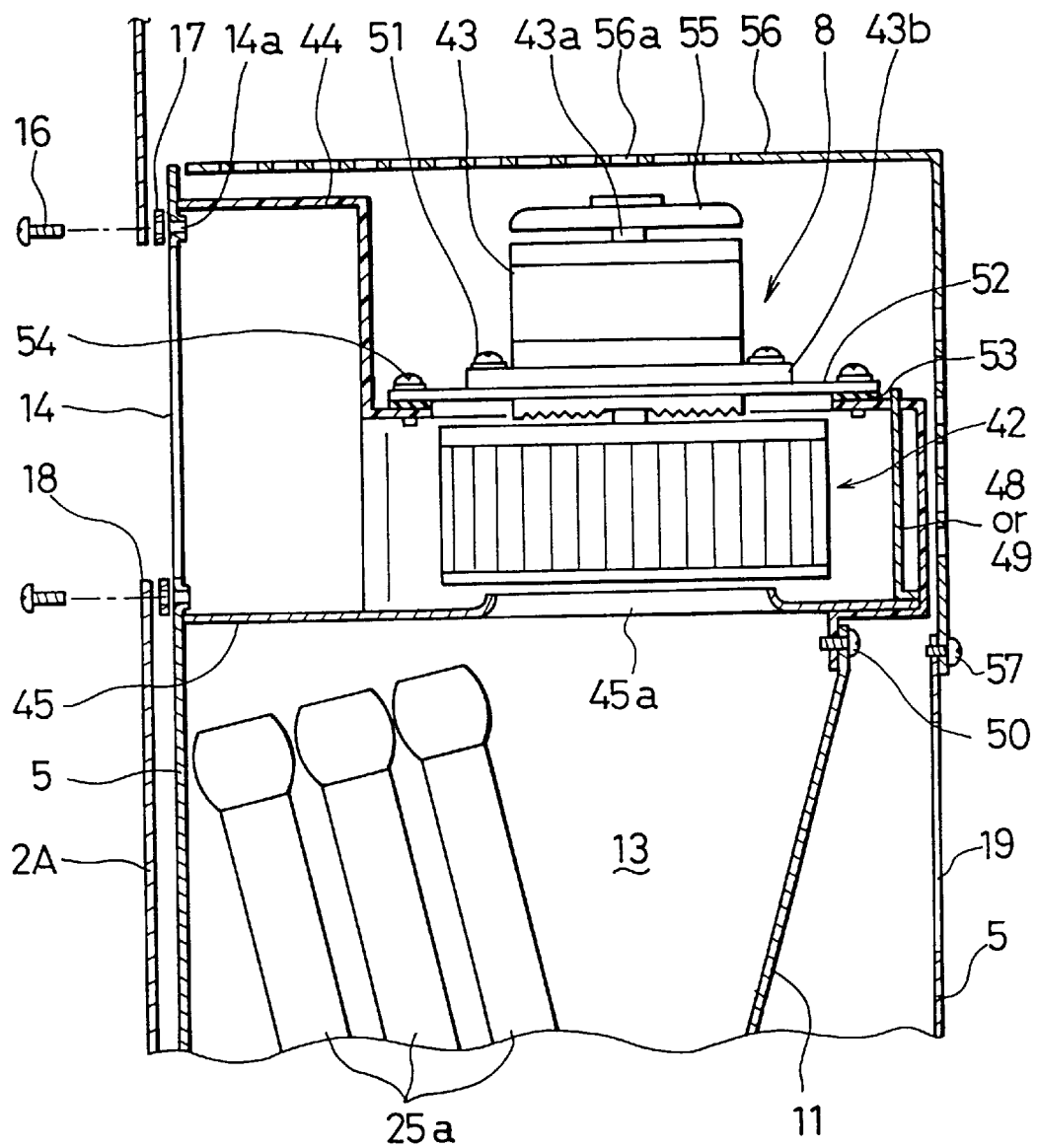
FIG. 39 is a cross sectional view showing a mounted state of an outside blower in the sixth embodiment.

As shown in FIG. 39, the outside blower 8 is disposed in the upper portion (above the outside heat transfer space 13) of the casing 5 such that air circulates between the outside (outside air) of the housing 2 and the outside heat transfer space 13 in the casing 5.

The outside blower 8 includes a fan case (described later), an centrifugal fan 42 and a drive motor 43.

Figure 40:
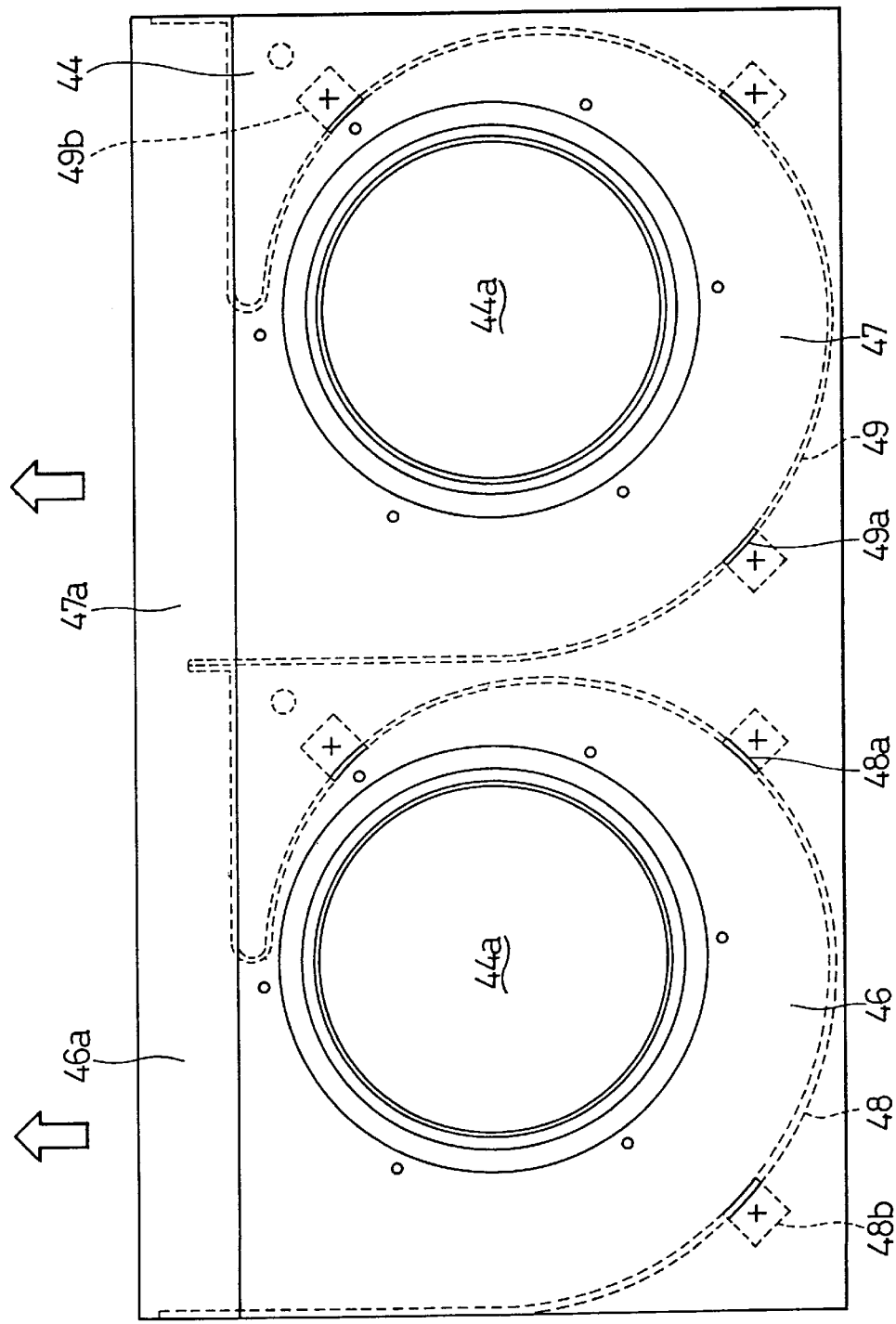
FIG. 40 is a plan view showing air paths in the outside blower in the sixth embodiment.

The fan case includes two outer plates having rectangular plan surfaces, a wall surface of the casing 5 which forms a side face between the two outer plates 44 and 45, and two side wall plates 48 and 49 which are sandwiched between the two outer plates 44 and 45 to form scroll-shaped air paths 46 and 47 (see FIG. 40).

In one outer plate 44 of the two are formed two circular openings 44a (see FIG. 40) for receiving the centrifugal fans 42, while in the other outer plate 45 are formed two air intake ports 45a of a bell-mouth shape at positions opposed to the opening 44a of one outer plate 44. To expand the outlet opening area of the air paths 46 and 47, as shown in FIG. 39, one outer plate 44 is bent at right angles to the outside (upper side in FIG. 39) at an end portion thereof on the side of the outlet 46a and 47a, then is further bent at right angles to the front side. The rear end side of one outer plate 44, for forming a rear end face of the fan case, is bent at right angles toward the other outer plate 45 (lower side in FIG. 39), then is further bent at right angles to the front side, and is fixed to the other outer plate by spot welding for example.

As shown in FIG. 40, the two side wall plates 48 and 49 are each bent into a predetermined scroll shape and are disposed side by side in the planes of the outer plates 44 and 45. On one and opposite sides of the side wall plates 48 and 49 are formed plural projections 48a, 49a and 48b, 49b, respectively. The projections 48a and 49a formed on one sides are inserted into fitting holes formed in one outer plate 44, while the projections 48b and 49b formed on the other sides are bent at right angles and welded to the other outer plate 45.

The two outer plates 44 and 45 with the side wall plates 48 and 49 fixed thereto are fixed at front end portions thereof to the front side of the casing 5 by spot welding for example so that outlets of the air paths 46 and 47 coincide with the upper opening 18 formed in the front side of the casing 5. The rear end portion of one outer plate 44 is secured to the partition plate 11 with screws 50 or the like (see FIG. 39). The side face between the two outer plates 44 and 45 other than the outlet 46a, 47a side and the rear end face, is constructed by the wall surface of the casing 5. Thus, the outer case having a box-shaped structure is constructed by the two outer plates 44, 45 and the wall surface of the casing 5 which forms the side face between the outer plates. In this fan case, since one outer plate 44 is used as one wall surface for partitioning air-tightly between the closed space 3 and the outside heat transfer space 13, there are provided sealing materials between one outer plate 44 and the wall surface of the casing 5, in the gap between the projection 48a on the other outer plate 45 and the fitting hole in the one outer plate 44, and between one outer plate 44 and the partition plate 11, to ensure air-tightness.

Figure 41:
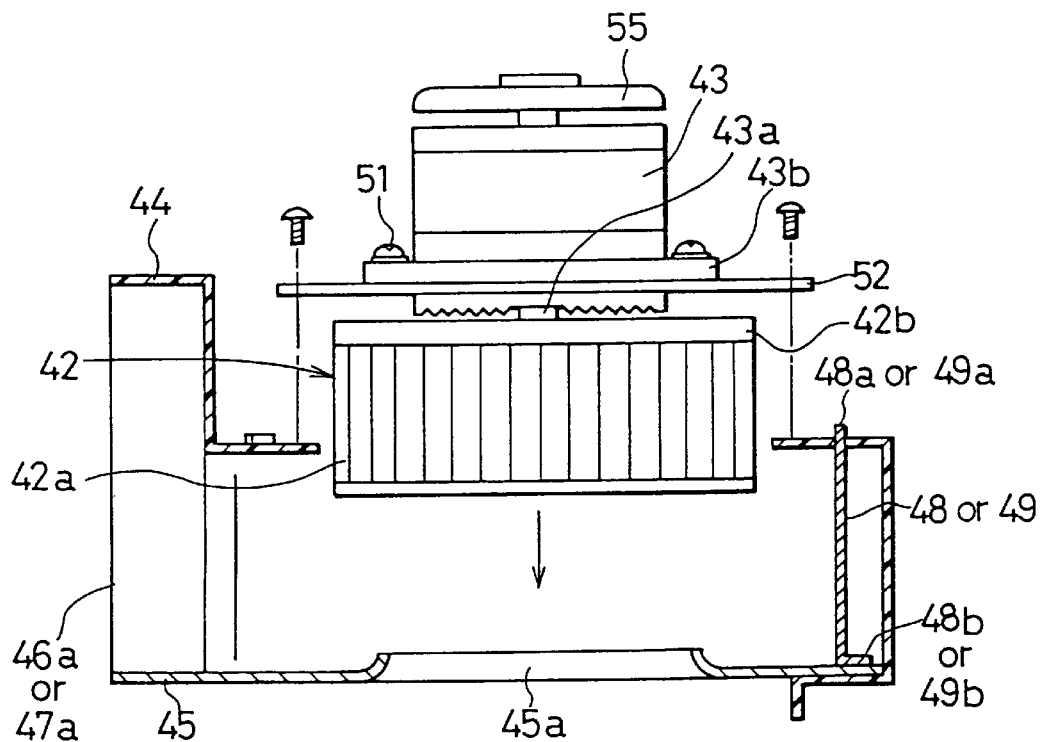
FIG. 41 is an exploded view of the outside blower in the sixth embodiment.

As shown in FIGS. 39 and 41, the centrifugal fan 42 includes a plurality of blades 42a disposed in the circumferential direction and a support plate 42b for supporting the blades 42a. The support plate 42b is fixed to an output shaft 43a of the drive motor 43.

Upon receipt of an ON signal from the controller 10, the drive motor 43 drives the centrifugal fan 42 to rotate the fan. A stay 43b of a motor housing is fixed to a mounting plate 52 with screws 51, and the mounting plate 52 is fixed to one outer plate 44 with fastening means 54 such as screws through packing 53, so that the drive motor 43 is mounted to the fan case. Further, a cooling fan 55 is mounted on an end portion of the output shaft 43a of the drive motor 43. With the cooling fan 55 is rotated, the outside air is blown to the drive motor 43 to cool the motor. The outer periphery of the drive motor 43 is covered with a motor cover 56, and a vent hole 56a communicating with the closed space 3 in the housing 2 is formed in the motor cover 56. The motor cover 56 is fixed to the casing 5 with screws 57 or the like.

The electric heater 9 is disposed in the inside heat transfer space 12 within the casing 5 and on the downstream side of air current with respect to the boiling portion 24 of the heat exchanger 6. When the temperature in the closed space 3 within the housing 2 is low (e.g., 0° C. or lower), the electric heater 9 heats the air in the inside heat transfer space 12 which communicates with the closed space 3 to prevent the deterioration in performance of the electronic components 4 accommodated within the closed space 3.

On the basis of the temperature detected by a temperature sensor 58 (see FIG. 41) which is a temperature-sensitive element such as a thermistor for example, the controller 10 controls the supply of an electricity to such electric devices as electric heater 9, inside blower 7 and outside blower 8. More specifically, when the temperature detected by the temperature sensor 58 is higher than a lower-limit temperature (e.g., 0° C.), the controller 10 controls to rotate the inside and outside blowers 7 and 8 at a Hi-operation (a large amount of air) or a Lo-operation (a small amount of air) and turns OFF the electric heater 9. When the temperature detected by the temperature sensor 58 is lower than the lower-limit temperature, the controller 10 controls to turn OFF the outside blower 8 and operate the inside blower 7 at the Hi-operation or Lo-operation, and turns ON the electric heater 9. A support base 60 is fixed with screws 59 or the like to the bottom of the casing 5 which forms the motor cover 41, and the controller 10 is fixed to the support base 60 with fastening means 61 such as bolt and nut (see FIG. 36).

An operation of this embodiment will now be described.

Within the housing 2, the air temperature in the closed space 3 rises due to heat generated by the operation of the electronic components 4. Therefore, it is necessary to reduce the air temperature in the closed space 3 in order to cool the electronic components 4. If the temperature detected by the temperature sensor 58 is higher than the lower-limit temperature (e.g., 0° C.), the drive motor 29 for the inside blower 7 and the drive motor 43 for the outside blower 8 are electrified by the controller 10. The operation of the inside blower 7 generates a flow of air circulating through both inside heat transfer space 12 in the casing 15 and the closed space 3 in the housing 2. Further, upon operation of the outside blower 8, the outside air flows through the outside heat transfer space 13 in the casing 5.

Figure 35:
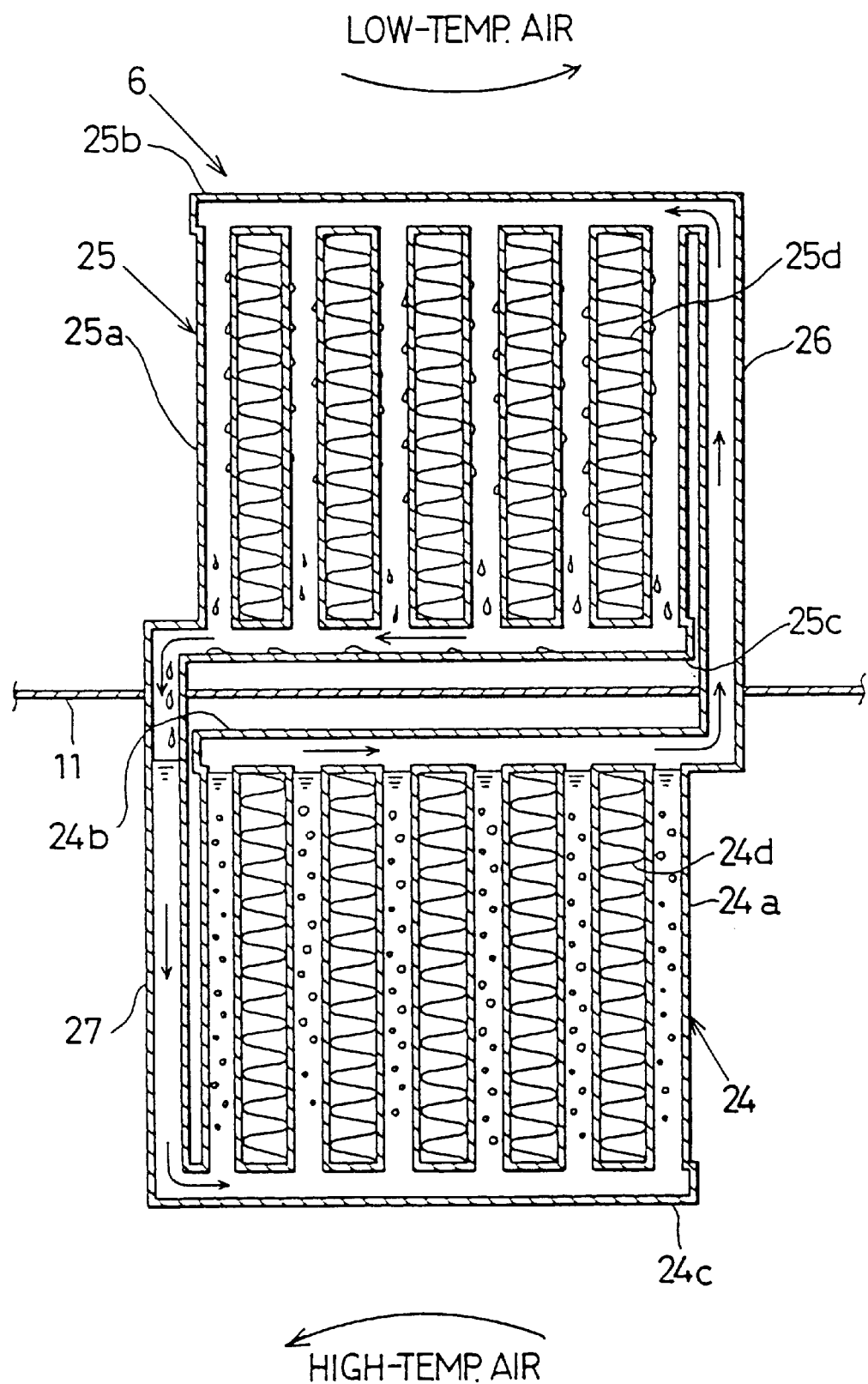
FIG. 35 is a schematic diagram explaining the operation of the heat exchanger in the sixth embodiment.

In the heat exchanger 6, as shown in FIG. 35, the refrigerant sealed in the cooling tubes 24a of the boiling portion 24 receives heat through the heat receiving fins 24d from the high-temperature air flowing through the inside heat transfer space 12, and boils and vaporizes. The refrigerant vapor passes through the first connecting pipe 26 from the upper tank 24b in the boiling portion 24 and is introduced to the upper tank 25b in the condensing portion 25, then is condensed on the inner wall surfaces of the cooling tubes 25a which are exposed to the outside air (low-temperature air) and low in temperature. At this time, latent heat of condensation of the refrigerant is radiated through heat radiating fins 25d to the outside air flowing through the outside heat transfer space 13.

The refrigerant thus condensed in the condensing portion 25 drops along the inner wall surfaces of the cooling tubes 25a into the lower tank 25c due to its own weight, then passes through the second connecting pipe 27, is introduced to the lower tank 24c in the boiling portion 24, and is supplied from the lower tank 24c to the cooling tubes 24a. In this way, vaporization and condensation of the refrigerant are repeated alternately, the heat of the high-temperature air flowing through the inside heat transfer space 12 can be radiated to the outside air flowing through the outside heat transfer space 13.

The air after passing the boiling portion and cooled is sucked into the fan case through the air intake ports 31a of the inside blower 7, flows through the air paths 46 and 47, then is distributed into air which is blown out directly from the lower opening (air outlet port 20) and air which passes through the duct 21 and is blown out from the communication port 22. In this way, the air is blown to each of the electronic components 4 to cool the electronic components. In this case, the height of the duct 21 attached to the casing 5 is changed so that the opening ratio between the lower opening 20 and the communication port 22 can be changed appropriately. In this way, it becomes possible to change the ratio between the amount of air blown out from the lower opening 20 and air blown out from the communication port 22.

In this embodiment, since the fan case (outer case) of the outside blower 8 constitutes part of the wall surface which partitions between the outside heat transfer space 13 and the closed space 3, the outer case needs the waterproof performance. To meet this requirement, in the outside blower 8, there are provided sealing materials in between the two outer plates 44, 45 and the wall surface of the casing 5, which constitute the outer case, and also between one outer plate 44 and the partition plate 11, to close air-tightly between the outside heat transfer space 13 and the closed space 3. Therefore, it is not necessary to seal the connecting portions between the two side plates 48, 49 and the outer plates 44, 45. The outer case is of a box-shaped structure, in which the two outer plates 44 and 45 directly abut perpendicularly to the wall surfaces except the rear side of the casing 5. The connecting portion between one outer plate 44 and the partition plate 11 is also formed linearly. Thus, since the sealing material can be disposed directly to each of the above connecting portions, it is possible to perform the sealing work easily.

Although the two side plates 48 and 49 are sandwiched between the two outer plates 44 and 45 to form two air paths 46 and 47, it is possible to perform the sealing work in the same manner, irrespective of the number of the side plates 48 and 49 to be sandwiched between the two outer plates 44 and 45, i.e., by merely sealing the connection portions of the outer case. Therefore, even if leakage is found out in inspection after mounting of the outside blower 8, it is possible to repair the leakage in a simple manner, because the sealing work for the outer case can be performed easily.

Besides, in both inside and outside blowers 7 and 8, since the side plates 34, 35 and 48, 49 are sandwiched between the parallel faces of the two outer plates 30, 31 and of the two outer plates 44, 45, respectively, to form air paths 32, 33 and 46, 47, the shape and air direction of the air paths 32, 33 and 46, 47 can be changed easily by merely changing the scroll shape of the side plates 34, 35 and 48, 49. More particularly, since the fan case in the conventional blower is manufactured by using a die for a sheet metal, the cost is increased. For this reason, even if case shapes suitable for various purposes are known, a new die is rarely produced to reduce the cost. In most cases, from among conventional fan cases, one having a shape close to the most suitable shape is used as a substitute. On the other hand, in this embodiment, the fan case can be manufactured by using a pressing die, because it is not necessary that the two outer plates 30, 31 and 44, 45 be formed along a scroll shape. As a result, the cost is lower than when the fan case is manufactured by using the conventional die for sheet metal. Therefore, a fan case which satisfies desired fan size and fan characteristics can be manufactured with less expense.

In the outside blower 8, since the two outer plates 44 and 45 are fixed to the wall surface of the casing 5 directly by spot welding for example to form the outer case, it is possible to form an air outlet port (upper opening) 14 of the air paths 46 and 47 in the wall surface of the casing 5. Consequently, it is possible to easily adjust a positional relationship of the air outlet port 14 and outside air intake port (lower opening) 15 formed in the wall surface of the casing 5 to the upper opening 18 and lower opening (not shown) formed in the door 2A of the housing 2.

Moreover, in both inside and outside blowers 7 and 8, since the outer plates 31 and 45 having air intake ports 31a and 45a are used also as one wall surfaces for forming the inside and outside heat transfer spaces 12 and 13, it is not necessary to fix the fan case to the wall surface of the casing 5. Besides, the number of working steps can be decreased, because the sealing work between the two is not required.

Further, in the related, an independent fan case is used for each blower and each fan case is fixed to the housing wall surface through a flange formed on the peripheral edge of an air outlet port. Consequently, the effective area of the air outlet port decreases by the portion of the flange relative to an allowable mounting area. In contrast, in this embodiment, an outer case is used commonly to a plurality (two in this embodiment) of side plates 48 and 49, so that an opening area (size of the air outlet port) can be correspondingly increased. Such an increase of the opening area greatly contributes to the improvement of air blowing performance, because the air flow resistance by a filter or a louver is high when the filter or the louver is mounted to the upper opening 18 (formed in the door 2A of the housing 2) corresponding to the air outlet port 14.

A seventh embodiment of the present invention will be described.

Figure 46:
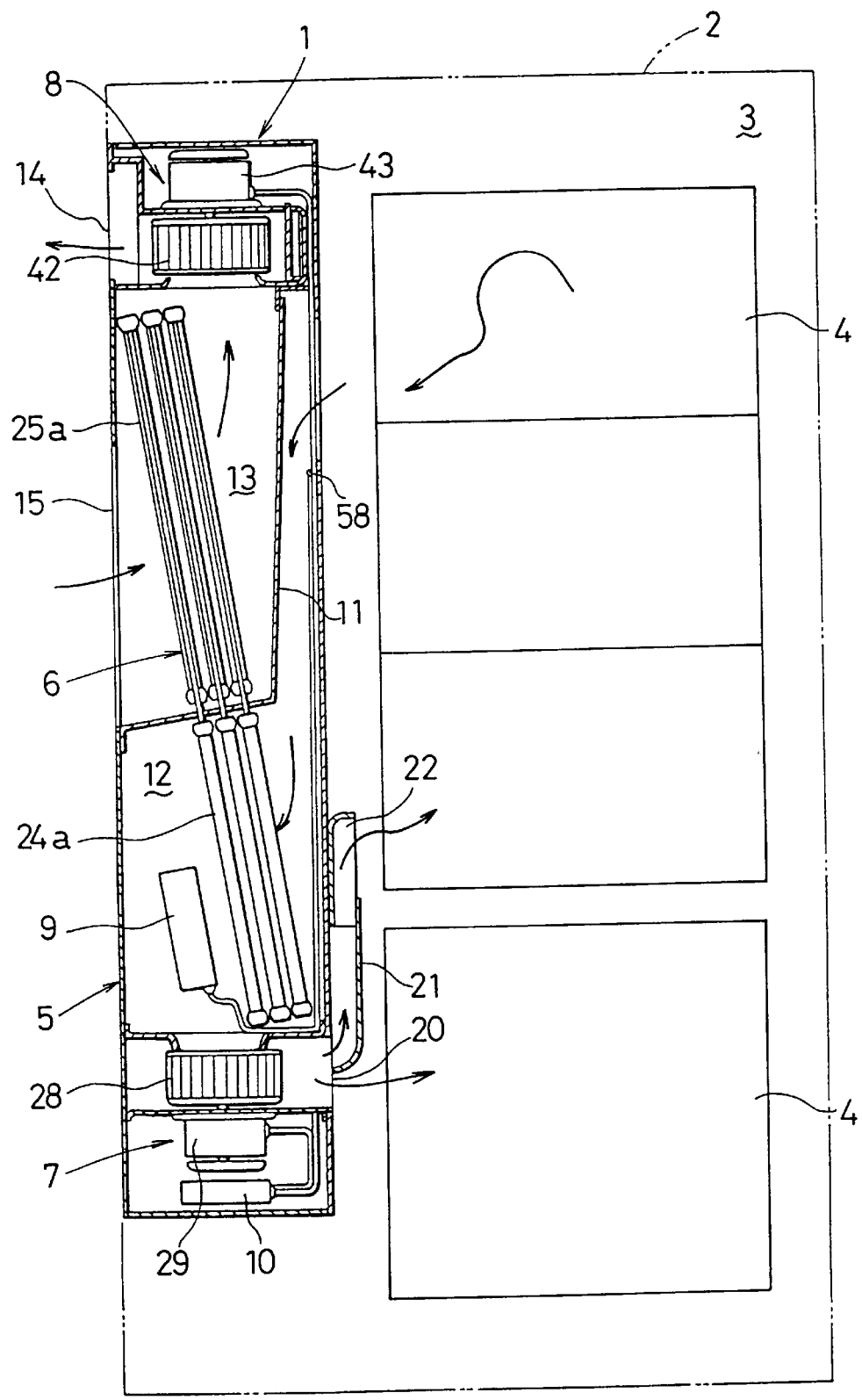
FIG. 46 is an entire cross sectional view of a cooling device of a seventh embodiment.
Figure 47:
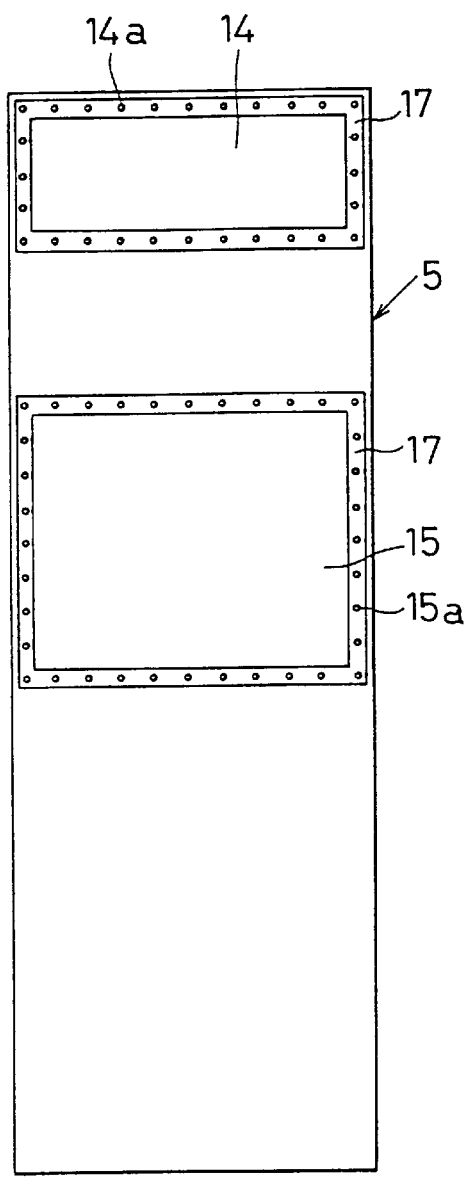
FIG. 47 is a front view of a casing in the seventh embodiment.

FIG. 46 is an entire cross sectional view of the cooling device 1.

The cooling device 1 of this embodiment is accommodated within a housing 2 of an electronic system to cool closed space 3 formed within the housing 2.

The electronic system 1 is, for example, a radio base station of a mobile radiotelephone such as cordless telephone or car telephone and includes various electronic components 4 (e.g., semiconductor switching elements and power transistors) mounted in the closed space 3 formed in the housing 2.

As shown in FIG. 46, the cooling device 1 includes a casing 5, a heat exchanger 6, an inside blower 7, an outside blower 8, an electric heater 9, and a controller 10. The cooling device 1 is fixed to the inside of a door 2A (see FIGS. 50 and 54) which is provided on the front side (left side in FIG. 46) of the housing 2.

Within the casing 5 are formed an inside heat transfer space 12 and an outside heat transfer space 13 by means of a partition plate 11 and fan cases (described later) of the inside and outside blowers 7 and 8, respectively. In the front face of the casing 5 are formed an upper opening (air outlet port of the outside blower 8) 14 and a lower opening (outside air intake port) 15 for communicating the outside heat transfer space 13 with the outside (outside air) of the housing 2. Thread holes 14a and 15a are formed around the openings 14 and 15 of the casing 5, and bolts 16 are fastened with the thread holes 14a and 15a from outside the door 2A, so that the casing 5 is fixed to the door 2A (see FIG. 54). Between the door 2A and the casing 5 are disposed packings 17 around the openings 14 and 15 to ensure air-tightness.

Also in the door 2A of the housing 2 to which is mounted the casing 5 are formed an upper opening 18 (see FIG. 54) and a lower opening (not shown) at positions opposed to the openings 14 and 15. To prevent the entry of water drops such as rain water and foreign materials such as dust from the upper opening 18, the door 2A is provided with a louver or a filter (both not shown).

Figure 48:
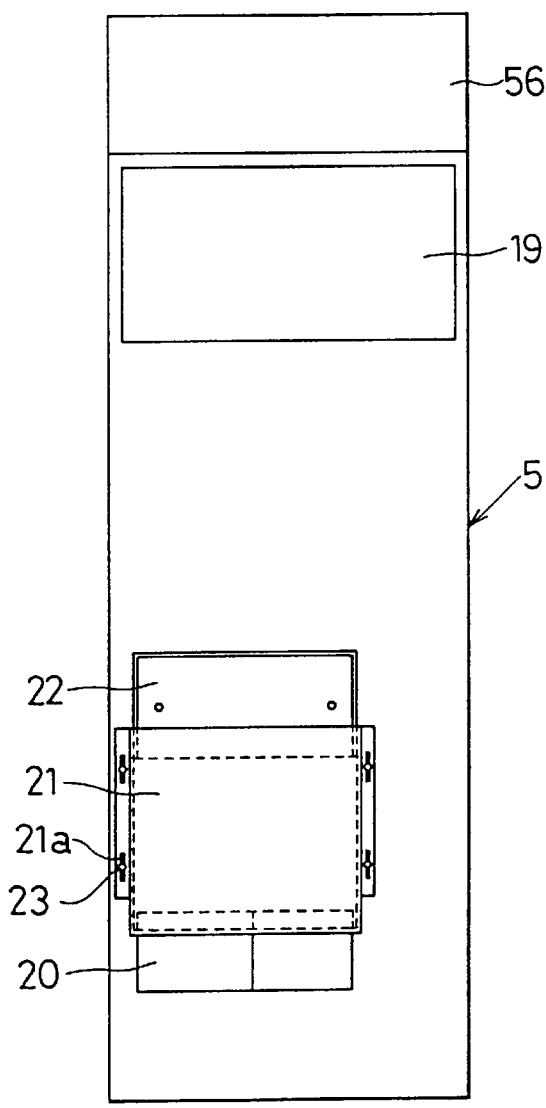
FIG. 48 is a rear view of the casing in the seventh embodiment.

In the rear face of the casing 5, as shown in FIG. 48, there are formed an upper opening (air intake port) 19 and a lower opening (air outlet port of the inside blower) 20 for communicating the inside heat transfer space 12 with the closed space 3 in the housing 2, and is also formed a communication port 22 for communicating with the lower opening 20 through a duct 21. The duct 21 has a width which covers the whole width of the opening 20 and is fixed to the rear side of the casing 5 by passing screws 23 into four slide holes 21a formed in both ends. Since the slide holes 21a are formed long, by changing the position (height) in the slide holes 21a to be fixed with screws 23, the duct 21 can slide vertically within the range of the slide holes. Therefore, by sliding the duct 21 vertically to change its mounting position relative to the casing 5, the opening ratio between the opening 20 and the communication port 22 can be changed freely.

Figure 49:
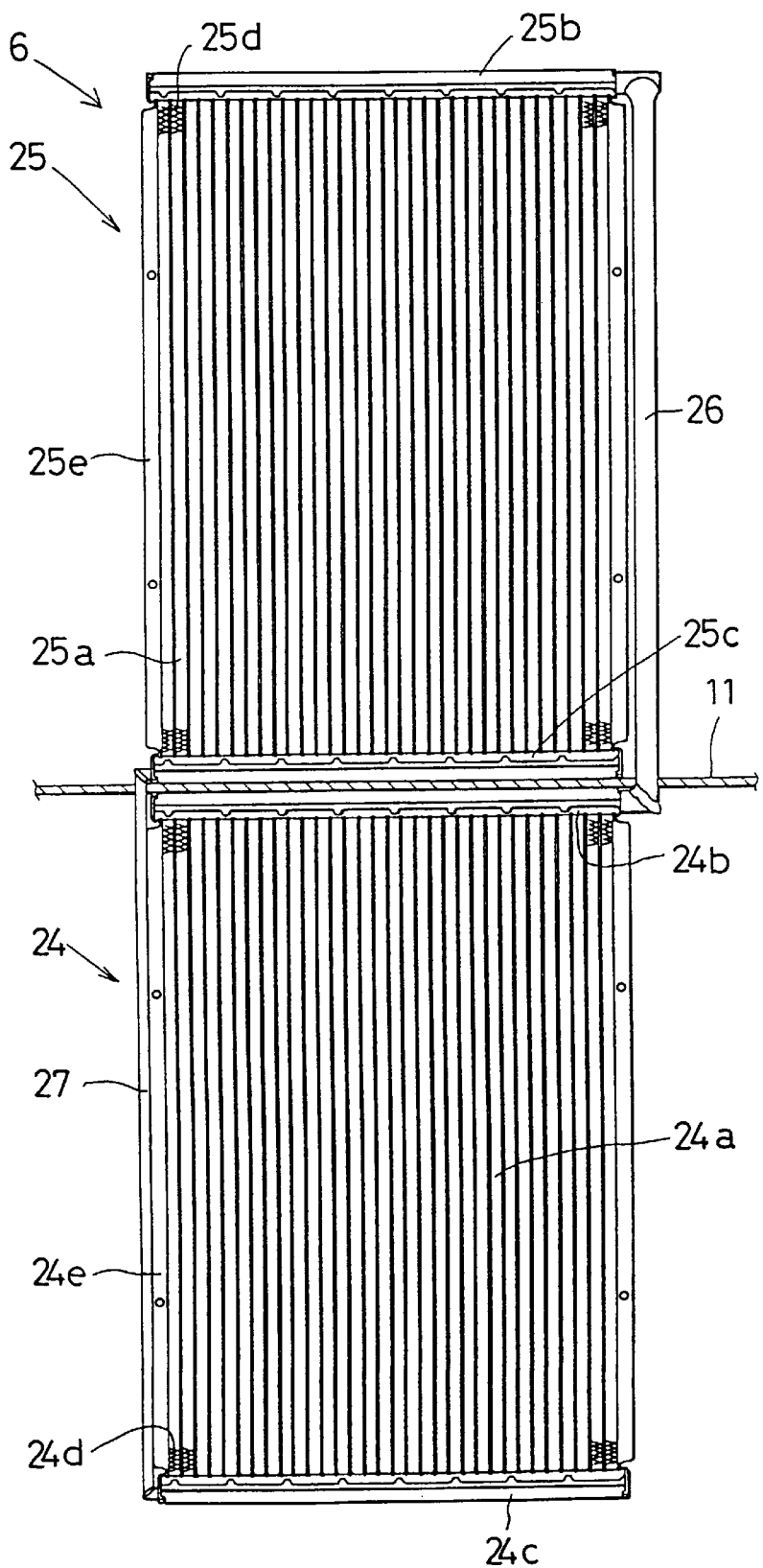
FIG. 49 is a front view of a heat exchanger in the seventh embodiment.

As shown in FIG. 49, the heat exchanger 6 has a boiling portion 24, a condensing portion 25, and a first connecting pipe 26 and a second connecting pipe 27 for connection between the boiling portion 24 and the condensing portion 25. A chlorofluorocarbon type or freon type refrigerant is sealed in the heat exchanger 6.

The boiling portion 24 includes a plurality of cooling tubes 24a, an upper tank 24b and a lower tank 24c for communicating the cooling tubes 24a with each other, heat receiving fins 24d interposed between adjacent cooling tubes 24a, and side plates 24e. The boiling portion 24 is located in the inside heat transfer space 12 within the casing 5.

The cooling tubes 24a are flat tubes (e.g., 1.7 mm wide, and 16.0 mm long) having an elongated rectangular or oblong cross section. For example, the tubes 24a are formed of a metallic material having a superior heat conductivity such as aluminum or copper.

The upper tank 24b and the lower tank 24c are each composed of a core plate connected to the cooling tubes 24a and a tank plate joined to the core plate. Either one of the upper tank 24b and the lower tank 24c is formed with a single refrigerant inlet (not shown) for sealing a refrigerant into the cooling tubes 24a. The refrigerant is sealed into the tubes 24a up to a level almost equal to the upper end of each tube 24a (see FIG. 50). The refrigerant is sealed by sealing-off or using a service valve (check valve) (not shown) after the heat receiving fins 24d is soldered to the cooling tubes 24a.

The heat receiving fins 24d are corrugated fins formed by folding a thin metallic sheet (e.g., 0.02–0.50 mm in thickness) having a superior thermal conductivity, such as aluminum, alternately into a corrugated shape. The fins 24d are soldered to flat outer wall surfaces of the cooling tubes 24a.

The side plates 24e provided on both sides of the boiling portion 24 are fixed to the partition plate 11 and the casing 5, with fastening means (not shown) such as screws for example. The side plates 24e also function to reinforce the boiling tubes 24a and the heat receiving fins 24d.

The condensing portion 25 includes a plurality of cooling tubes 25a, an upper tank 25b and a lower tank 25c for communicating the cooling tubes 25a with each other, radiating fins 25d interposed between adjacent cooling tubes 25a, and side plates 25e. The condensing portion 25 is located in the outside heat transfer space 13 within the casing 5.

The cooling tubes 25a are formed in the same shape as the cooling tubes 24a in the boiling portion 24, by using a metallic material having a superior thermal conductivity, such as aluminum or copper.

The upper tank 25b and the lower tank 25c include a core plate connected to the cooling tubes 25a and a tank plate joined to the core plate. The radiating fins 25d, like the heat receiving fins 24d, are corrugated fins formed of a thin metallic sheet having a superior thermal conductivity, such as aluminum. The radiating fins 25d are soldered to flat wall surfaces of the cooling tubes 25a.

The side plates 25e are provided on both sides of the condensing portion 25 are fixed to the partition plate 11 and the casing 5, with fastening means such as screws. Like the side plates 24e in the boiling portion 24, the side plates 25e also function to reinforce the cooling tubes 25a and the radiating fins 25d.

A first connecting pipe 26 is for introducing the vapor of the refrigerant which has been boiled and vaporized in the cooling tubes 24a of the boiling portion 24 to the condensing portion 25. The first connecting pipe 26 connects the upper tank 24b in the boiling portion 24 to the upper tank 25b in the condensing portion 25 through the partition plate 11. A second connecting pipe 27 is for introducing the liquid of the refrigerant which has been condensed in the cooling tubes 25a of the condensing portion 25 to the boiling portion 24. The second connecting pipe 27 connects the lower tank 24c in the boiling portion 24 to the lower tank 25c in the condensing portion 25 through the partition plate 11. The first and second connecting pipes 26 and 27 are formed to have a circular cross section by using the same metallic material as that of the cooling tubes 24a and 25a. The diameter of the first connecting pipe 26 through which the refrigerant vapor flow is set to be larger than that of the second connecting pipe 27 through which the refrigerant liquid flows.

Figure 51:
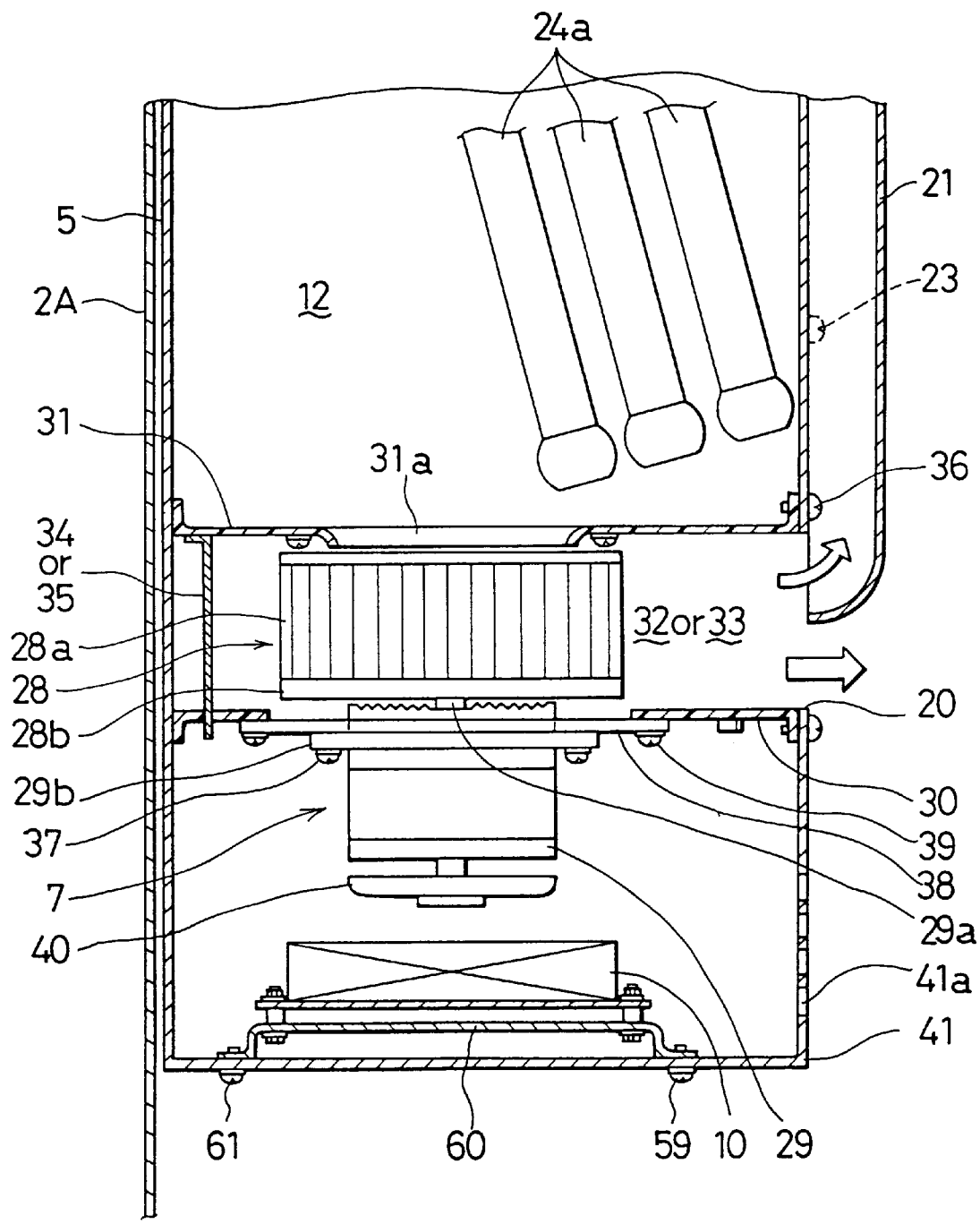
FIG. 51 is a cross sectional view showing a mounted state of an inside blower in the seventh embodiment.

As shown in FIG. 51, the inside blower 7 is disposed in the lower portion of the casing 5 (below the inside heat transfer space 12) such that air circulates between the closed space 3 in the housing 2 and the inside heat transfer space 12 formed in the casing 5.

The inside blower 7 includes a fan case (described later), a centrifugal fan 28, and a drive motor 29.

Figure 52:
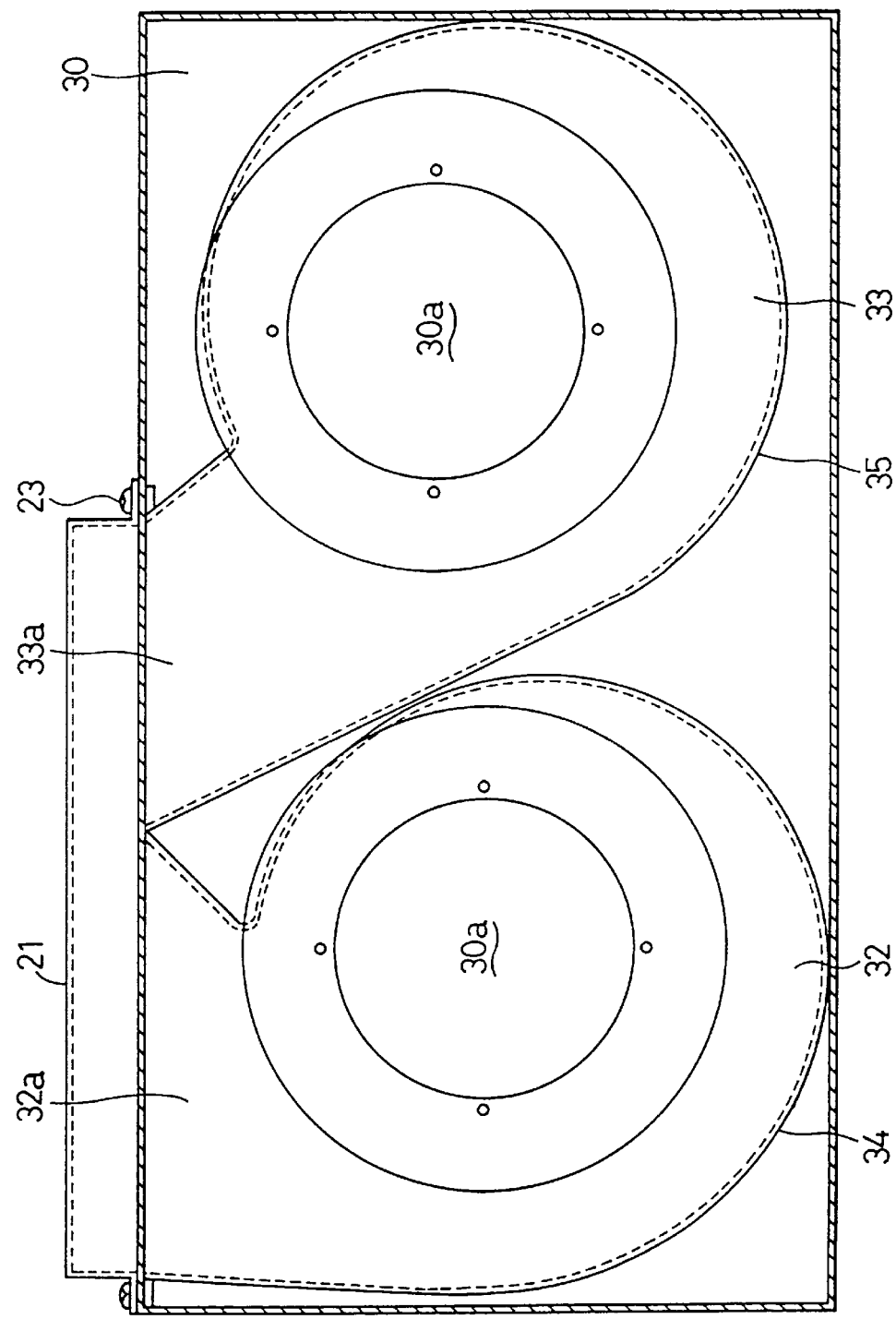
FIG. 52 is a plan view showing air paths in the inside blower in the seventh embodiment.

The fan case is formed by two outer plates 30 and 31 having rectangular plan surfaces, a wall surface of the casing 5 which forms a side face between the two outer plates 30 and 31, and two side wall plates 34 and 35 which are sandwiched between two outer plates 30 and 31 to form scroll-shaped air paths 32 and 33 (see FIG. 52).

Of the two outer plates, one outer plate 30 is formed with two circular openings 30a (see FIG. 52) for receiving centrifugal fans 28, while the other outer plate 31 is formed with two bell-mouth-shaped air intake ports 31a at positions opposed to the openings 30a of the one outer plate 30.

Figure 53:
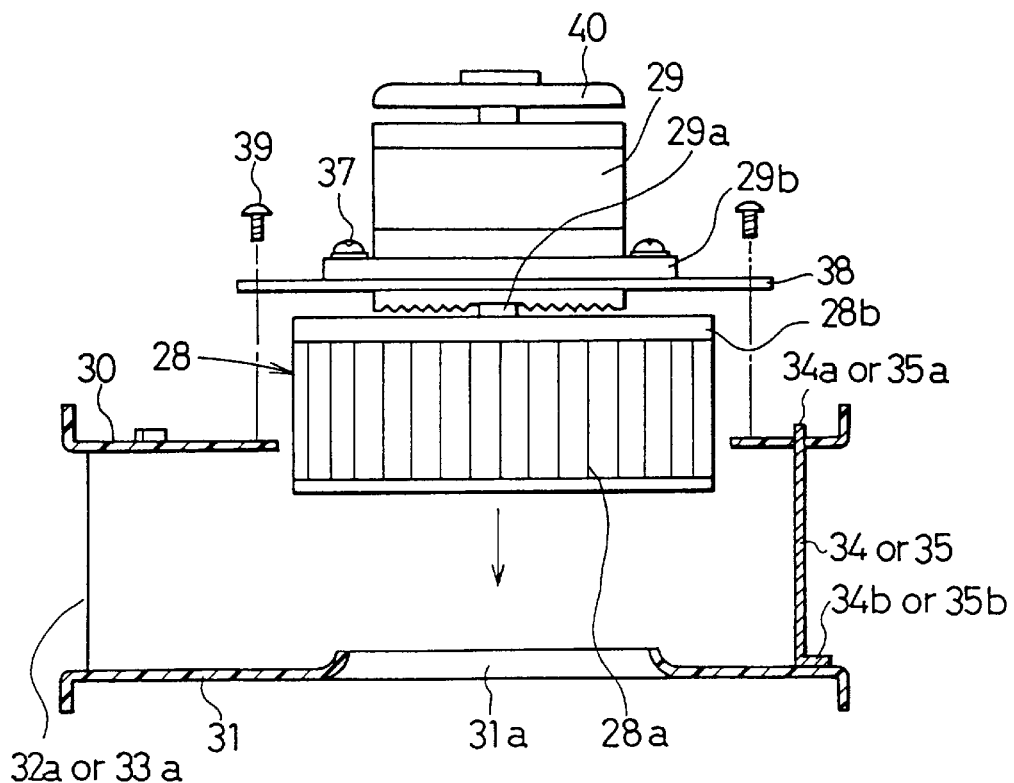
FIG. 53 is an exploded view of the inside blower in the seventh embodiment.

As shown in FIG. 52, the two side wall plates 34 and 35 are bent in a predetermined scroll shape and are disposed side by side on the planes of the outer plates 30 and 31. On one sides and the opposite sides of the side wall plates 34 and 35 are formed plural projections 34a, 35a and 34b, 35b, respectively, as shown in FIG. 53. The projections 34a and 35a formed on one sides are fitted in fitting holes formed in one outer plate 30, while the projections 34b and 35b formed on the other sides are bent at right angles and welded to the other outer plate 31. The two side wall plates 34 and 35 are disposed so that outlets 32a and 33a of two air paths 32 and 33 are adjacent to each other (see FIG. 52).

The two outer plates 30 and 31, to which side wall plates 34 and 35 are fixed, are fixed to the casing 5 with fastening means 36 such as screws in such a manner that the outlets 32a and 33a of the air paths 32 and 33 coincide with the lower opening 20 formed in the rear side of the casing 5 (see FIG. 51). The side face between the two outer plates 30 and 31, other than the outlets 32a and 33a, is constructed by the wall surface of the casing 5. Thus, the outer case having a box-shaped structure is constructed by the two outer plates 30, 31 and the wall surface of the casing 5 which forms a side face between both outer plates.

As shown in FIGS. 51 and 53, the centrifugal fan 28 includes a plurality of blades 28a disposed in the circumferential direction and a disc-shaped support plate 28b for supporting the blades 28a. The support plate 28b is fixed onto an output shaft 29a of a drive motor 29.

Upon receipt of an ON signal from the controller 10, the drive motor 29 drives the centrifugal fan 28 to rotate the fan. A stay 29b of a motor housing is fixed to a mounting plate 38 with screws 37 or the like, and the mounting plate 38 is fixed to one outer plate 30 with fastening means 39 such as screws, so that the drive motor 29 is mounted to the fan case. A cooling fan 40 is mounted on the output shaft 29a of the drive motor 29. While the cooling fan 40 is rotated, the outside air is blown to the drive motor 29 to cool the motor. The outer periphery of the drive motor 29 is covered with a motor cover 41 (part of the casing 5), and vent holes 41a communicating with the closed space 3 in the housing 2 are formed in the motor cover 41.

Figure 54:
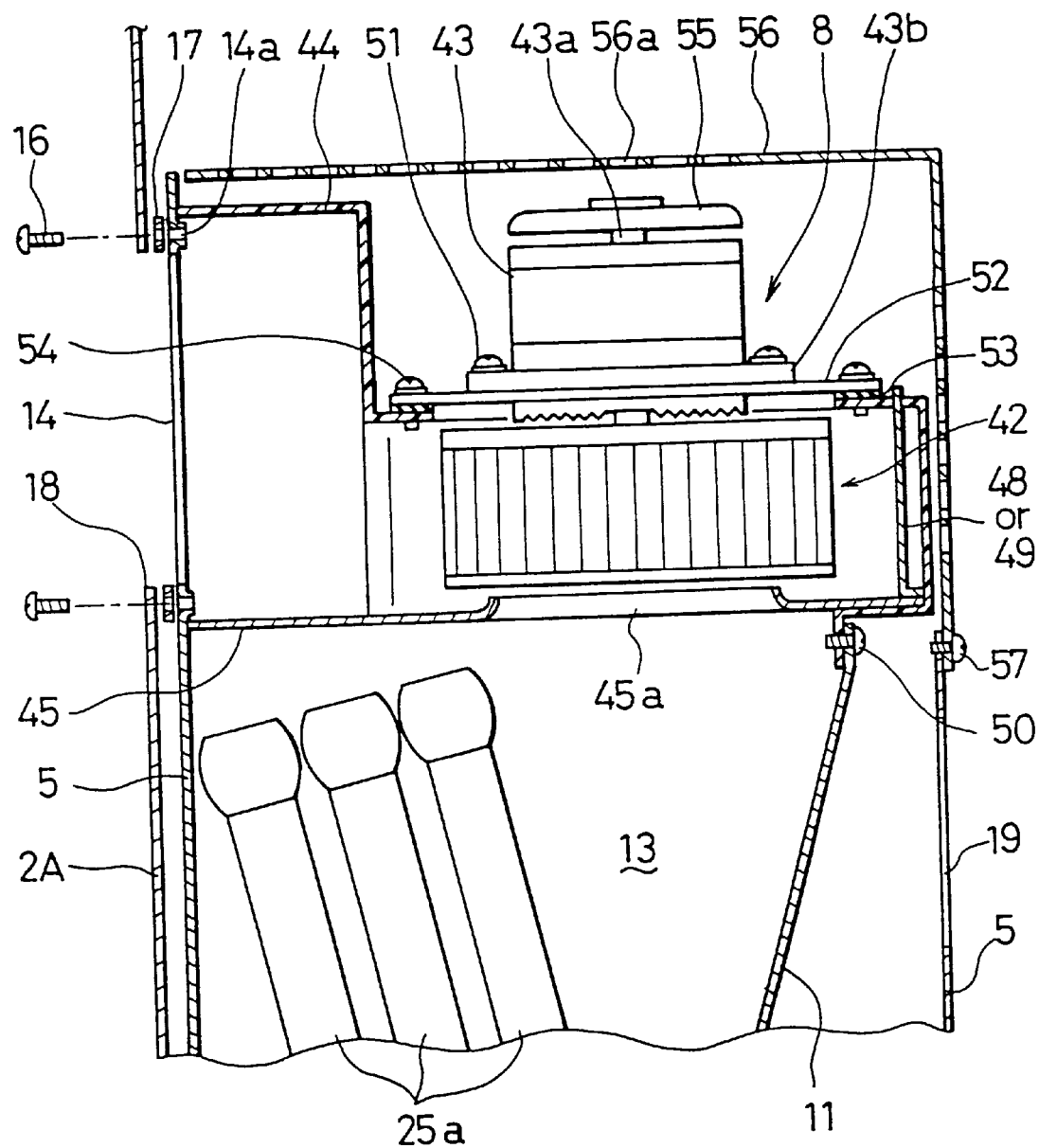
FIG. 54 is a cross sectional view showing a mounted state of an outside blower in the seventh embodiment.

As shown in FIG. 54, the outside blower 8 is disposed in the upper portion (above the outside heat transfer space 13) of the casing 5 such that air circulates between the outside (outside air) of the housing 2 and the outside heat transfer space 13 in the casing 5.

The outside blower 8 includes a fan case (described below), a centrifugal fan 42 and a drive motor 43.

Figure 55:
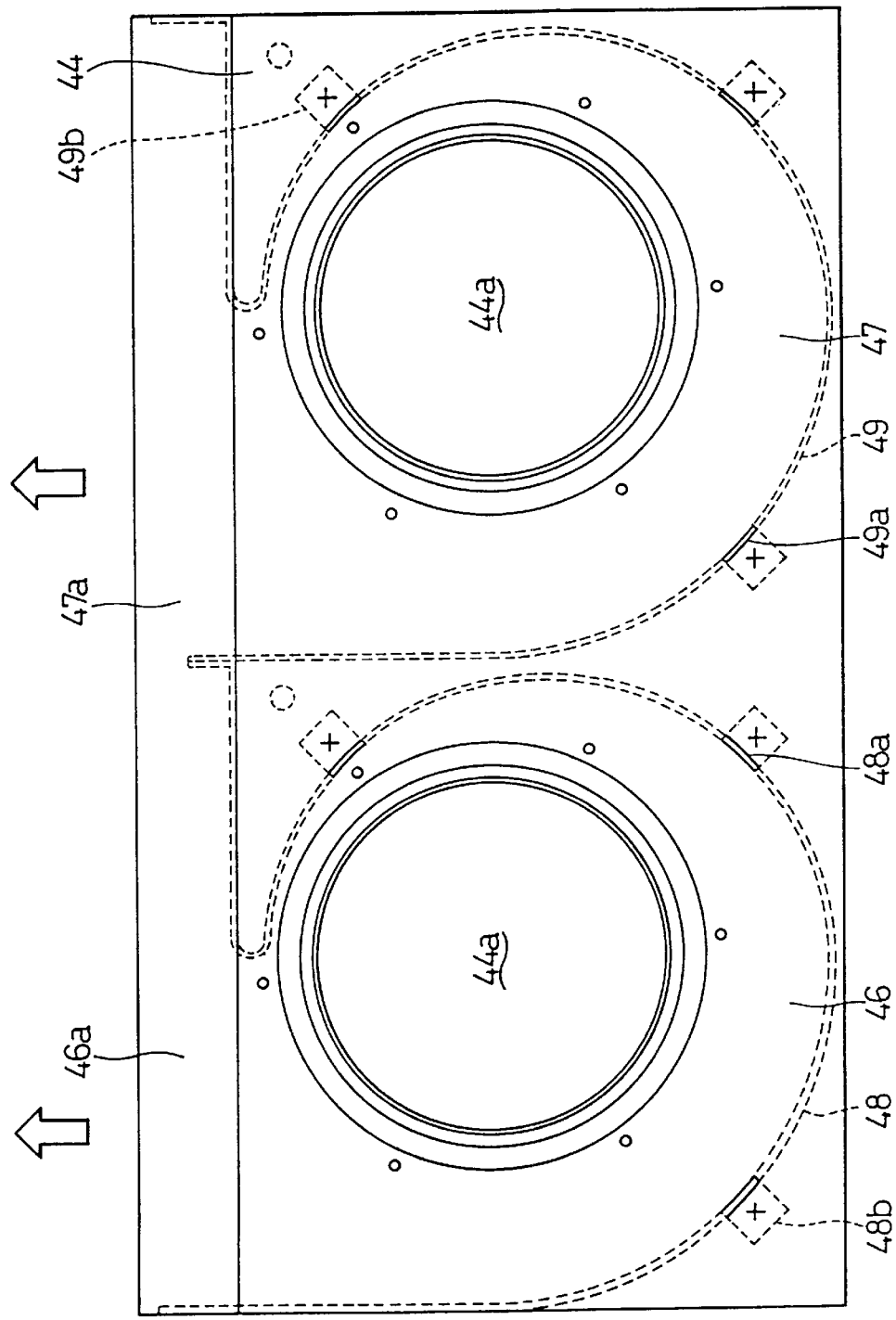
FIG. 55 is a plan view showing air paths in the outside blower in the seventh embodiment.
Figure 57:
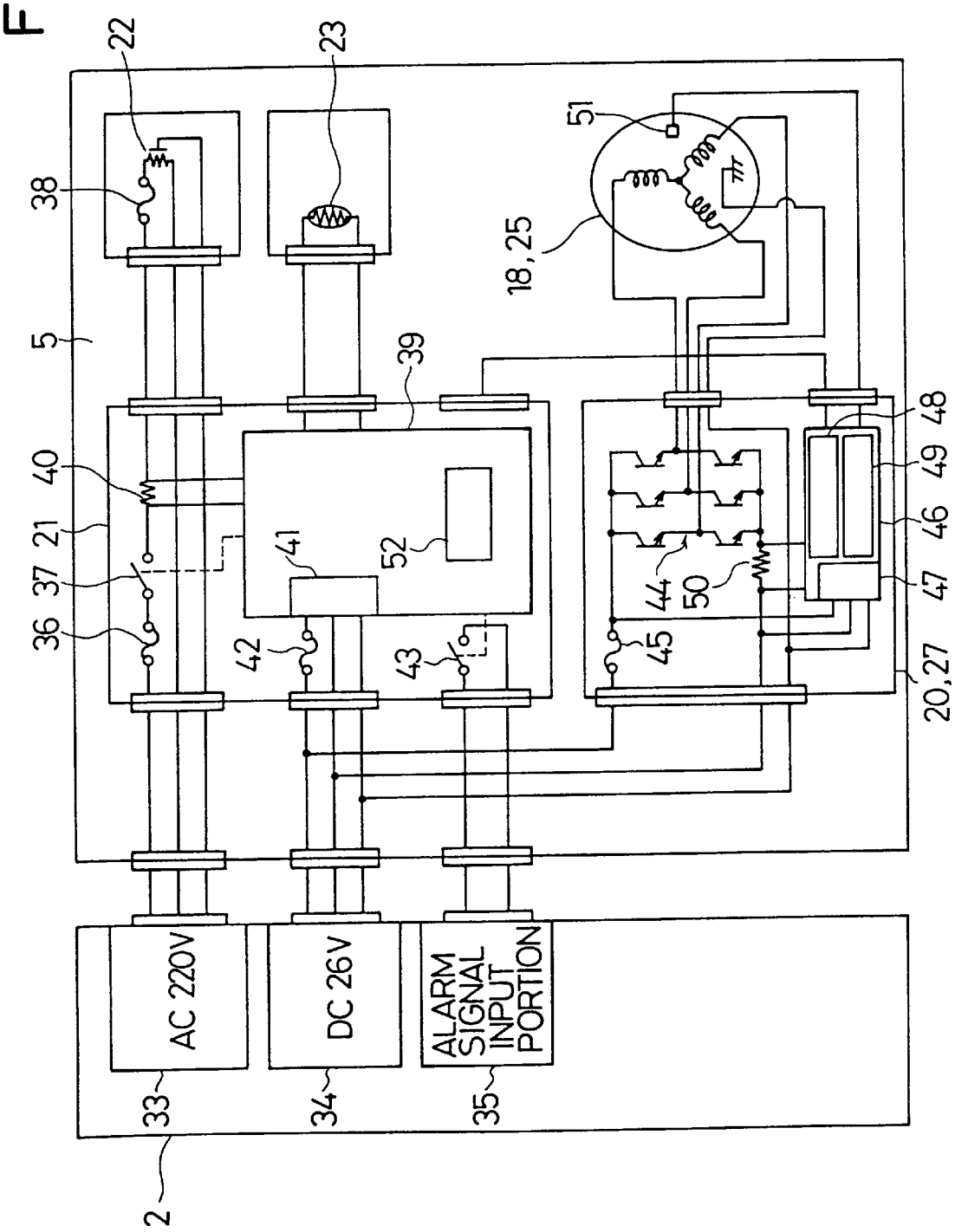
FIG. 57 is a schematic diagram showing an electrical configuration according to an eighth embodiment of the present invention.

The fan case includes two outer plates 44, 45 having a rectangular plan surfaces, a wall surface of the casing 5 which forms a side face between the two outer plates 44 and 45, and two side wall plates 48 and 49 which are sandwiched between the two outer plates 44 and 45 to form scroll-shaped air paths 46 and 47 (see FIG. 55).

In one outer plate 44 out of the two are formed two circular openings 44a (see FIG. 55) for receiving centrifugal fans 42, while in the other outer plate 45 are formed two air intake ports 45a of a bell-mouth shape at positions opposed to the opening 44a of one outer plate 44. To expand the outlet opening area of the air paths 46 and 47, as shown in FIG. 54, one outer plate 44 is bent at right angles to the outside (upper side in FIG. 54) at its end portion on the side of the outlet 46a and 47a, then is further bent at right angles to the front side. The rear end side of one outer plate 44, for forming a rear end face of the fan case, is bent at right angles toward the other outer plate 45 (lower side in FIG. 54), then is further bent at right angles to the front side, and is fixed to the other outer plate by spot welding for example.

As shown in FIG. 55, the two side wall plates 48 and 49 are each bent into a predetermined scroll shape and are disposed side by side on the planes of the outer plates 44 and 45. on one and opposite sides of the side wall plates 48 and 49 are formed plural projections 48a, 49a and 48b, 49b, respectively. The projections 48a and 49b formed on one sides are inserted into fitting holes formed in one outer plate 44, while the projections 48b and 49b formed on the other sides are bent at right angles and welded to the other outer plate 45.

The two outer plates 44 and 45, to which the side wall plates 48 and 49 are fixed, are fixed at front end portions thereof to the front side of the casing 5 by spot welding for example so that outlets of the air paths 46 and 47 coincide with the upper opening 18 formed in the front side of the casing 5. The rear end portion of one outer plate 44 is secured to the partition plate 11 with screws 50 or the like (see FIG. 54). The side face between the two outer plates 44 and 45, other than the outlet 46a, 47a side and the rear end face, is constructed by the wall surface of the casing 5. Thus, the outer case of a box-shaped structure is constructed by the two outer plates 44, 45 and the wall surface of the casing 5 which forms the side face between the outer plates. In this fan case, since one outer plate 44 is used as one wall surface which partitions air-tightly between the closed space 3 and the outside heat transfer space 13, there are provided sealing materials between one outer plate 44 and the wall surface of the casing 5, in the gap between the projection 48a on the other outer plate 45 and the fitting hole in the one outer plate 44, and further between one outer plate 44 and the partition plate 11, to ensure air-tightness.

Figure 56:
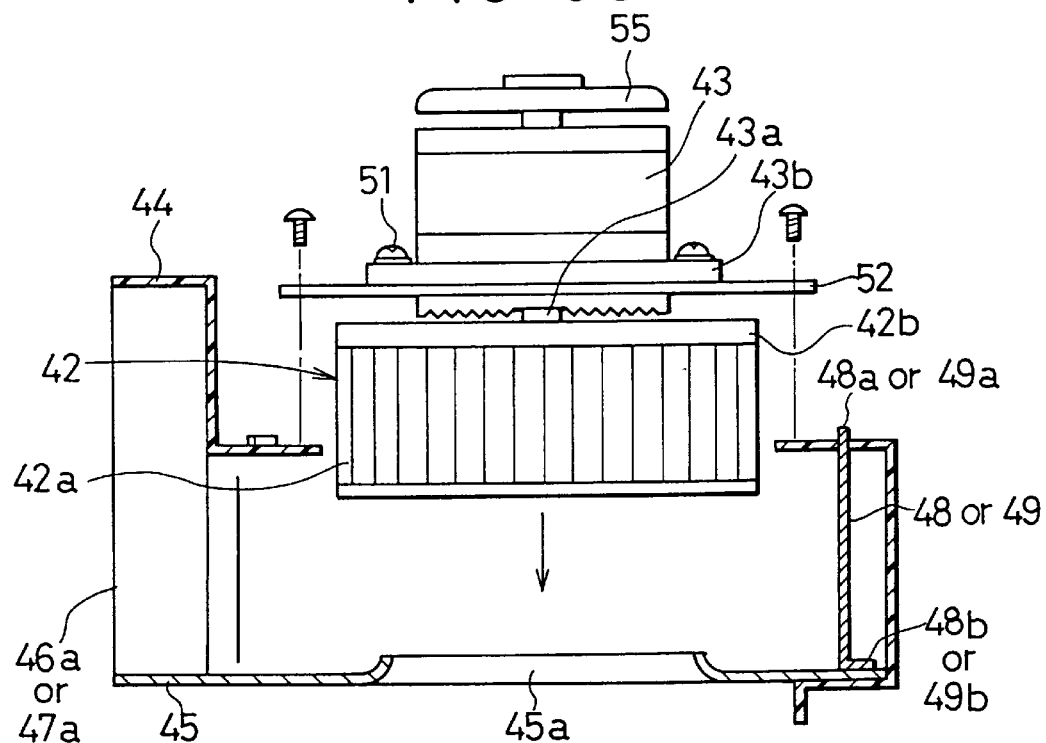
FIG. 56 is an exploded view of the outside blower in the seventh embodiment.

As shown in FIGS. 54 and 56, the centrifugal fan 42 includes a plurality of blades 42a disposed in the circumferential direction and a support plate 42b for supporting the blades 42a. The support plate 42b is fixed to an output shaft 43a of the drive motor 43.

Upon receipt of an ON signal from the controller 10, the drive motor 43 drives the centrifugal fan 42 to rotate the fan. A stay 43b of a motor housing is fixed to a mounting plate 52 with screws 51, and the mounting plate 52 is fixed to one outer plate 44 with fastening means 54 such as screws through packing 53, so that the drive motor 43 is mounted to the fan case. Further, a cooling fan 55 is mounted on an end portion of the output shaft 43a of the drive motor 43. While the cooling fan 55 is rotated, the outside air is blown to the drive motor 43 to cool the motor. The outer periphery of the drive motor 43 is covered with a motor cover 56, and a vent hole 56a communicating with the closed space 3 in the housing 2 is formed in the motor cover 56. The motor cover 56 is fixed to the casing 5 with screws 57 or the like.

The electric heater 9 is disposed in the inside heat transfer space 12 within the casing 5 and on the air downstream side of the boiling portion 24 of the heat exchanger 6. When the temperature in the closed space 3 within the housing is low (e.g., 0° C. or lower), the electric heater 9 heats the air in the inside heat transfer space 12 which communicates with the closed space 3 to prevent the deterioration in performance of the electronic components 4 accommodated within the closed space 3.

On the basis of the temperature detected by a temperature sensor 58 (see FIG. 46) which is a temperature-sensitive element such as a thermistor, the controller 10 controls the supply of an electricity to such electric devices as electric heater 9, inside blower 7 and outside blower 8. More specifically, when the temperature detected by the temperature sensor 58 is higher than a lower-limit temperature (e.g., 0° C.), the controller 10 rotate the inside and outside blowers 7 and 8 at a Hi-operation (a large amount of air) or a Lo-operation 8 (a small amount of air) and turn OFF the electric heater 9. When the temperature detected by the temperature sensor 58 is lower than the lower-limit temperature, the controller 10 turns OFF the outside blower 8, rotates the inside blower 7 at the Hi-operation or the Lo-operation, and turns ON the electric heater 9. A support base 60 is fixed with screws 59 or the like to the bottom of the casing 5 which forms the motor cover 41, and the controller 10 is fixed to the support base 60 with fastening means 61 such as bolt and nut (see FIG. 51).

An operation of this embodiment will now be described.

Within the housing 2, the air temperature in the closed space 3 rises due to heat generated by the operation of the electronic components 4. Therefore, it is necessary to reduce the air temperature in the closed space 3 in order to cool the electronic components 4. If the temperature detected by the temperature sensor 58 is higher than the lower-limit temperature (e.g., 0° C.), the drive motor 29 for the inside blower 7 and the drive motor 43 for the outside blower 8 are electrified through the controller 10. In this way, the inside blower 7 generates a flow of air circulating through both inside heat transfer space 12 in the casing 15 and the closed space 3 in the housing 2. Further, upon operation of the outside blower 8, the outside air flows through the outside heat transfer space 13 in the casing 5.

Figure 50:
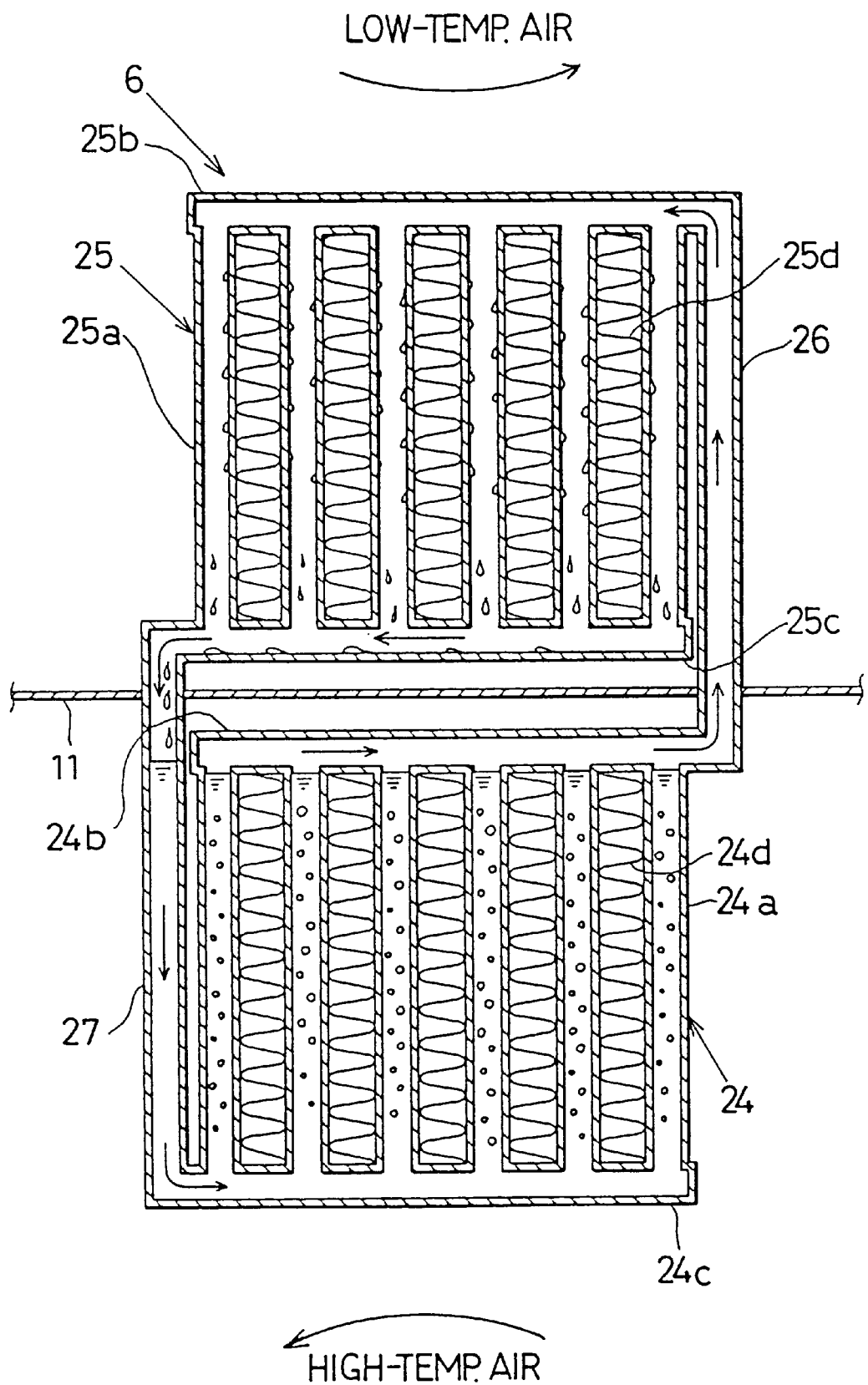
FIG. 50 is a schematic diagram for explaining an operation of the heat exchanger in the seventh embodiment.

In the heat exchanger 6, as shown in FIG. 50, the refrigerant sealed in the cooling tubes 24a of the boiling portion 24 receives heat through the heat receiving fins 24d from the high-temperature air flowing through the inside heat transfer space 12, and boils and vaporizes. The refrigerant vapor passes through the first connecting pipe 26 from the upper tank 24b in the boiling portion 24 and is introduced to the upper tank 25b in the condensing portion 25, then is condensed on the inner wall surfaces of the cooling tubes 25a which are exposed to the outside air (low-temperature air) and low in temperature. At this time, latent heat of condensation of the refrigerant is radiated through heat radiating fins 25d to the outside air flowing through the outside heat transfer space 13.

The refrigerant thus condensed in the condensing portion 25 drops along the inner wall surfaces of the cooling tubes 25b into the lower tank 25c due to its own weight, then passes through the second connecting pipe 27, is introduced to the lower tank 24c in the boiling portion 24, and is supplied from the lower tank 24c in the boiling portion 24 to each of the cooling tubes 24a again. In this way, vaporization and condensation of the refrigerant are repeated alternately, and the heat of the high-temperature air flowing through the inside heat transfer space 12 can be radiated to the outside air flowing through the outside heat transfer space 13.

The air after passing the boiling portion and cooled is sucked into the fan case through the air intake ports 31a of the inside blower 7, flows through the air paths 46 and 47, then is distributed into air which is blown out directly from the lower opening (air outlet port 20) and air which passes through the duct 21 and is blown out from the communication port 22. In this way, the air is blown to each of the electronic components 4 to cool the electronic components 4. At this time, by adjusting the height of the duct 21 attached to the casing 5 to appropriately change the opening ratio between the lower opening 20 and the communication port 22, it becomes possible to change the ratio between the amount of air blown out from the lower opening 20 and air blown out from the communication port 22.

In this embodiment, since the duct 21 is mounted vertically slidably relative to the casing, the ratio in the amount of air blown out from the lower opening 20 and air blown out from the communication port 22 can be changed as necessary according to the vertical position of the duct 21. As a result, it becomes possible to blow cool air at an appropriate distribution ratio according to the amount of heat generated from each of the electronic components 4 accommodated within the closed space 3. Thus, each of the electronic components 4 can be cooled effectively. In addition, a single cooling devise can cool plural electronic devices.

Further, in the inside blower 7, since the side wall plates 34 and 35 are sandwiched between the two outer plates 30 and 31 to form the air paths 32 and 33, the shape of the air paths 32 and 33 can be changed easily merely by changing the scroll shape of the side plates 34 and 35,. In this way, it is possible to change the blowing direction of air.

The duct 21 may be mounted so as to slide transversely, not vertically. In the above embodiment, there is employed only one duct 21; however, there may be employed plural ducts, or a duct which branches halfway.

An eighth embodiment of the present invention will be described.

Figure 58:
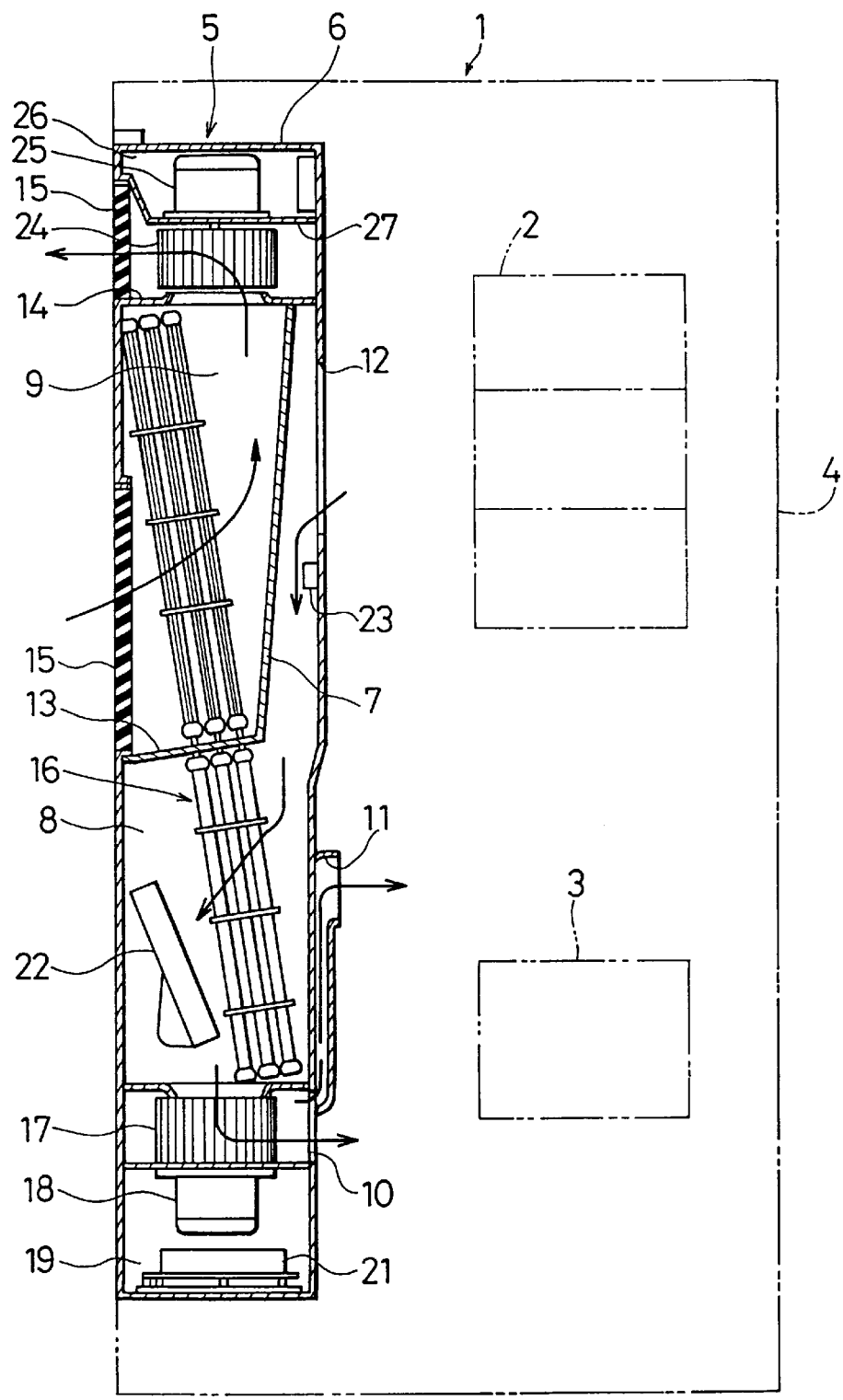
FIG. 58 is a vertical sectional view of a cooling device in the eighth embodiment.

FIG. 58 shows a cross section of an entire structure of an electronic system 1. In FIG. 58, the electronic system 1 is, for example, a radio base station of a mobile radiotelephone such as cordless telephone or car telephone and includes a housing 4 and a cooling device 5 which air-tightly seals a front opening of the housing 4, with an electronic device 2 and a power supply 3 being incorporated in the housing.

The cooling device 5 will be described below with reference to FIGS. 59 and 60. FIG. 59 is a front view of the cooling device, and FIG. 60 is a rear view of the same system.

An interior of a system body 6 is separated into a high-temperature space 8 and a low-temperature space 9 by means of a fluid separation plate 7.

The high-temperature space 8 communicates with the interior of the housing 4 through an exhaust port 10 and an exhaust duct 11 both formed on the rear side of the system body 6 and also through an intake port 12 (see FIG. 60). The low-temperature space 9 communicates with the exterior through an intake port 13 and an exhaust port 14 both formed on the front side of the system body 6. A louver 15 (see FIG. 59) is mounted to each of the intake port 13 and the exhaust port 14 to prevent the entry of comparatively large foreign materials or rain droplets into the system body 6.

A heat exchanger 16 is disposed to pass through the fluid separation plate 7. A lower half portion of the heat exchanger 16 is positioned in the high-temperature space 8 and is exposed to the air in the housing 4, while an upper half portion thereof is positioned in the low-temperature space 9 and is exposed to the outside air.

Two high-temperature-side fans (Scirocco fans) 17 are disposed side by side on the bottom of the high-temperature space 8, and high-temperature-side fan motors 18 for rotating the high-temperature-side fans 17 are disposed in a machine chamber 19. Drivers 20 and a control unit 21 (see FIG. 60) are also disposed in the machine room 19 to control the rotation of the high-temperature-side fan motors 18. When the high-temperature-side fan motors 18 are driven by the drivers 20, a circulation air path (indicated with arrow in FIG. 58) is formed between the high-temperature space 8 and the housing 4 by the high-temperature-side fans 17. Further, an electric heater 22 is disposed in the high-temperature space 8 and, when electrified, heats the air passing through the space 8.

In the high-temperature space 8, a temperature sensor 23 is disposed in the vicinity of the intake port 12 to detect the temperature of air which enters the high-temperature space 8 through the intake port 12.

On an upper surface of the low-temperature space 9 are disposed two low-temperature-side fans (Scirocco fans) 24 side by side, and low-temperature-side fan motors 25 for rotating the low-temperature-side fans 24 are disposed in a machine chamber 26. In the machine chamber 26 are also disposed drivers 27 for controlling the rotation of the low-temperature-side fan motors 25. When the fan motors 25 are driven by the drivers 27, an outside air inflow path (indicated with arrow in FIG. 58) to the low-temperature space 9 is formed by the low-temperature-side fans 24.

The heat exchanger 16 disposed through the fluid separation plate 7 will be described.

Figure 61:
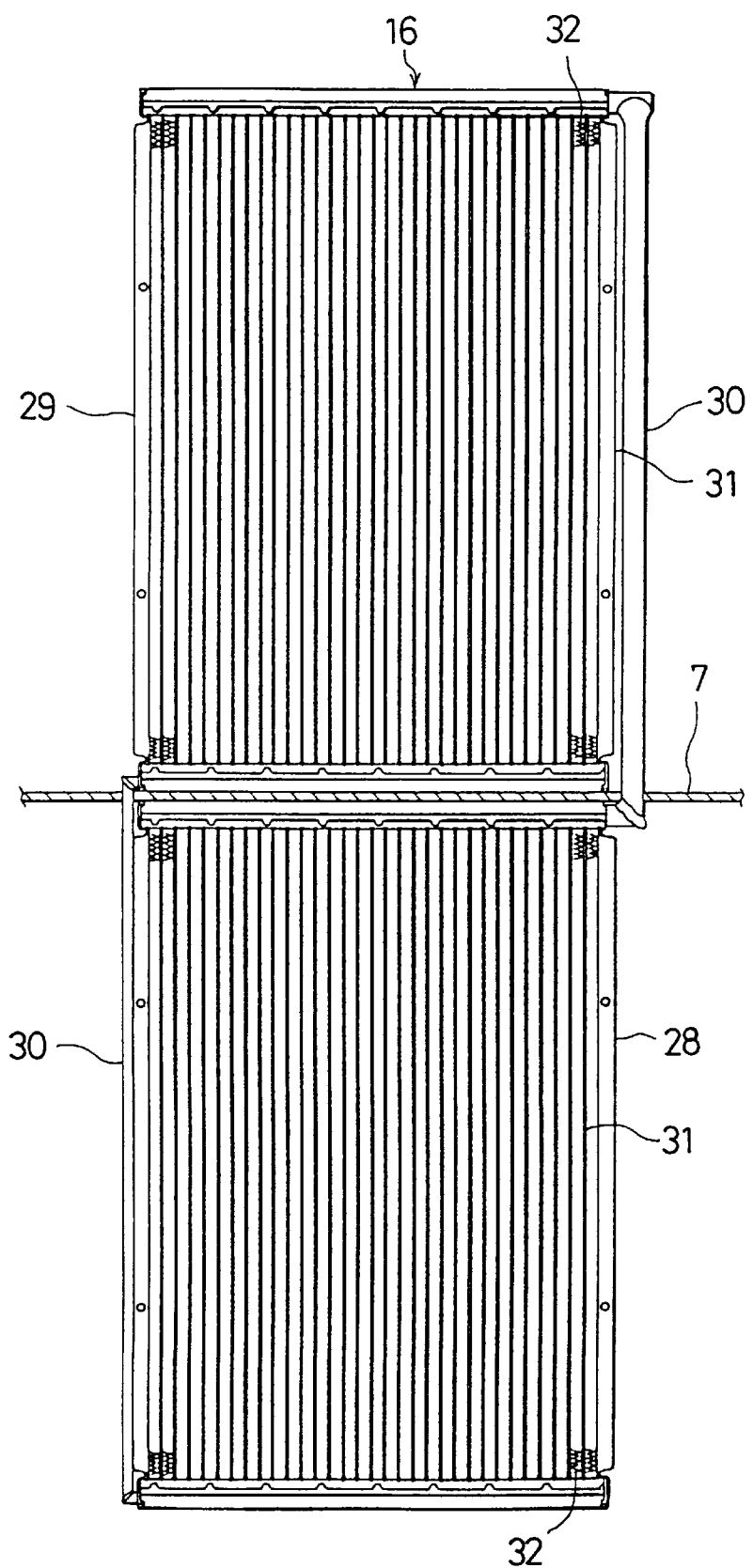
FIG. 61 is a front view of a heat exchanger in the eighth embodiment.
Figure 62:
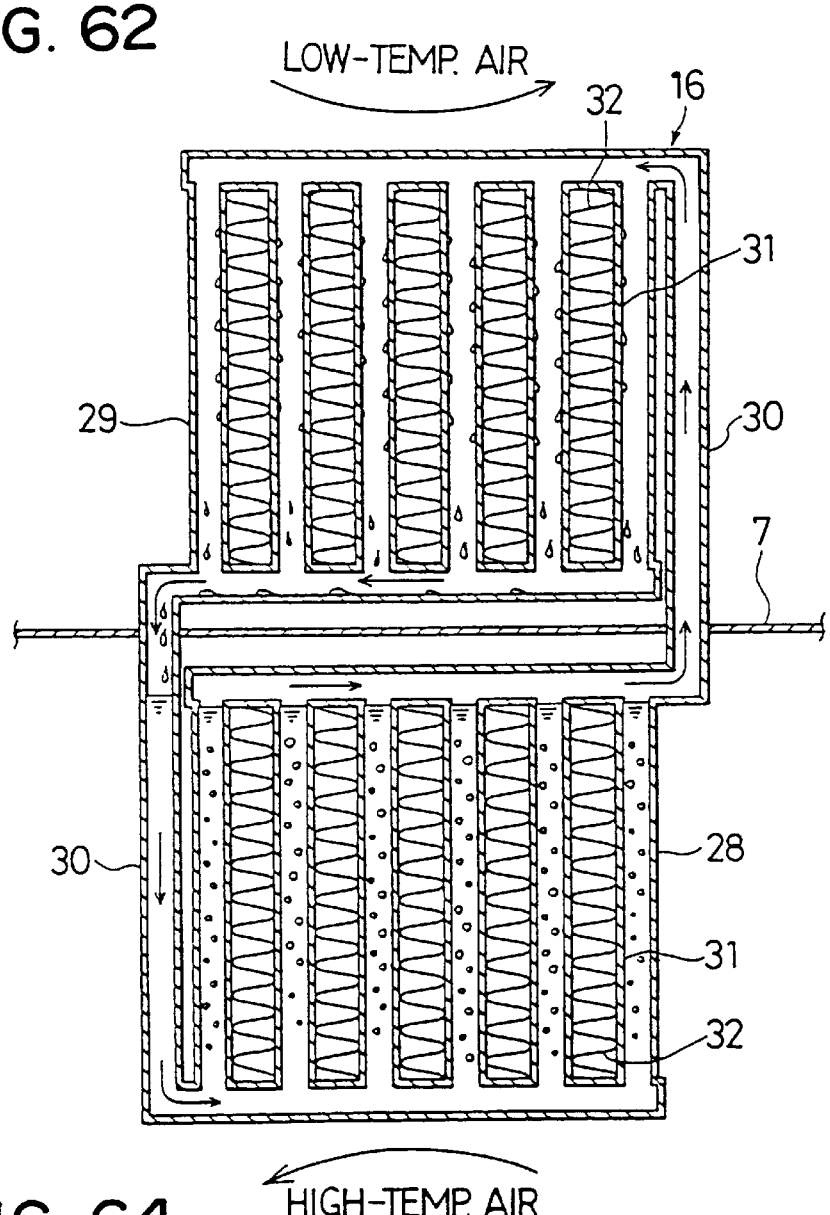
FIG. 62 is a schematic diagram showing a cross section of the heat exchanger in the eighth embodiment.

FIG. 61 is a front view of the heat exchanger 16, and FIG. 62 is a schematic sectional view thereof. In these figures, the heat exchanger 16 is divided into two sections which are a high-temperature-side heat exchanger portion 28 positioned in the high-temperature space 8 and a low-temperature-side heat exchanger portion 29 positioned in the low-temperature space 9. The heat exchanger portions 28 and 29 are connected to each other through connecting pipes 30. A chlorofluorocarbon type or freon type refrigerant is sealed in a nearly full condition into the high-temperature-side heat exchanger portion 28. Since the heat exchanger portion 28 is positioned in the high-temperature space 8 separated from the outside, the heat exchanger portion 28 is not exposed to the outside air containing foreign materials such as dust and moisture.

The high- and low-temperature-side heat exchanger portions 28 and 29 are constituted in the shape of a multiple flow path wherein a plurality of cooling tubes 31 having a rectangular cross section are connected to each other with corrugated fins 32, through which air passes.

FIG. 58 schematically illustrates an entire electrical configuration. In FIG. 58, the electronic device 2 disposed in the housing 4 constitute a system in a radio base station and is provided with an AC 220 V power supply 33, a DC 26 V power supply 34, and an alarm signal input portion 35. These are connected to the control unit 21 in the cooling device 5.

The control unit 21 has a fuse 36 and a relay 37. The AC 220 V power supply 33 in the electronic device 2 and the electric heater 22 disposed in the high-temperature space 8 are connected to each other through the fuse 36 and the relay 37. A thermal fuse 38 is connected to the electric heater 22 so that, when an electric current larger than the rated current of the electric heater 22 flows through the heater, the fuse becomes blown out to cut off the power supply. In this case, a control portion 39 turns ON the relay 37 in accordance with the result of detection from the temperature sensor 23 which detects the temperature of the high-temperature space 8, to connect the AC 220 V power supply 33 to the electric heater 22. In the control portion 39, a current sensor 40 is wound round a wire leading to the electric heater 22, and the electric current supplied to the heater 22 is detected by the current sensor 40, to detect a trouble in the current supply.

The control portion 39 has a power supply 41, to which is connected the DC 26 V power supply 34 of the electronic device 2 through a fuse 42.

The control unit 21 has a relay 43 which is turned on and off by the control portion 39. Terminals of an alarm signal input portion 35 of the electronic device 2 are connected to each other through the relay 43.

On the other hand, the drivers 20 and 27 for driving the fan motors each incorporate an inverter portion 44 therein, and the DC 26 V power supply 34 of the electronic device 2 is connected to the inverter portion 44 through a fuse 45. A control portion 46 of each of the drivers 20 and 27 controls the electric current to be supplied to each of the fan motors 18 and 25 through the inverter portion 44 in accordance with a command provided from the control unit 21, thereby rotating the fan motors 18 and 25 to rotate at a set speed. The control portion 46 has a power supply 47.

The control portion 46 of each driver 27 has a load trouble detecting portion 48 as the load trouble detecting means and a speed trouble detecting portion 49. The load trouble detecting portion 48 detects the electric current supplied to the cooling fan motor 25, by using a current sensor 50 connected to the wiring of the inverter portion 44. Further, the load trouble detecting portion 48 calculates the total of the supplied current values for a certain time period as a load on the fan motor 25 and, when this load deviates from a set range, informs it to the control portion 39. The speed trouble detecting portion 49 detects the rotational speed of the cooling fan motor 25 and hence that of the cooling fan 24 on the basis of a detected rotation angle signal provided from a Hall element attached to the fan motor 25 and, when the detected rotation speed is outside a set range, informs it to the control portion 39.

The control portion 39 of the control unit 21 has a trouble alarm portion 52 which includes a plurality of LEDs. On the basis of the trouble informed from the driver 27 the control portion 39 checks the contents of the trouble and lights an LED corresponding to the trouble in the trouble alarm portion 52.

An operation of the cooling device constructed as above will be described below.

When the system starts, the electronic device 2 operates and the electronic system 1 functions as a radio base station. As a result, the electronic device 2 generates heat while consuming electric power, and hence the temperature in the housing 4 rises.

On the other hand, since the control unit 21 in the cooling device 5 drives the high-temperature-side fan motors 18 when the system starts, so that a circulation path is formed through the high-temperature space 8 and through the interior of the housing 4. In this way, the temperature in the housing 4 is made uniform.

At that time, the refrigerant in the high-temperature-side heat exchanger portion 28 of the heat exchanger 16 absorbs heat in the housing 4. Then, the refrigerant boils and moves to the low-temperature-side heat exchanger portion 29, in which the refrigerant radiates heat. As a result, the refrigerant is condensed into droplets. Then, the droplets drop into the high-temperature-side heat exchanger portion 28. In this way, there is performed heat exchange between the high and low-temperature-side heat exchanger portions 28 and 29.

Using the temperature sensor 23, the control portion 39 of the control unit 21 monitors the internal temperature of the housing 4, and when the temperature detected by the temperature sensor 23 has exceeded a set level, the control portion 39 drives the low-temperature-side fan motors 25, so that the low-temperature-side heat exchanger portion 29 of the heat exchanger 16 is cooled with the outside air and thus the heat radiating efficiency is improved. As a result, the cooling efficiency by the heat exchanger 16 is improved and the temperature in the housing 4 drops.

When the internal temperature of the housing 4 has dropped below the set level, the control portion 39 stops the operation of the low-temperature-side fan motors 25, so that the heat radiating efficiency of the low-temperature-side heat exchanger portion 29 in the heat exchanger 16 decreases. As a result, the cooling efficiency by the heat exchanger 16 decreases and the temperature in the housing 4 increases.

Through the above operations, the internal temperature of the housing 4 is controlled to be equal to the set temperature.

When the temperature of the outside air has dropped excessively and the temperature in the housing 4 has become lower than the set temperature range, the control portion 39 supplies an electric current to the electric heater 22 to operate condition of the high-temperature-side fan motors 18. In this way, the temperature in the housing 4 is prevented from dropping excessively.

The outside air passes through the low-temperature-side heat exchanger portion 29 in the heat exchanger 16; and therefore, as the operation time of the cooling device 5 becomes long, dust is deposited on the heat exchanger portion 29, thus causing a problem that clogging percentage is increased and the cooling efficiency of the heat exchanger 16 is deteriorated. When any trouble occurs in a low-temperature-side fan motor 25, the electric current supplied to the fan motor 25 may increase abnormally even if the amount of air blown by the low-temperature-side fan 24 is normal, or the rotational speed of the fan 24 may decrease and the cooling efficiency of the heat exchanger 16 is deteriorated. Further, in the event of failure of a driver 27 for controlling the rotation of the low-temperature-side fan motor 25, the rotational speed of the low-temperature-side fan may become abnormal, or a supply of an electric current in the fan motor 25 may become abnormal.

In this embodiment, the control portion 39 of the control unit 21 checks the contents of a trouble upon occurrence, then alarms the occurrence of the trouble to the outside, and turns ON the relay 43 to inform the electronic device 2 of the occurrence of the trouble.

More specifically, the load trouble detecting portion 48 of each driver 27 monitors the electric current supplied to the low-temperature-side fan motor 25, sums up the supplied current values at every certain time, checks whether the load thus obtained is within, above, or below, a set range, and informs the result of the determination to the control unit 21.

The speed trouble detecting portion 49 of each driver 27 monitors the rotational speed of the low-temperature-side fan motor 25, determines whether the said rotational speed is within, above, or below, a set range, and informs the result of the determination to the control unit 21.

Figure 63:
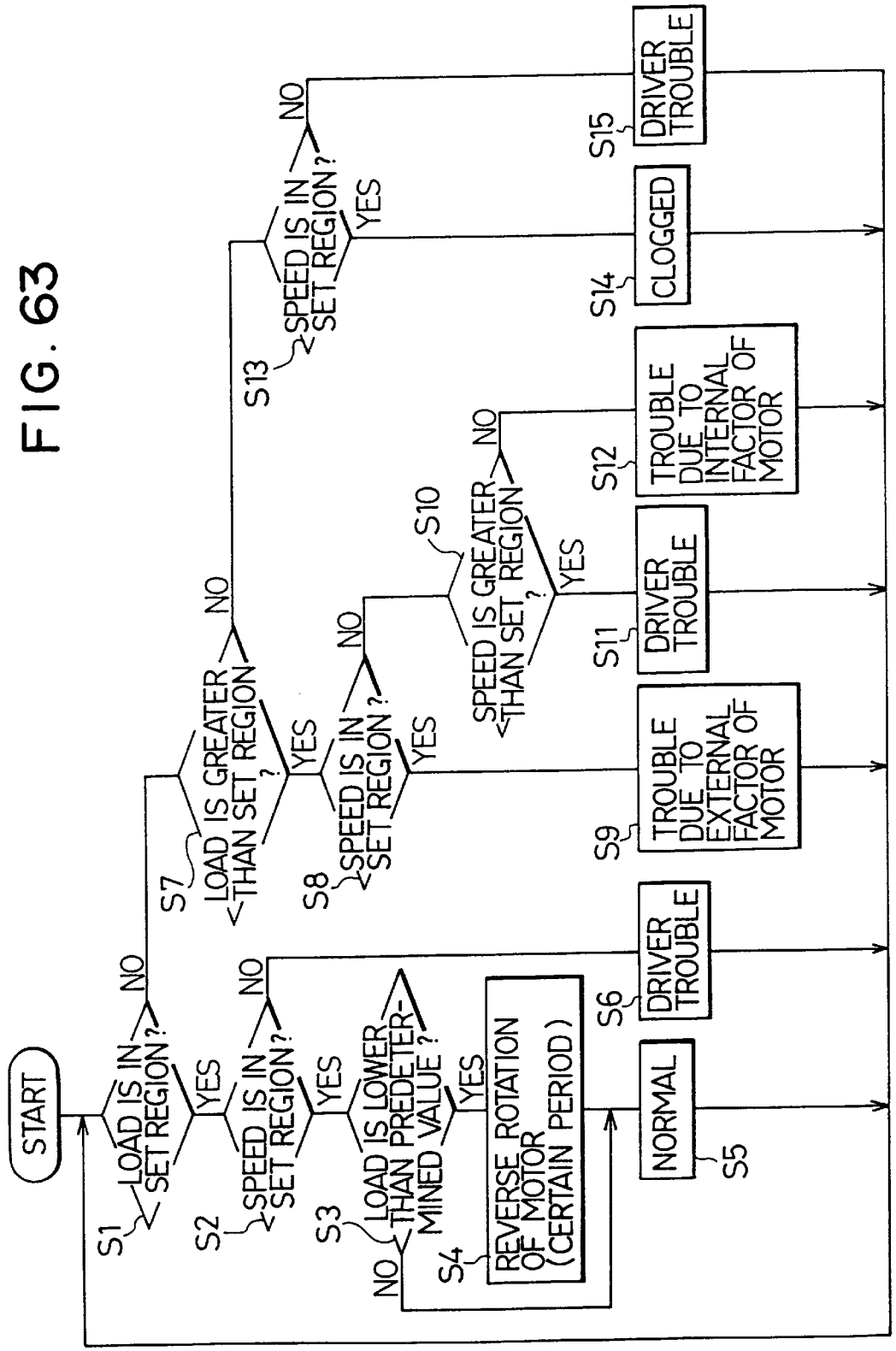
FIG. 63 is a flow chart showing operations of a control unit in the eighth embodiment.

Upon receipt of information from the driver 27, the control portion 39 of the control unit 21 checks the contents of the trouble in accordance with the flow chart of FIG. 63.

(1) Normal Operation

When the load on the low-temperature-side fan motor 25 is within the set range and the rotational speed of the low-temperature-side fan 24 is within the set range, (YES in steps S1 and S2), the control portion 39 determines that the condition is normal (step S3).

Figure 64:
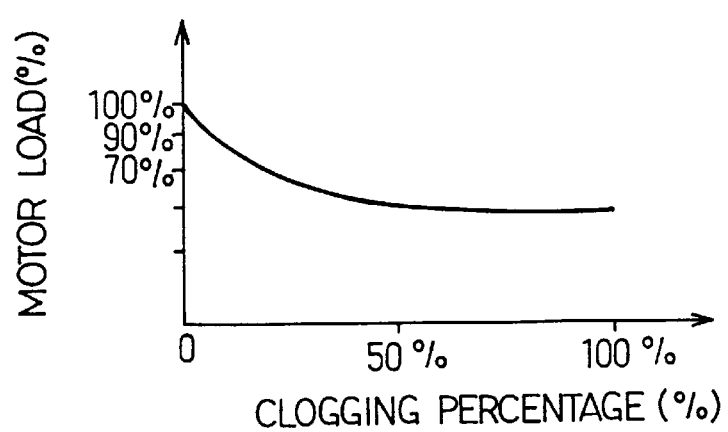
FIG. 64 is a diagram showing a relationship between a clogging percentage and a motor load in the eighth embodiment.

FIG. 64 illustrates a relationship between clogging percentage of the heat exchanger and load on the fan motor, from which it is seen that the load on the fan motor decreases as the clogging percentage increases. This is because, when the outside air passage is clogged, the load becomes smaller in view of characteristics of the Scirocco fan and hence the electric current supplied to the low-temperature-side fan motor 25 decreases under the control for rotating the motor 25 at a set speed.

In this case, if a condition of 70%–100% in terms of the load on the low-temperature-side fan motor 25 is regarded as normal, the load range of 70% to 100% is assumed to be a set range.

Even in the above condition determined to be normal, an increase in the clogging percentage of the heat exchanger 16 will deteriorate heat exchange efficiency of the heat exchanger. Therefore, the clogging of the heat exchanger 16 is prevented in as follows.

When the load on the low-temperature-side fan motor 25 is within the set range (70%–100%) and is below a predetermined value (90%), the control portion 39 determines that the clogging percentage of the heat exchanger 16 has become high, and rotates the low-temperature-side fan motor 25 reversely for a certain period of time. As a result, the flowing path of air passing through the low-temperature-side heat exchanger portion 29 of the heat exchanger 16 becomes opposite, so that dust or any other foreign matter deposited on the heat exchanger portion 29 is blown away and removed by the air flowing in the opposite direction. Consequently, the percentage of heat exchange of the heat exchanger 16 is enhanced.

(2) Clogging (of the Heat Exchanger 16)

When the clogging percentage of the heat exchanger 16 has become high, the dust or any other foreign materials deposited on the heat exchanger is removed as the above; however, as the cooling device is used over a long period, the amount of dust or any other foreign materials deposited on the heat exchanger increases and the clogging percentage of the heat exchanger becomes extremely high.

In this case, when the load on the low-temperature-side fan motor 25 is below the set range and the rotational speed of the low-temperature-side fan 24 is within the set range, (NO in step S7 and YES in step S13), the control portion 39 determines that clogging occurs (step S14).

(3) Failure Caused by an External Factor on the Low-temperature-side Fan Motor 25

When the load on the low-temperature-side fan motor 25 is above the set range and the rotational speed of the low-temperature-side fan 24 is within the set range, (YES in steps S7 and S8), the control portion 39 determines that a failure occurs due to an external factor (step S9). This is because, for example when the bearing of the low-temperature-side fan motor 25 becomes rusty, the load on the fan motor 25 becomes large and therefore the electric current supplied to the motor 25 increases under the situation that the fan motor 25 is controlled so as to rotate at the set speed.

(4) Failure Caused by an Internal Factor in the Low-temperature-side Fan Motor 25

When the load on the low-temperature-side fan motor 25 is above the set range and the rotational speed of the low-temperature-side fan 24 is below the set range, (YES in step S7 and NO in step S10), the control portion 39 determines that a failure occurs due to an internal factor in the fan motor 25 (step S12). This is because, for example when the bearing of the fan motor 25 is damaged, the rotational speed of the fan motor 25 does not increase even if the motor 25 is controlled so as to rotate at a constant speed, and the driver 27 increases the supplied electric current for increasing the rotational speed up to the set speed.

(5) Failure of the Driver 27

When the load on the low-temperature-side fan motor 25 is within the set range and the rotational speed of the low-temperature-side fan 24 is outside the set range, (YES in step S1 and NO in step S2), the control portion 39 determines that the driver 27 is out of order (step S6). This is because, when the driver 27 is in normal condition, the rotational speed of the low-temperature-side fan 24 is surely controlled within the set range as long as the load on the low-temperature-side fan motor 25 is within the set range.

When the load on the fan motor 25 is above the set range and the rotational speed of the fan 24 is above the set range, (YES in steps S7 and S10), the control portion 39 determines that the driver 27 is out of order (step S11). This is because, when the driver 27 is in normal condition, the rotational speed of the low-temperature-side fan 24 is controlled within the set speed range not to exceed the range.

Further, when the load on the low-temperature-side fan motor 25 is below the set range and the rotational speed of the low-temperature-side fan 24 is outside the set range (NO in steps S7 and S13), the control portion 39 determines that the driver 27 is out of order (step S15). This is because, when the driver 27 is in normal condition and when the rotational speed of the fan 24 has decreased, the control portion 39 makes control so as to increase the electric current supplied to the fan motor 25.

Through the above operations of the control portion 39, the contents of each trouble are checked on the basis of both speed of the low-temperature-side fan 24 and load on the low-temperature-side fan motor 25, as shown in Table 4.

TABLE 4

| Fan speed | Fan Motor Load | State |
| --- | --- | --- |
| Normal (fixed) | Normal (fixed) | Normal |
| Normal (fixed) | Decrease | Clogging (of heat exchanger fin) |
| Normal (fixed) | Increase | Trouble due to external factor |
| Low-speed abnormal | Increase | Trouble due to internal factor of motor |
| Abnormal | Normal (fixed) | Driver trouble |
| High-speed abnormal | Increase | driver trouble |
| Abnormal | Decrease | Driver trouble |

When the control portion 39 of the control unit 21 determines that a trouble has occurred in the manner described above, the control portion 39 lights the LED corresponding to the contents of the trouble in the trouble alarm portion 52, to inform the occurrence of the trouble to the user.

Further, upon determining the occurrence of a trouble, the control portion 39 turns ON the relay 43, to inform the alarm signal input portion 35 of the electronic device 2 that a trouble has occurred.

When the current sensor 40 should fail to detect any electric current upon turning ON of the relay 37 for the supply of an electric current to the electric heater 22, the control portion 39 lights the corresponding LED in the trouble alarm portion 52 and turns ON the relay 43, to inform the electronic device 2 that a trouble has occurred.

Also when the temperature detected by the thermistor 23 has reached a level not lower than 70° C. or not higher than 0° C., the control portion 39 lights the corresponding LED in the trouble alarm portion 52 and turns ON the relay 43, to inform the electronic device 2 of the occurrence of a trouble.

When the alarm signal input portion 35 receives a trouble alarm signal from the cooling device 5, the electronic device 2 informs the base station of the occurrence of a trouble through a telephone line.

A maintaining worker in charge, when informed of the occurrence of a trouble through a telephone line, checks the contents of the trouble on the basis of the state of lighting of the LED in the trouble alarm portion 52 which is provided in the control unit 21 of the cooling device 5, and handles the trouble appropriately.

In the case where the trouble is clogging, the worker cleans the heat exchanger 16. If the trouble is caused by an external factor on the low-temperature-side fan motor 25, the motor 25 is repaired or replaced. If the trouble is caused by an internal factor in the low-temperature-side fan motor 25, the motor 25 is replaced. Further, if the trouble is a failure of the driver 27, the driver 27 is replaced.

According to the above construction, when it is detected by the driver 27 that the load on the low-temperature-side fan motor 25 has decreased to a level lower than a set value (90%), the control portion 39 determines that the clogging percentage of the heat exchanger 16 has become high, on the basis of the result of the detection by the driver 27, and rotates the low-temperature-side fan 24 reversely, so that air is blown in the opposite direction in the heat exchanger 16 and dust or any other foreign materials deposited on the heat exchanger is thereby removed. Therefore, in comparison with the prior art in which it is necessary to perform cleaning and maintenance in a comparatively short cycle, it is possible to prolong the cleaning and maintenance cycle for the heat exchanger and thereby reduce the cost required for inspection and maintenance.

The present invention is not limited to the above embodiment, but may be modified as follows.

As means for changing the flowing direction of air blown to the heat exchanger 16 to the opposite direction, there may be employed a damper to change the flowing path of air blown by the low-temperature-side fan 24.

As means for removing dust or any other foreign materials deposited on the heat exchanger 16, there may be employed a jet of washer liquid for the heat exchanger.

The heat exchanger may be of a heat pipe type.

As the high-temperature fluid, there may be employed cooling water or oil for cooling the electronic device 2.

The contents of a trouble may be outputted to the electronic device 2 from the control unit 21 in the cooling device 5.

As the trouble alarm means, there may be employed a display device for the display of message or a voice for alarm.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined in the appended claims.

What is claimed is:

1. A cooling device boiling and condensing refrigerant, said cooling device comprising:
   a casing having an interior;
   a fluid separation plate for separating said interior into a closed space, a first fluid passage and a second fluid passage;
   a heat exchanger disposed to pass through said fluid separation plate, for receiving heat from a first fluid flowing in said first fluid passage and radiating the heat into a second fluid flowing in said second fluid passage;
   first fluid generating means for generating a flow of said first fluid in said first fluid passage;
   second fluid generating means for generating a flow of said second fluid in said second fluid passage;
   a temperature sensor for detecting a temperature of said first fluid flowing in said first fluid passage;
   a controller for variably controlling a fluid flow generating output of said first fluid generating means and a fluid flow generating output of said second fluid generating means in response to a temperature detected by said temperature sensor; and
   a duct for distributing said first fluid discharged from said first fluid generating means through a plurality of openings to said closed space;
   wherein said duct is movably disposed to change a ratio between an amount of said first fluid flowing through one of said openings and an amount of said first fluid flowing through another of said openings.

2. A cooling device according to claim 1, wherein said controller controls independently said first fluid generating means and said second fluid generating means.

3. A cooling device according to claim 1, wherein,
   said first fluid generating means includes a first fan and a first motor for rotating said first fan; and said second fluid generating means includes a second fan and a second motor for rotating said second fan.

4. A cooling device according to claim 3, wherein said controller variably controls a rotational speed of said first motor and a rotational speed of said second motor.

5. A cooling device according to claim 4, wherein said controller variably controls in a stepwise manner a rotational speed of said first motor and a rotational speed of said second motor.

6. A cooling device according to claim 5, wherein, when a rotational speed of said first motor and a rotational speed of said second motor are variably controlled in a stepwise manner in response to a temperature detected by said temperature sensor, said controller changes a threshold value for variable control respectively in cases when the temperature increases and when the temperature decreases.

7. A cooling device according to claim 1, wherein said controller determines an abnormal state of an operating condition and transmits an alarm signal indicative of the determined abnormal operating condition.

8. A cooling device according to claim 3, wherein said controller drives said first motor and said second motor in a rated output when a temperature detected by said temperature sensor exceeds the maximum temperature for determining an abnormal state.

9. A cooling device according to claim 3, wherein said controller drives said first motor and said second motor in a rated output when said controller itself is troubled.

10. A cooling device accommodated in a housing for forming a closed space therein, for cooling said closed spaced by performing a heat exchange between air in said closed space and air outside said housing, said cooling device comprising:

a casing for forming therein a first heat transfer space communicating with said closed space and a second heat transfer space communicating with an outside of said housing;

a first blower for blowing air circulating between said first heat transfer space and said closed space;

a duct for distributing said blown air from said first blower through a plurality of openings to said closed space, said duct being movably disposed to change a ratio between an amount of said blown air flowing through one of said openings and an amount of said blown air flowing through another of said openings;

a second blower for blowing air outside said housing into said second heat transfer space; and a heat exchanger having a boiling portion and a condensing portion, said boiling portion receiving heat from air flowing through said first transfer space to boil refrigerant sealed in said heat exchanger, said condensing portion radiating heat of the refrigerant which has been boiled and gasified to the air flowing through said second heat transfer space to condense the refrigerant vapor; wherein, at least one of said first blower and said second blower has a fan case having an air path of a scroll shape therein, said fan case includes an outer case having a box-shaped structure constructed by a wall surface of said casing and outer plates which form at least two parallel surfaces, and a side wall plate sandwiched between said two parallel surfaces to form said air path.

11. A cooling device according to claim 10, wherein a plurality of said side wall plates are disposed in said outer case to define said air path.

12. A cooling device according to claim 10, wherein, said casing is formed with an air intake port for introducing the air outside said housing into said second heat transfer space, said wall surface of said casing, which forms outer case with said outer plates, is formed with an air outlet port, and said housing is formed with a first opening corresponding to said air intake port and a second opening corresponding to said air outlet port.

13. A cooling device according to claim 10, wherein, one wall surface of said outer plates is constituted as a wall surface which forms said heat transfer space, and said one wall surface is formed with an air intake port for intaking air from said heat transfer space.

14. A cooling device accommodated in a housing for forming a closed space therein, for cooling said closed space by performing a heat exchange between air in said closed space and air outside said housing, said cooling device comprising:

a first blower for blowing air circulating between said first heat transfer space and said closed space;

a second blower for blowing air outside said housing into said second heat transfer space; and a heat exchanger having a boiling portion and a condensing portion, said boiling portion receiving heat from air flowing through said first transfer space to boil refrigerant sealed in said heat exchanger, said condensing portion radiating heat of the refrigerant which has been boiled and gasified to the air flowing through said second heat transfer space to condense the refrigerant vapor; and a duct for distributing air discharged from said first blower to a plurality of areas in said closed space, wherein said duct is movably disposed to change a ratio of each amount of air blown to said areas.

15. A cooling device according to claim 14, wherein said duct is disposed vertically movably relative to said casing.

* * * * *